US010347641B2

(12) United States Patent
Kim et al.

(10) Patent No.: US 10,347,641 B2
(45) Date of Patent: Jul. 9, 2019

(54) SEMICONDUCTOR DEVICES

(71) Applicant: Samsung Electronics Co., Ltd., Suwon-si, Gyeonggi-do (KR)

(72) Inventors: Jihoon Kim, Hwaseong-si (KR); Wonchul Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/814,824

(22) Filed: Nov. 16, 2017

(65) Prior Publication Data
US 2018/0342519 A1 Nov. 29, 2018

(30) Foreign Application Priority Data
May 29, 2017 (KR) .................. 10-2017-0066259

(51) Int. Cl.
*H01L 27/108* (2006.01)
*H01L 49/02* (2006.01)

(52) U.S. Cl.
CPC .. *H01L 27/10852* (2013.01); *H01L 27/10855* (2013.01); *H01L 27/10894* (2013.01); *H01L 28/75* (2013.01); *H01L 28/87* (2013.01); *H01L 28/91* (2013.01); *H01L 27/10823* (2013.01); *H01L 27/10876* (2013.01)

(58) Field of Classification Search
None
See application file for complete search history.

(56) References Cited

U.S. PATENT DOCUMENTS

| 6,258,691 | B1 | 7/2001 | Kim |
| 8,372,748 | B2 | 2/2013 | Park et al. |
| 8,378,499 | B2 | 2/2013 | Hasunuma |
| 2014/0091430 | A1 | 4/2014 | Nagai |
| 2015/0364474 | A1* | 12/2015 | Kang ............... H01L 27/10823 257/306 |

FOREIGN PATENT DOCUMENTS

| KR | 100781546 B1 | 12/2007 |
| KR | 100937993 B1 | 1/2010 |
| KR | 100955940 B1 | 5/2010 |
| KR | 101076884 B1 | 10/2011 |
| KR | 101083821 B1 | 11/2011 |

\* cited by examiner

*Primary Examiner* — Hung K Vu
(74) *Attorney, Agent, or Firm* — Harness, Dickey & Pierce, P.L.C.

(57) ABSTRACT

A semiconductor device includes a substrate including a cell region and peripheral region and bottom electrodes on the substrate. The bottom electrodes are arranged in a first row and a second row each extending in a first direction. The first row and the second row are adjacent to each other in a second direction perpendicular to the first direction. The bottom electrodes in the first row include an outermost bottom electrode and a next outermost bottom electrode that are separated by a first distance in the first direction. The bottom electrodes in the second row include an outermost bottom electrode and a next outermost bottom electrode that are separated by a second distance in the first direction. The outermost bottom electrode in the first row is on the peripheral region of the substrate. The outermost bottom electrode in the second row is on the cell region of the substrate.

20 Claims, 63 Drawing Sheets

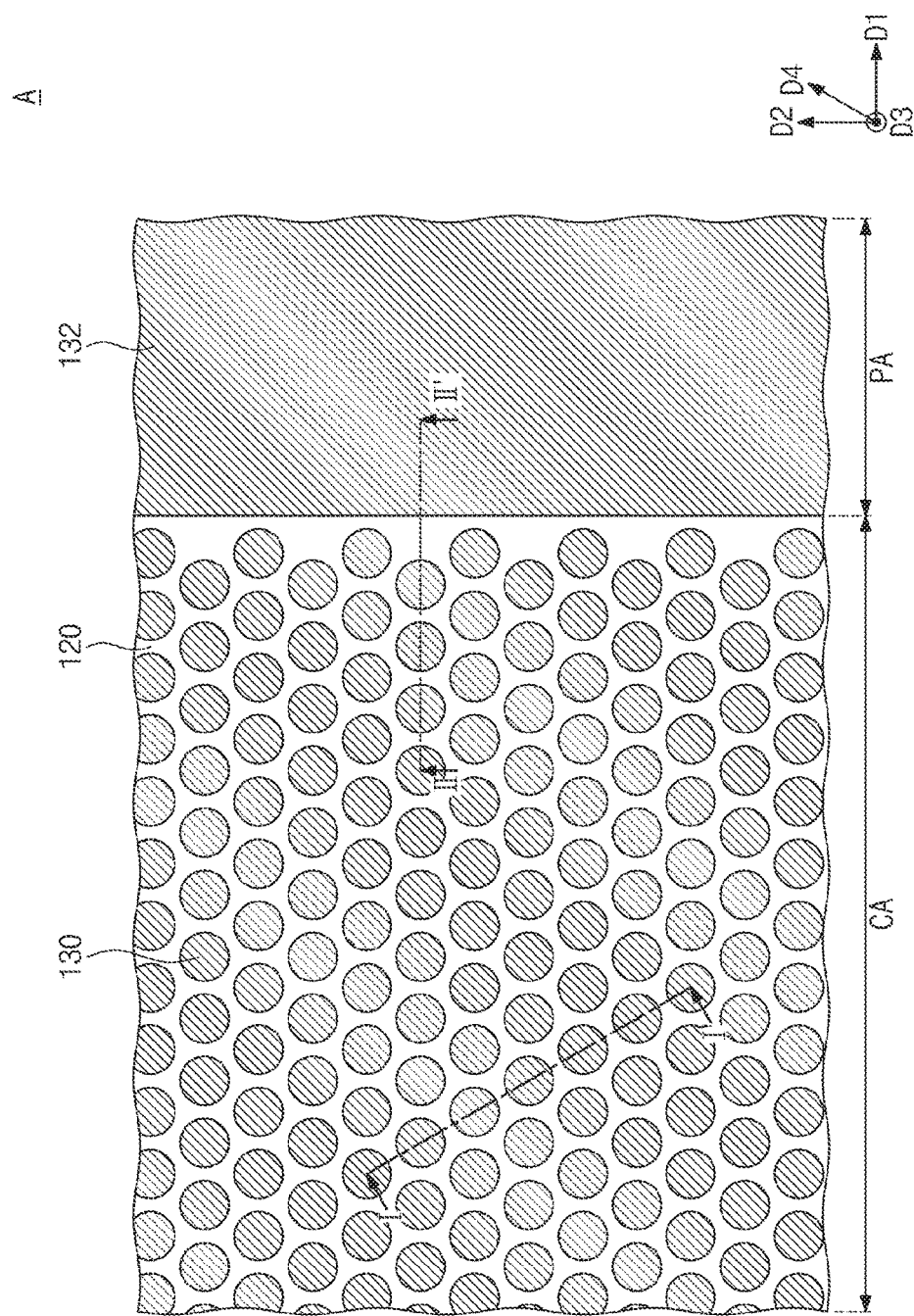

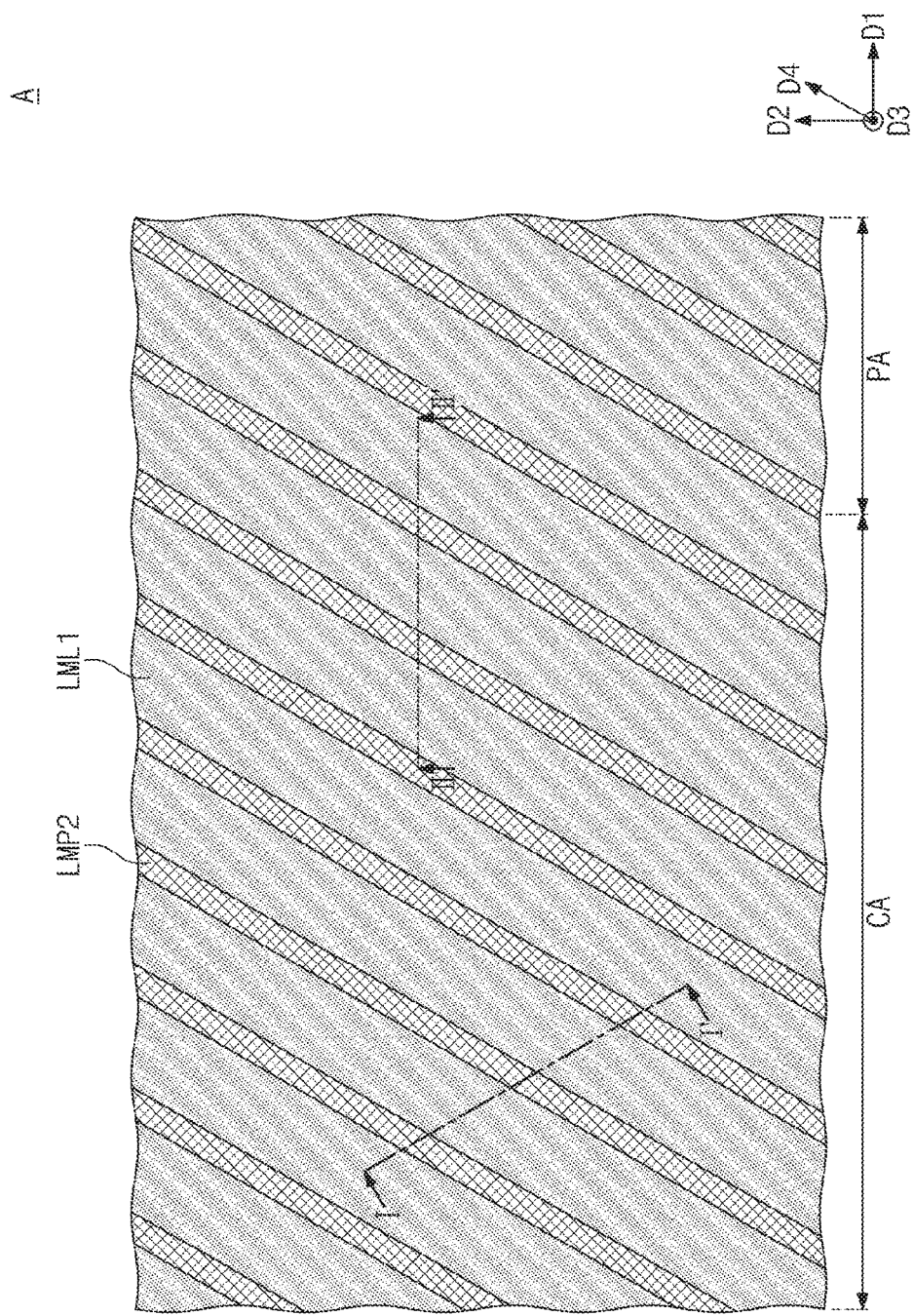

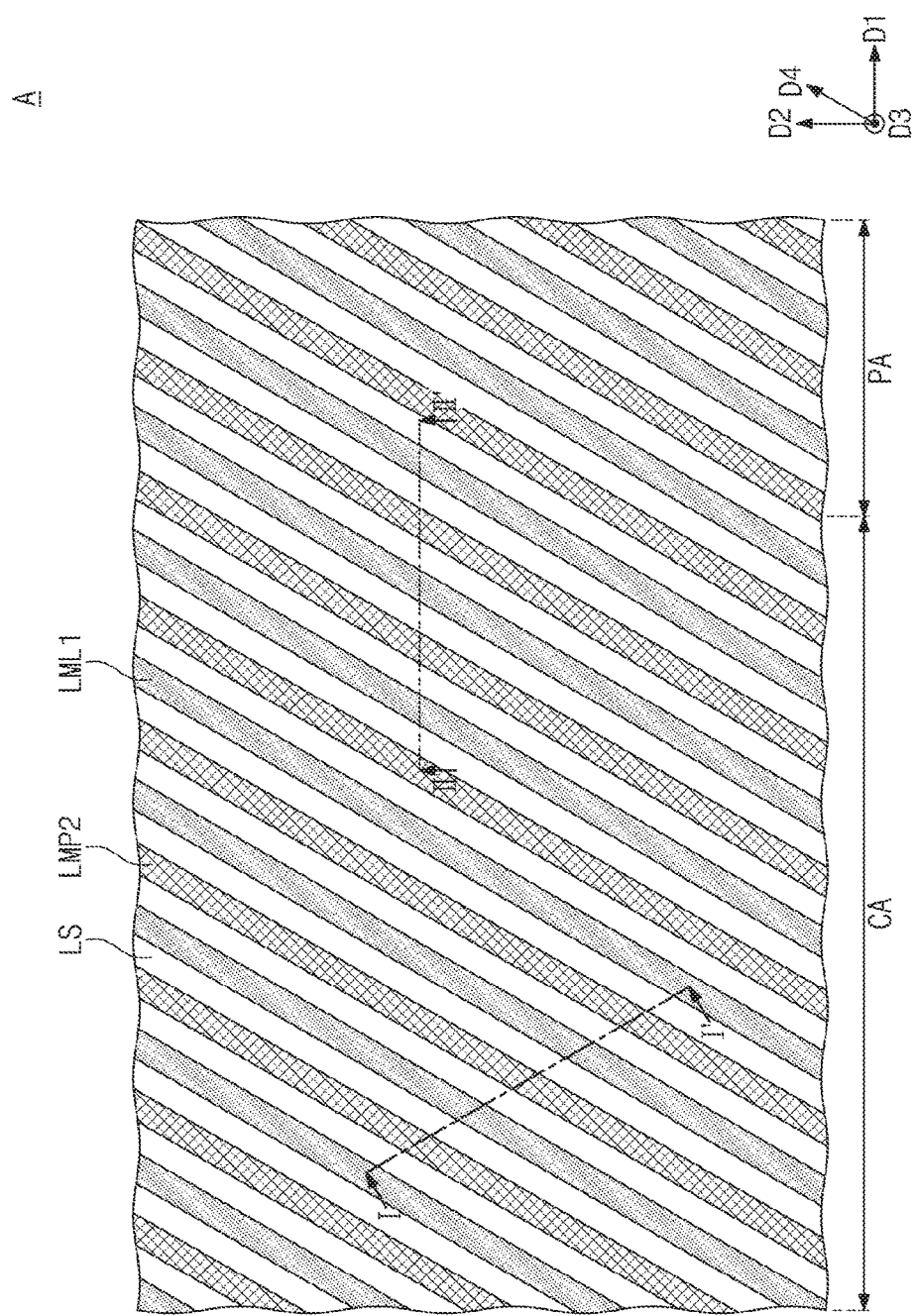

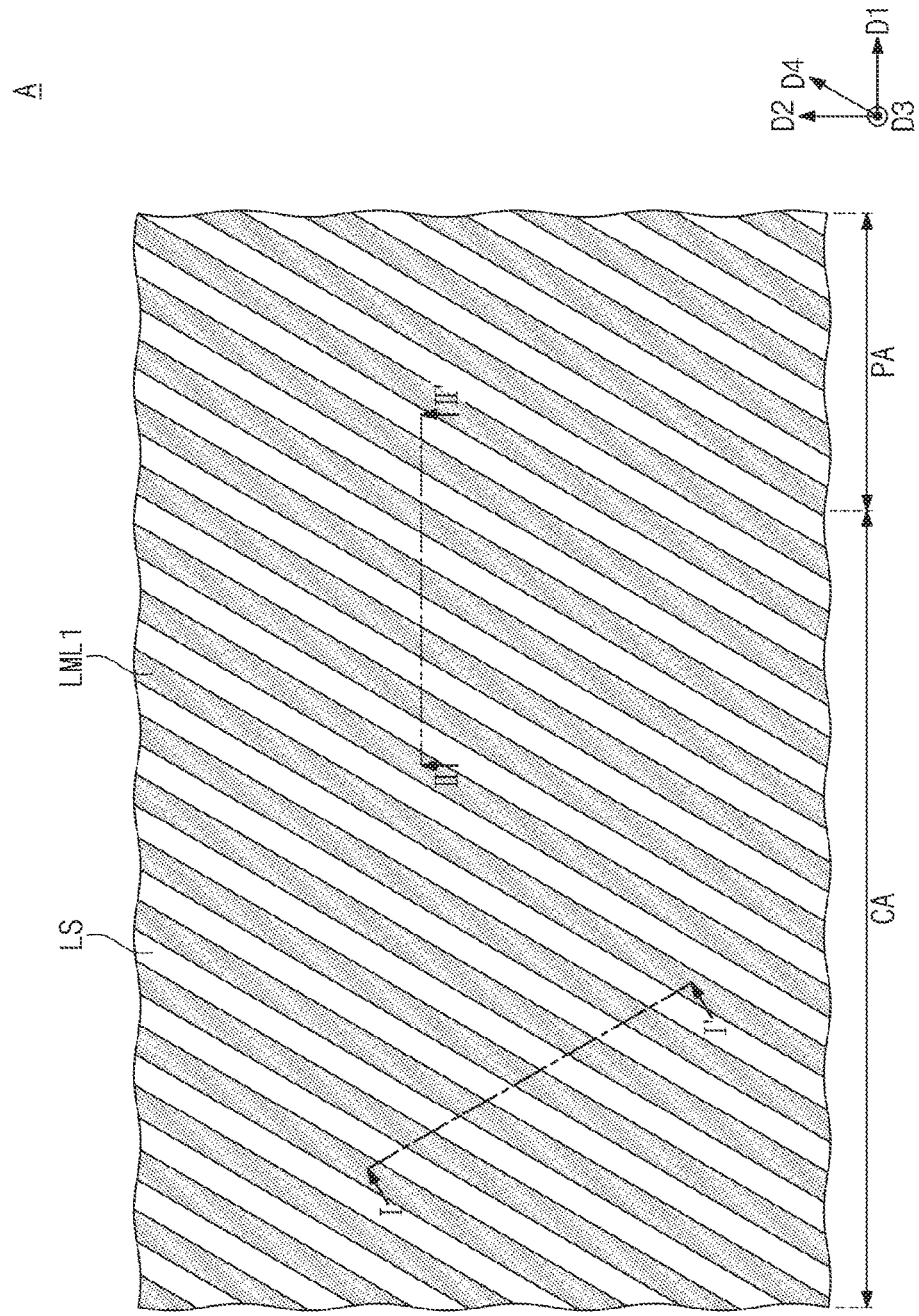

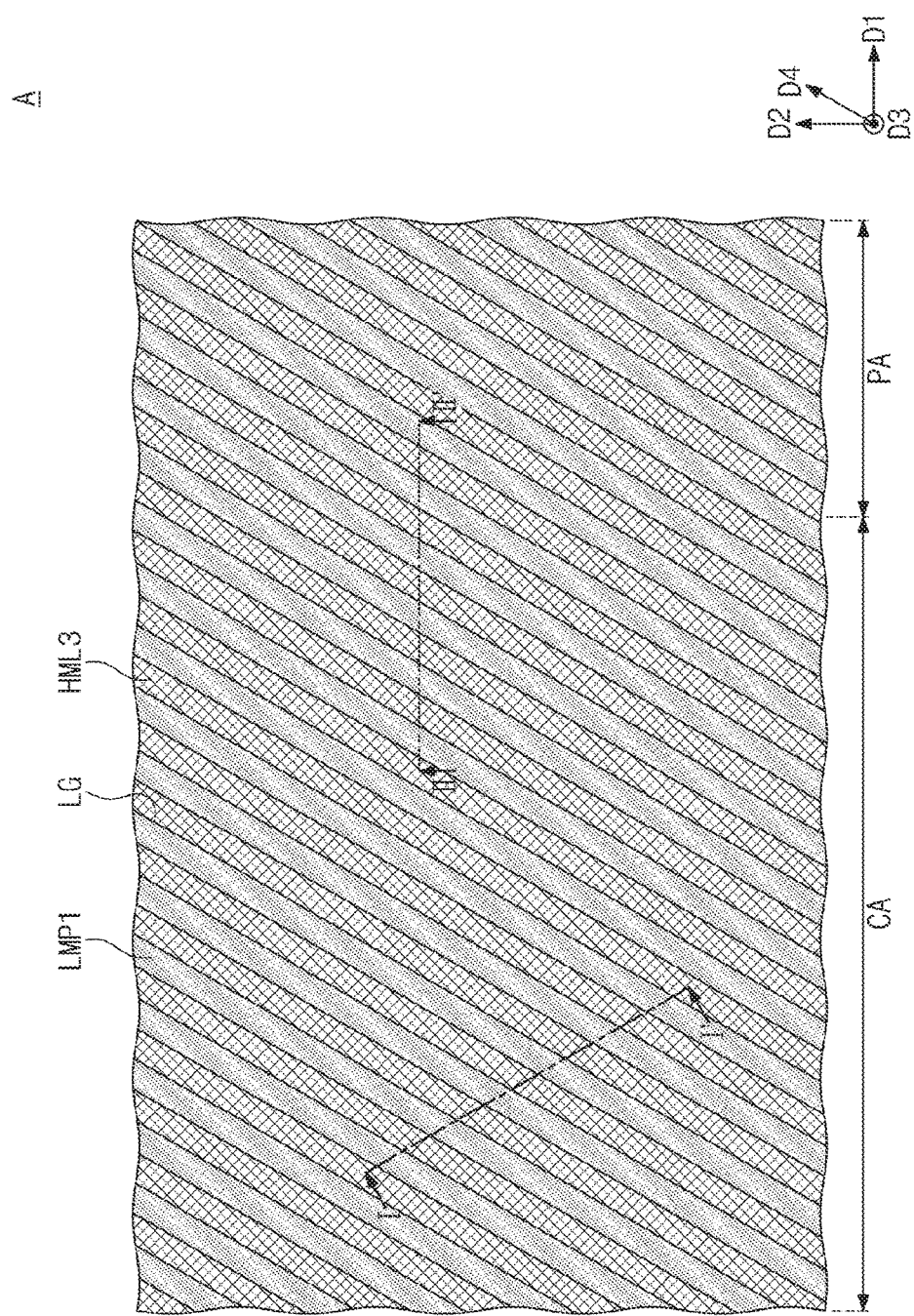

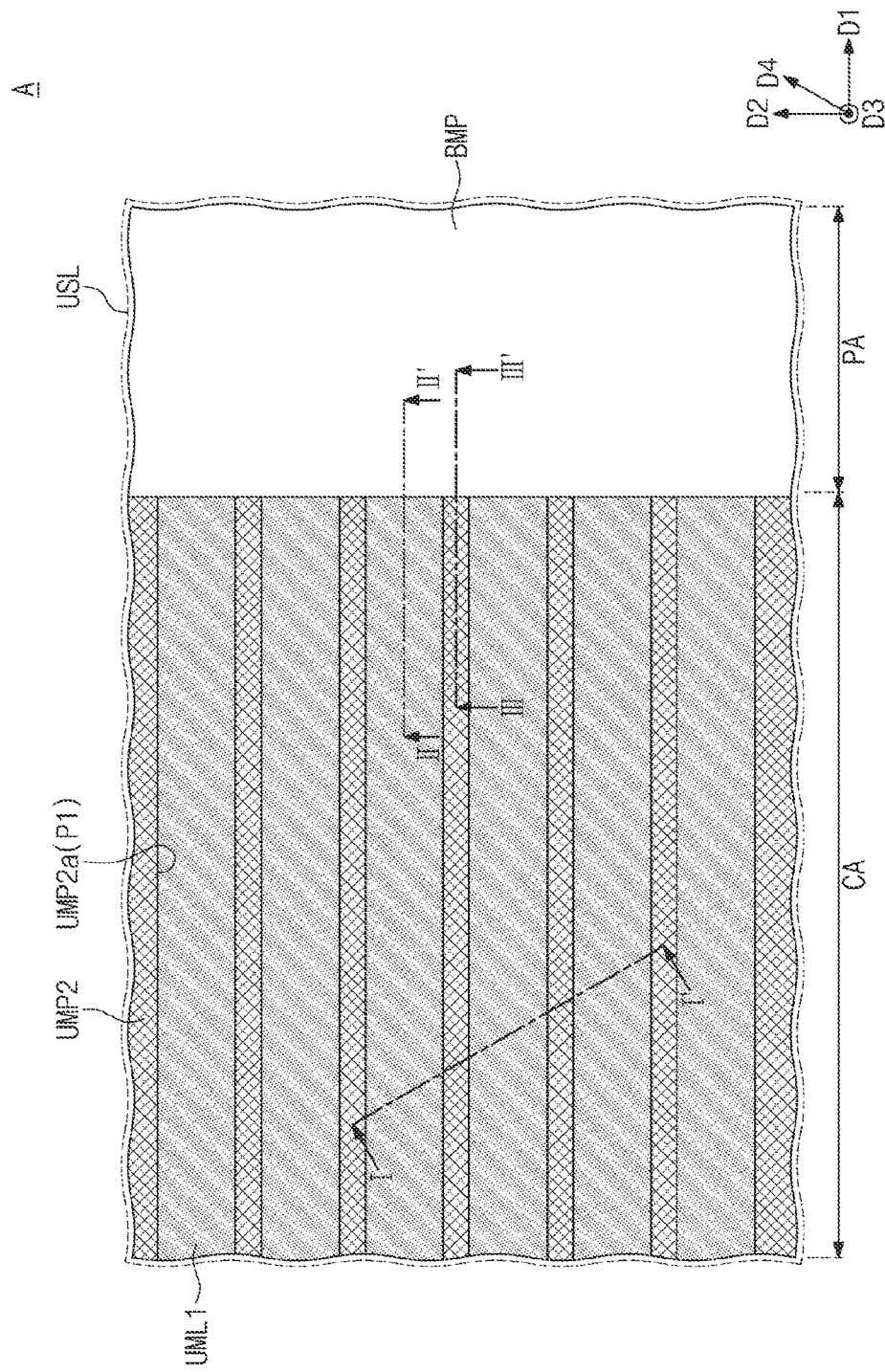

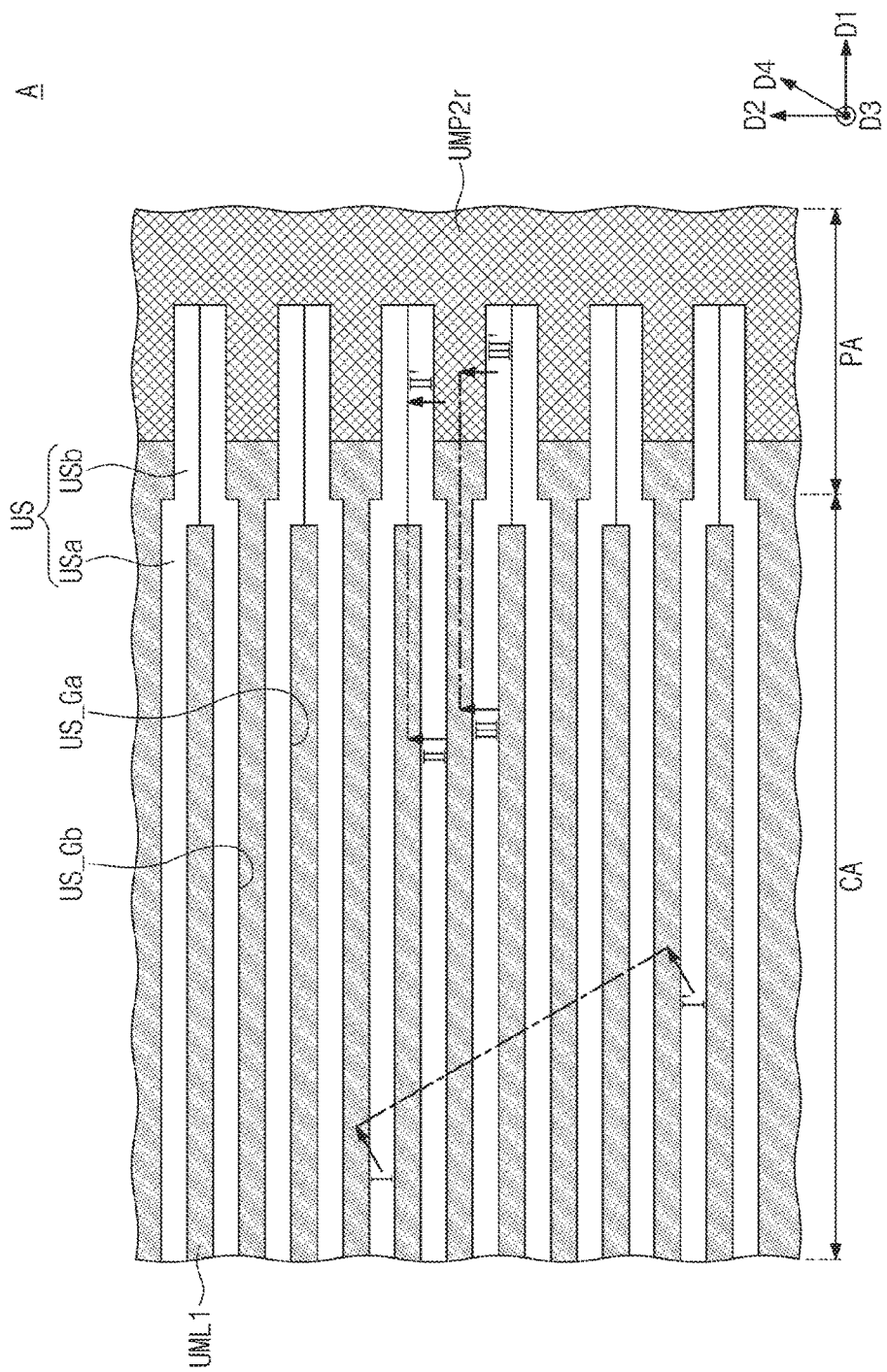

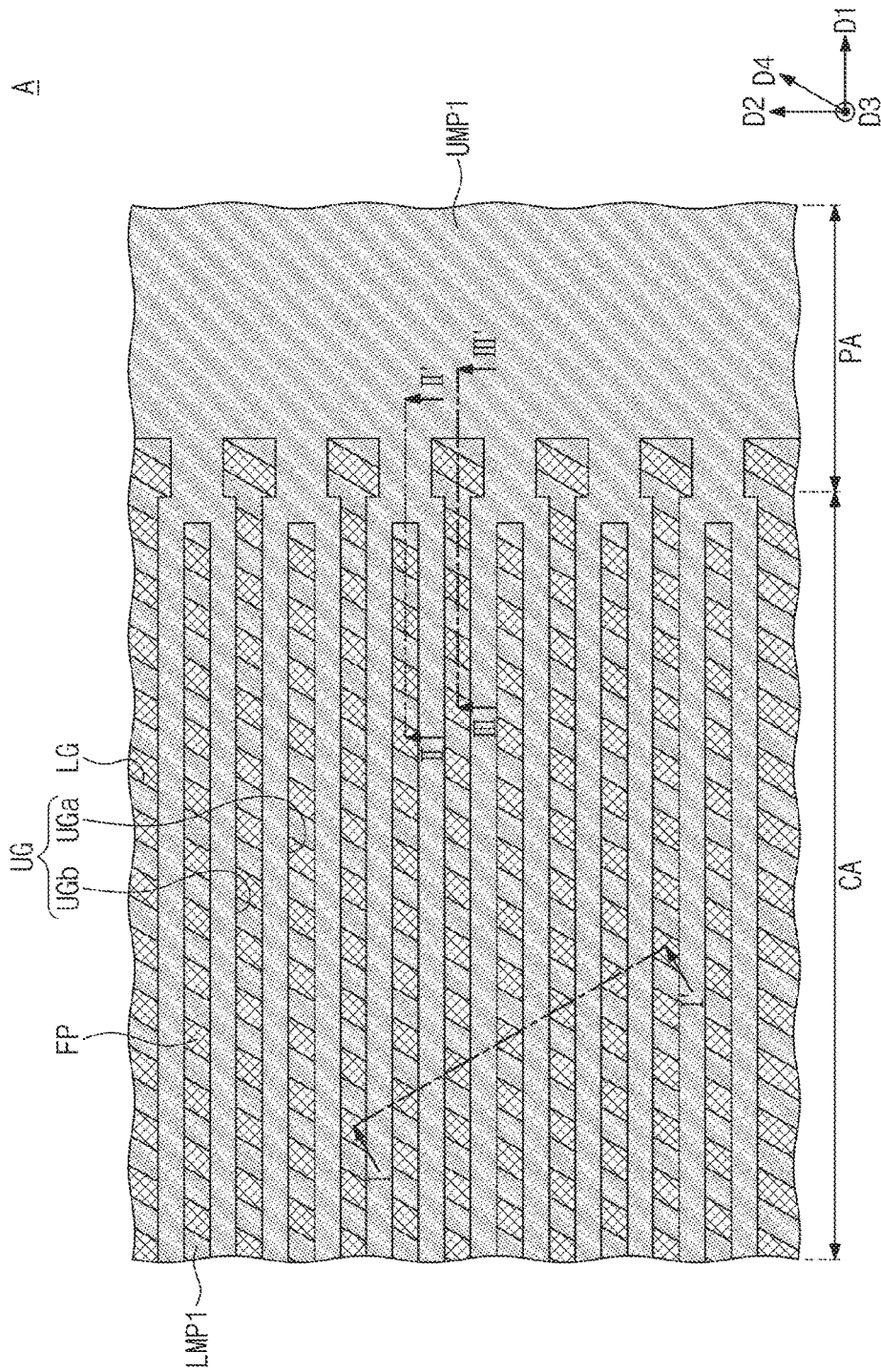

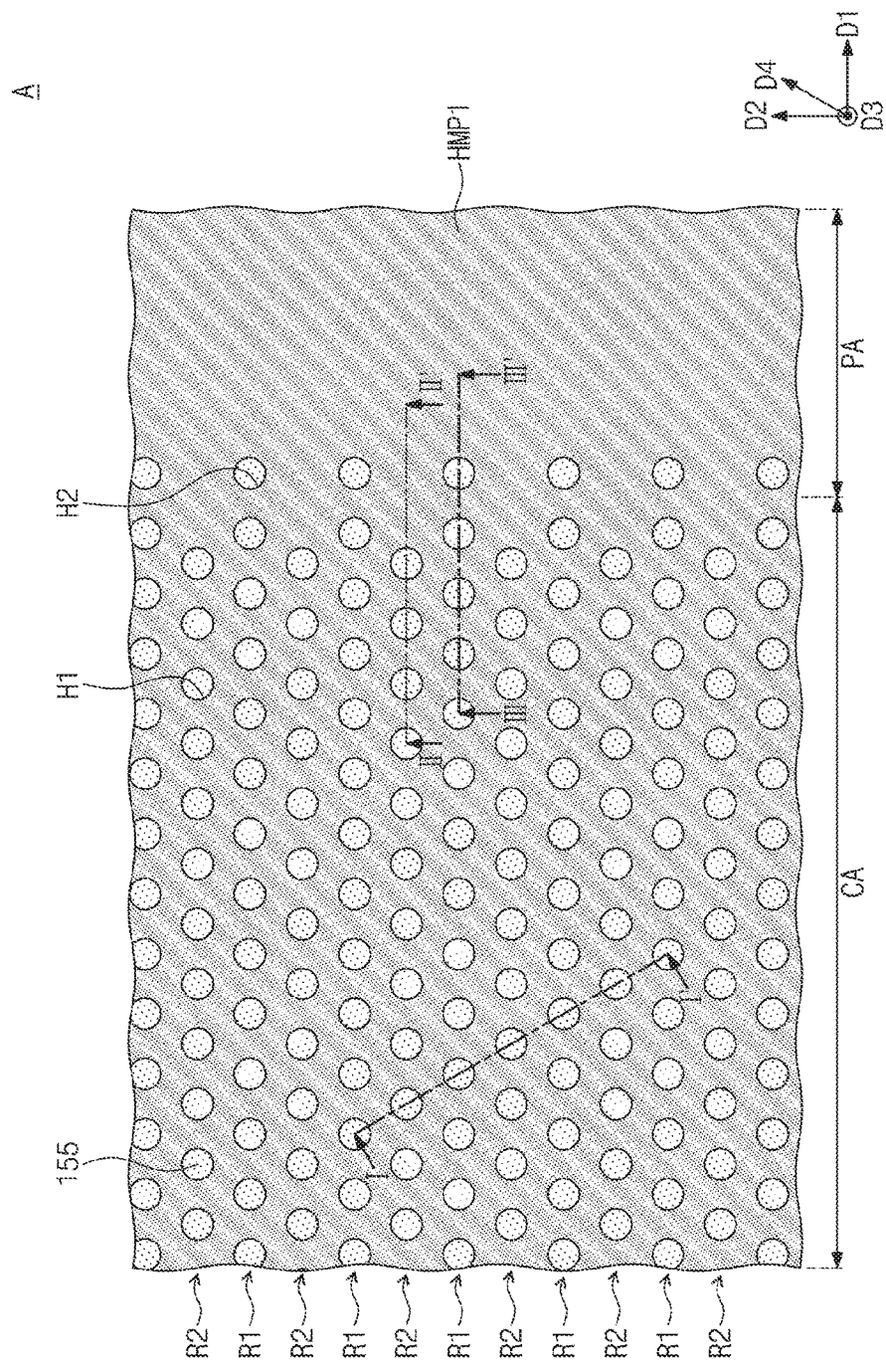

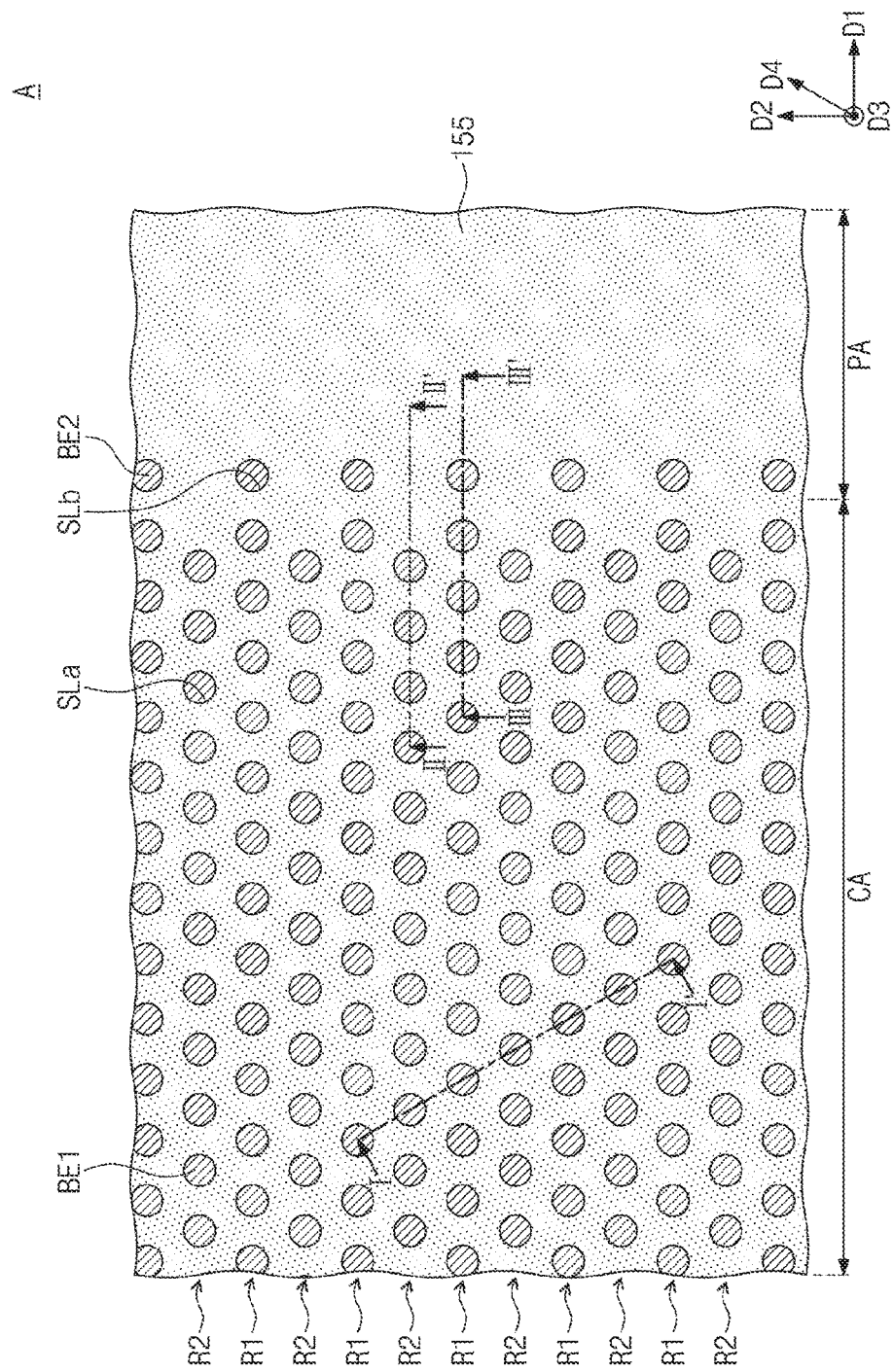

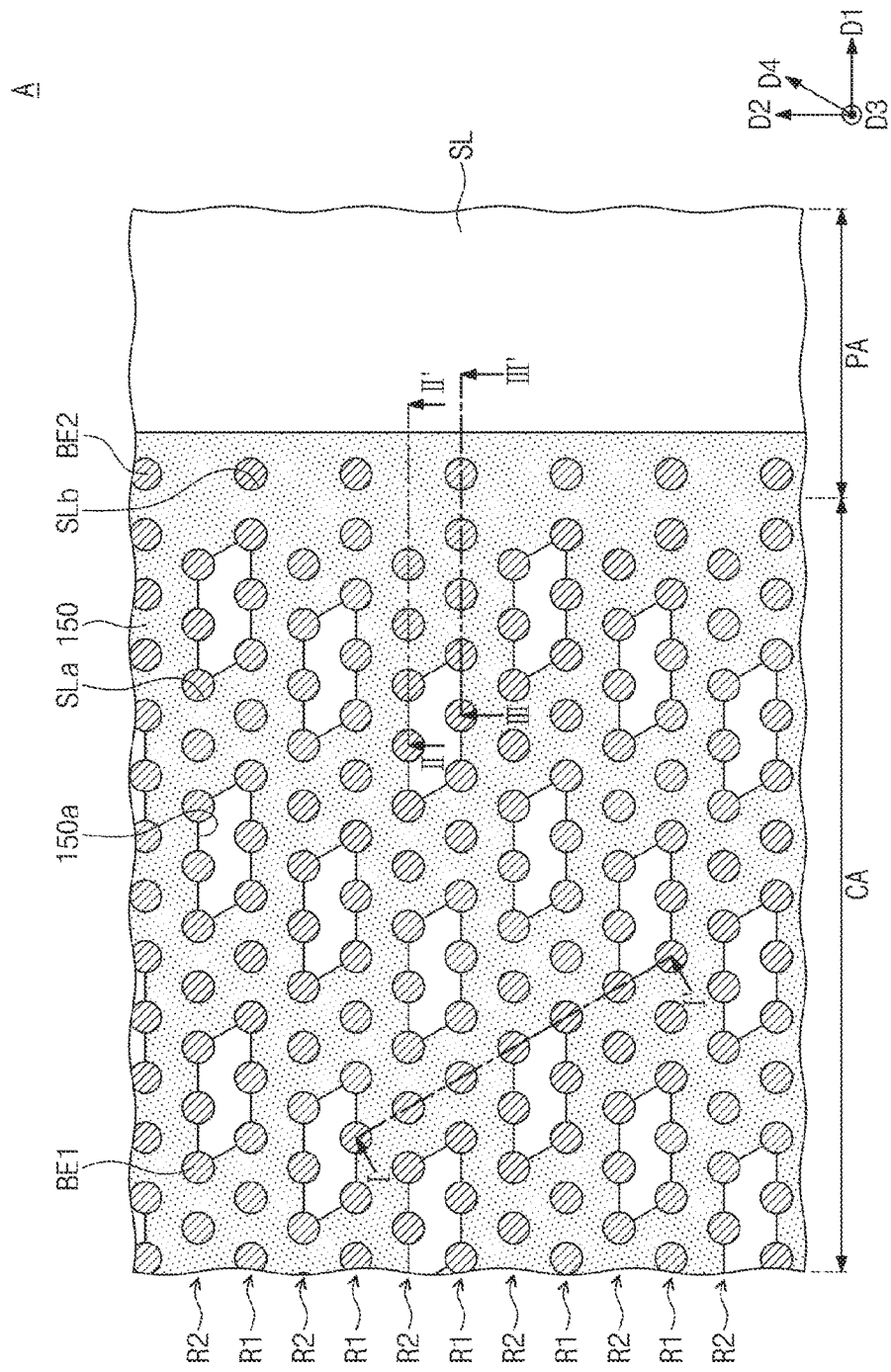

SEMICONDUCTOR DEVICES

CROSS-REFERENCE TO RELATED APPLICATION

This application claims priority under 35 U.S.C. § 119 to Korean Patent Application No. 10-2017-0066259 filed on May 29, 2017 in the Korean Intellectual Property Office, the disclosure of which is hereby incorporated by reference in its entirety.

TECHNICAL FIELD

Example embodiments of the present disclosure relate to a semiconductor device, and, more particularly, to a semiconductor device including a capacitor.

DISCUSSION OF RELATED ART

To highly integrate a semiconductor device, small elements and fine patterns may be formed. A pitch that is a sum of a width of each pattern and a distance between adjacent patterns. To highly integrate a semiconductor device, the pitch may be reduced.

However, there may be difficulties in forming patterns with fine pitches due to a limit of resolution in a photolithography process.

SUMMARY

According to example embodiments of inventive concepts, a semiconductor device may include a substrate including a cell region and peripheral region and bottom electrodes on the substrate. The bottom electrodes may be arranged in a first row and a second row that each extend in a first direction. The first row and the second row may be adjacent to each other in a second direction perpendicular to the first direction. The bottom electrodes in the first row may include an outermost bottom electrode and a next outermost bottom electrode that are separated by a first distance in the first direction. The bottom electrodes in the second row may include an outermost bottom electrode and a next outermost bottom electrode that are separated by a second distance in the first direction. The outermost bottom electrode in the first row may be on the peripheral region of the substrate. The outermost bottom electrode in the second row may be on the cell region of the substrate. According to example embodiments of inventive concepts, a semiconductor device may include a substrate, an interlayer insulating layer on the substrate, landing pads in the interlayer insulating layer, a landing dam in the interlayer insulating layer, and bottom electrodes on the interlayer insulating layer. The bottom electrodes may be arranged in a first direction. The landing dam may surround the landing pads in plan view. The bottom electrodes may include first bottom electrodes and a second bottom electrode. The first bottom electrodes may overlap the landing pads, respectively, and the second bottom electrode may overlap the landing dam, in plan view.

According to example embodiments of inventive concepts, a semiconductor device may include a substrate, an interlayer insulating layer on the substrate, landing pads in the interlayer insulating layer, a landing dam in the interlayer insulating layer, and bottom electrodes on the interlayer insulating layer. The bottom electrodes may be arranged in two dimensions. The landing dam may surround the landing pads in plan view. The bottom electrodes may include first bottom electrodes contacting the landing pads, respectively, and second bottom electrodes contacting the landing dam.

BRIEF DESCRIPTION OF THE DRAWINGS

FIGS. 5A to 21A are schematic plan views illustrating a method of manufacturing a semiconductor device according to example embodiments.

FIGS. 5B to 21B, 5C to 21C and 11D to 21D are schematic cross-sectional views illustrating a method of manufacturing a semiconductor device according to example embodiments.

DETAILED DESCRIPTION

Figure 1:
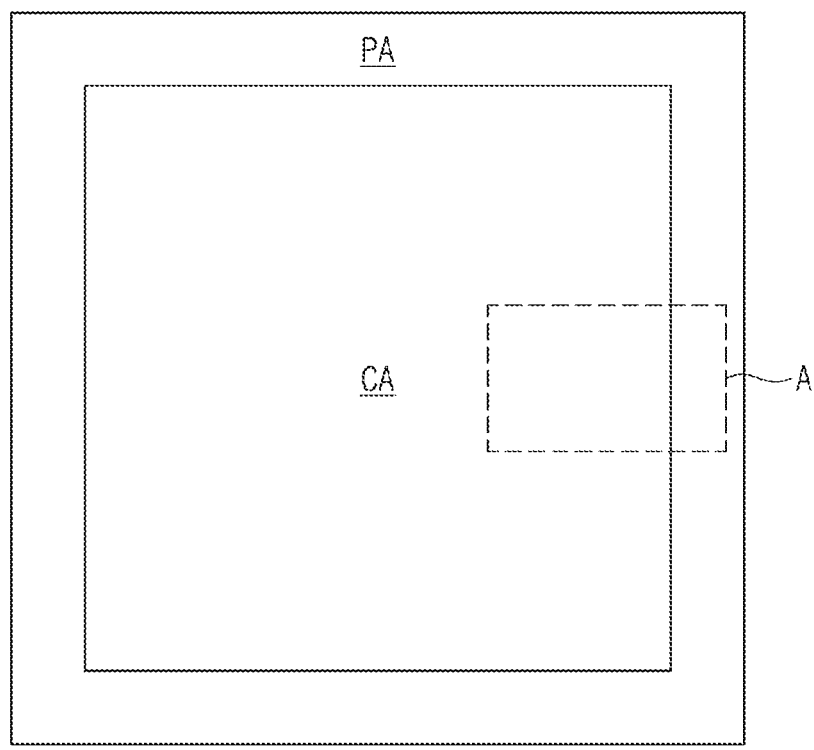
FIG. 1 is a schematic plan view illustrating a semiconductor device according to example embodiments.

Various example embodiments will now be described more fully hereinafter with reference to the accompanying drawings. Like reference numerals may refer to like elements throughout this application.

Figure 2A:
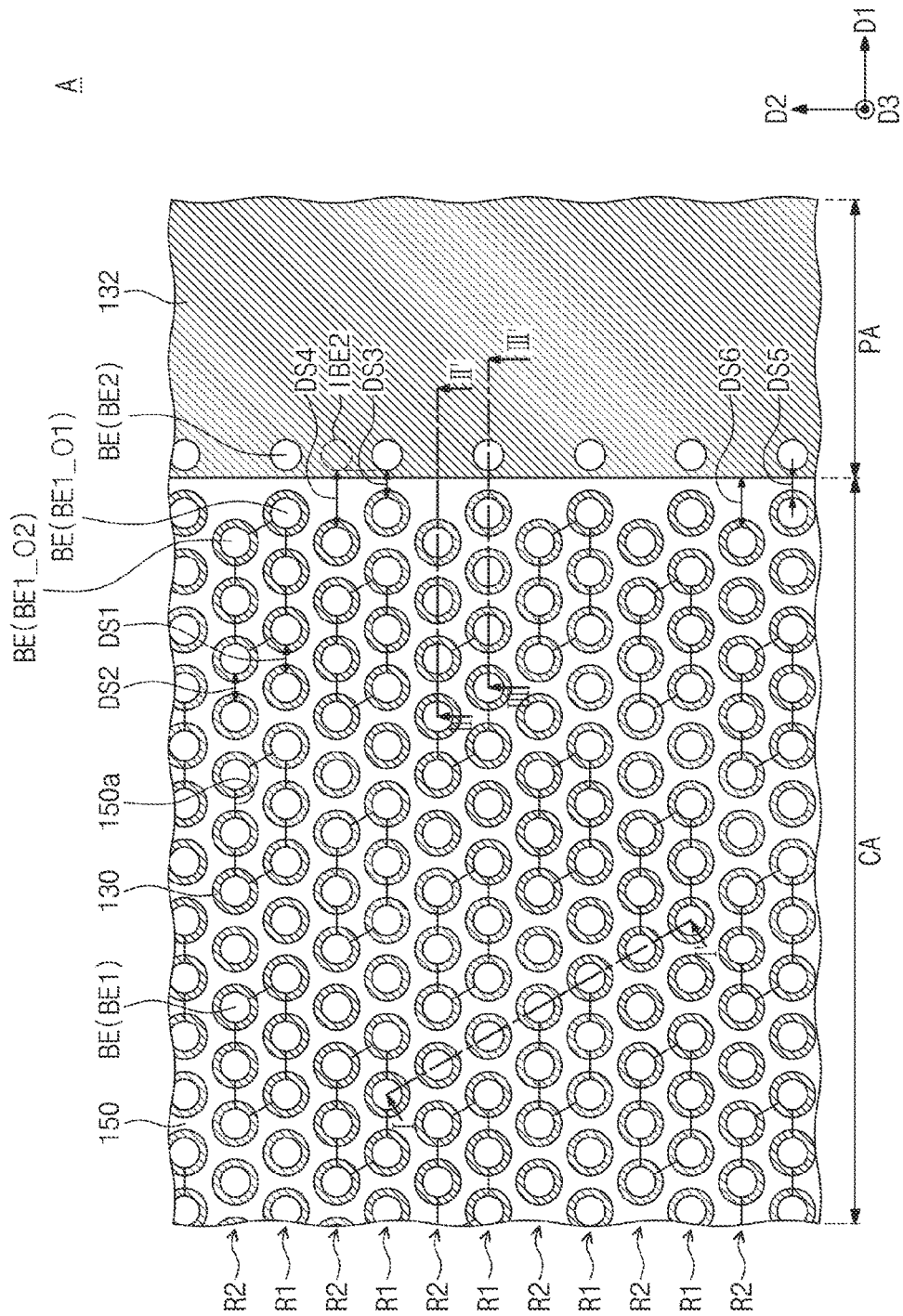
FIG. 2A is a schematic plan view illustrating a semiconductor device according to example embodiments.
Figure 2B:
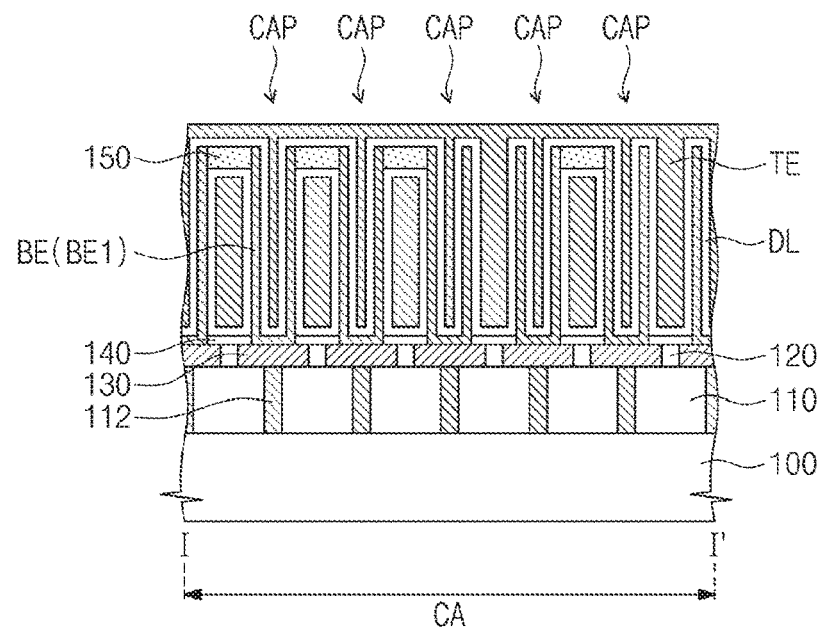
FIGS. 2B, 2C, and 2D are schematic cross-sectional views illustrating a semiconductor device according to example embodiments.
Figure 2C:
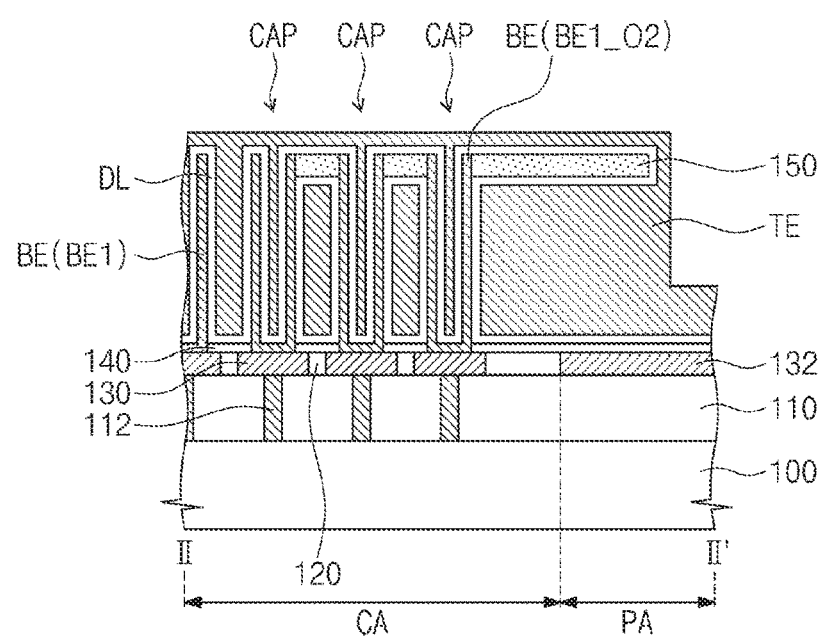
Figure 2D:
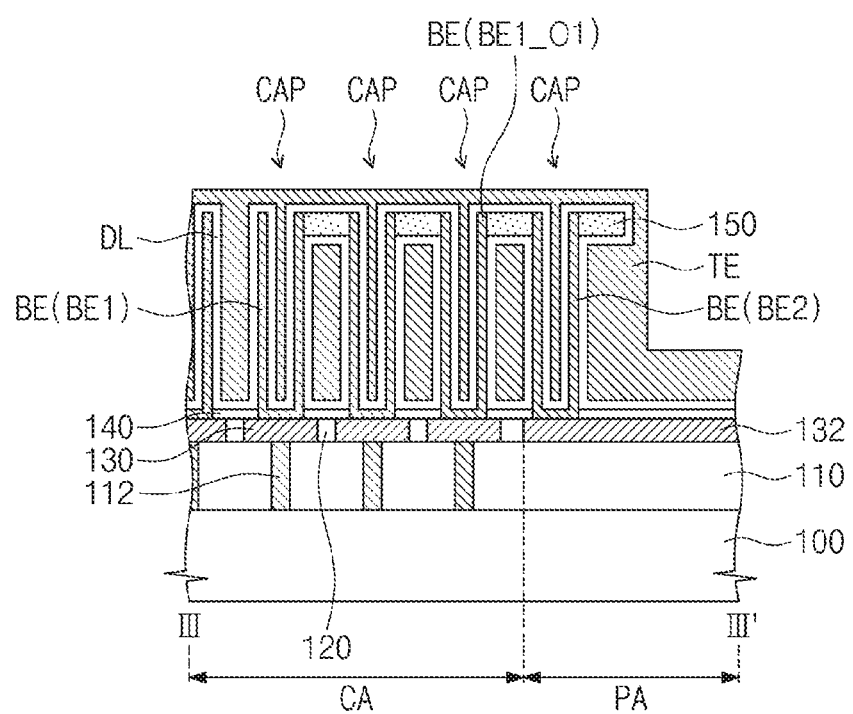

FIG. 1 is a schematic plan view illustrating a semiconductor device according to example embodiments. FIG. 2A is a schematic plan view illustrating a semiconductor device according to example embodiments, and, more specifically, is an enlarged view of region A of FIG. 1. FIGS. 2B and 2C are schematic cross-sectional views illustrating a semiconductor device according to example embodiments. More specifically, FIG. 2B is a cross-sectional view taken along line I-I' of FIG. 2A, FIG. 2C is a cross-sectional view taken along line II-II' of FIG. 2A, and FIG. 2D is a cross-sectional view taken along line III-III' of FIG. 2A Referring to FIGS. 1 and 2A to 2D, a substrate 100 may be provided. The substrate 100 may be a semiconductor substrate. For example, the substrate 100 may be a silicon substrate, a germanium substrate or a silicon-germanium substrate.

The substrate 100 may include a cell region CA in which memory cells are arranged and a peripheral region PA adjacent to the cell region CA. For example, the peripheral region PA may surround the cell region CA. The memory cells may each include a selection device and a capacitor that will be described later.

Selection devices may be provided on the substrate 100 of the cell region CA. In some embodiments, the selection devices may be transistors. Some elements (e.g., source/drain regions) of the transistors may be provided in the substrate 100, and other elements (e.g., gate electrodes) of the transistors may be provided on the substrate 100.

A first interlayer insulating layer 110 may be disposed on the substrate 100. The first interlayer insulating layer 110 may cover the selection devices. The first interlayer insulating layer 110 may include, for example, silicon oxide, silicon nitride and/or silicon oxynitride.

Contact plugs 112 may be disposed in the first interlayer insulating layer 110 in the cell region CA. The contact plugs 112 may be electrically connected to the selection devices. The contact plugs 112 may include a conductive material, for example, an impurity doped semiconductor material (e.g., doped silicon, doped germanium, doped silicon-germanium), metal (e.g., titanium, tantalum or tungsten), conductive metal nitride (e.g., titanium nitride or tantalum nitride), a metal-semiconductor compound (e.g., metal silicide), and/or combinations thereof.

A second interlayer insulating layer 120 may be disposed on the first interlayer insulating layer 110. The second interlayer insulating layer 120 may include, for example, silicon oxide, silicon nitride and/or silicon oxynitride.

Landing pads 130 may be two-dimensionally arranged in the second interlayer insulating layer 120 in the cell region CA. The landing pads 130 may be electrically connected to the contact plugs 112, respectively. The landing pads 130 may include a conductive material. For example, the landing pads 130 may include an impurity doped semiconductor material, metal, conductive metal nitride and/or metal-semiconductor compound.

A landing dam 132 may be disposed in the second interlayer insulating layer 120 in the peripheral region PA. The landing dam 132 may be disposed adjacent to outermost ones of the landing pads 130 and may extend to surround the landing pads 130 in plan view. The landing dam 132 may include a conductive material. For example, the landing dam 132 may include an impurity doped semiconductor material, metal, conductive metal nitride and/or metal-semiconductor compound.

An etch stop layer 140 may be disposed on the second interlayer insulating layer 120. The etch stop layer 140 may cover the landing pads 130 and the landing dam 132. The etch stop layer 140 may include, for example, silicon oxide, silicon nitride and/or silicon oxynitride.

Capacitors CAP may be disposed on the second interlayer insulating layer 120. The capacitors CAP may include bottom electrodes BE, a dielectric layer DL and a top electrode TE. For example, the capacitors CAP may include the bottom electrodes BE, respectively, and the dielectric layer DE and the top electrode TE may be shared by the capacitors CAP. The bottom electrodes BE may be arranged in a two-dimensional array. The bottom electrodes BE may be arranged to form a plurality of rows R1 and R2 extending in a first direction D1. The plurality of rows R1 and R2 may be spaced apart from each other in a second direction D2 perpendicular to the first direction D1.

The plurality of rows R1 an R2 may include first rows R1 and second rows R2. The first rows R1 and the second rows R1 may be alternately arranged in the second direction D2. In some embodiments, the first rows R1 may correspond to odd-numbered rows of the array of the bottom electrodes BE and the second rows R2 may correspond to even-numbered rows of the array of the bottom electrodes BE. In other embodiments, the first rows R1 may correspond to even-numbered rows of the array of the bottom electrodes BE and the second rows R2 may correspond to odd-numbered rows of the array of the bottom electrodes BE.

The bottom electrodes BE may include first bottom electrodes BE1 in the cell region CA and second bottom electrodes BE2 in the peripheral region PA. In plan view, each of the first bottom electrodes BE1 may at least partially overlap a corresponding one of the landing pads 130, and each of the second bottom electrodes BE2 may at least partially overlap the landing dam 132. For example, each of the first bottom electrodes BE1 may contact the corresponding one of the landing pads 130, and the second bottom electrodes BE2 may contact the landing dam 132.

Each of the first rows R1 may include the first bottom electrodes BE1 and at least one second bottom electrode BE2. Each of the first rows R1 may include one second bottom electrode BE2 as shown in FIGS. 2A and 2C, but are not limited thereto. Hereinafter, it will be described that each of the first rows R1 includes one second bottom electrode BE2. When each of the first rows R1 includes one second bottom electrode BE2, the second bottom electrode BE2 may be an outermost one of the bottom electrodes BE in each of the first rows R1 (e.g., the bottom electrode BE disposed at an outermost position in each first row R1).

Each of the second rows R2 may include the first bottom electrodes BE1. Each of the second rows R1 may not include the second bottom electrode BE2. In each of the plurality of rows R1 and R2, the first bottom electrodes BE1 may be arranged at a distance from one another in the first direction D1. For example, the bottom electrodes BE may be spaced a first distance DS1 apart from one another in each of the first rows R1, and the bottom electrodes BE may be spaced a second distance DS2 apart from one another in each of the second rows R2. The first distance DS1 may be substantially equal to the second distance DS2. Each of the first rows R1 in the cell region CA may include the first bottom electrode BE1 (refer to an outermost first bottom electrode BE1_O1 in the first row R1) adjacent to the peripheral region PA (or disposed at an outermost position in each first row R1 in the cell region CA). Each of the second rows R2 in the cell region CA may include the first bottom electrode BE1 (refer to an outermost first bottom electrode BE1_O2 in the second row R2) adjacent to the peripheral region PA (or disposed at an outermost position in each second row R2 in the cell region CA). When each of the first rows R1 includes one second bottom electrode BE2, the outermost first bottom electrode BE_O1 in the first row R1 may be a next outermost bottom electrode BE in each first row R1. Since the second rows R2 do not include the second bottom electrode BE2, the outermost first bottom electrode BE1_O2 in the second row R2 may be an outermost bottom electrode BE in each second row R2.

In each of the first rows R1, a distance in the first direction D1 between the outermost first bottom electrode BE_O1 in the first row R1 and the second bottom electrode BE2 adjacent thereto may be a third distance DS3. The third distance DS3 may be substantially equal to the first distance DS1. In each of the second rows R2, a distance between the outermost first bottom electrode BE_O2 in the second row R2 and a virtual second bottom electrode iBE2 (virtually disposed at a position adjacent to the outermost first bottom electrode BE_O2 in the second row R2 in the first direction D1 between the second bottom electrodes BE2) may be a fourth distance DS4.

Referring to FIG. 2A, the first bottom electrodes BE1 of each of the first rows R1 and the first bottom electrodes BE1 of each of the second rows R2 may be arranged in a zigzag form. For example, the first bottom electrodes BE1 of an adjacent pair of the first and second rows R1 and R2 may be arranged in a zigzag form. For example, the first bottom electrodes BE1 of the first rows R1 may be shifted by half the first distance DS1 in the first direction D1 with respect to the first bottom electrodes BE1 of the second rows R2.

In this case, the outermost first bottom electrodes BE_O1 of the first rows R1 and the outermost first bottom electrodes BE_O2 of the second rows R2 may be arranged in a zigzag form in the second direction D2. For example, the outermost first bottom electrodes BE_O1 of the first rows R1 may be shifted by half the first distance DS1 in the first distance D1 with respect to the outermost first bottom electrodes BE_O2 of the second rows R2. The outermost first bottom electrodes BE_O1 of the first rows R1 may be closer to the peripheral region PA than the outermost first bottom electrodes BE_O2 of the second rows R2. The third distance DS3 may be less than the fourth distance DS4. In plan view, a shortest distance DS5 between the outermost first bottom electrode BE_O1 of the first row R1 and the landing dam 132 may be less than a shortest distance DS6 between the outermost first bottom electrode BE_O2 of the second row R2 and the landing dam 132.

Referring to FIGS. 2B to 2D, the bottom electrodes BE may each have a cylinder shape having a lower portion and a sidewall portion extending from the lower portion in a third direction D3 substantially perpendicular to the substrate 100. However, the bottom electrodes BE are not limited thereto and may have various shapes. For example, the bottom electrodes BE may have a pillar shape extending in the third direction, unlike as shown in FIGS. 2B to 2D. The bottom electrodes BE may include a conductive material. For example, the bottom electrodes BE may include an impurity doped semiconductor material, metal, conductive metal nitride, a metal-semiconductor compound, and/or combinations thereof.

A supporting pattern 150 may be provided to support the bottom electrodes BE. The supporting pattern 150 may be connected to sidewalls of the bottom electrodes BE. The supporting pattern 150 may include openings 150a. The openings 150a may each have a bar shape, a rectangular shape or a linear shape. A plurality of supporting patterns 150 may be provided, unlike as shown in FIGS. 2B to 2D. The plurality of supporting patterns 150 may be disposed at different heights or levels with respect to the substrate 100. The support pattern(s) 150 may include silicon nitride and/or silicon carbonitride, for example.

The dielectric layer DL may conformally extend along or cover surfaces of the bottom electrodes BE. The dielectric layer DL may be provided with a uniform thickness on the surfaces of the bottom electrodes BE. The dielectric layer DL may extend on an upper surface of the etch stop layer 140 and a surface of the supporting pattern 150. The dielectric layer DL may include, for example, silicon oxide, silicon nitride, metal oxide (e.g., hafnium oxide, aluminum oxide, tantalum oxide or titanium oxide) and/or a dielectric material having a perovskite structure (e.g. $SrTiO_3$(STO), $(Ba,Sr)TiO_3$(BST), $BaTiO_3$, PZT, PLZT). The dielectric layer DL may have a thickness of about 5 nm to about 15 nm.

The top electrode TE may be disposed on the dielectric layer DL to cover the bottom electrodes BE. When the bottom electrodes BE each have the cylinder shape as shown in FIGS. 2B to 2D, the top electrode TE may fill inside the cylinder shaped bottom electrodes BE. The dielectric layer DL may be interposed between the top electrode TE and each of the bottom electrodes BE. The top electrode TE may include a conductive material, e.g., an impurity doped semiconductor material, metal, conductive metal nitride, a metal-semiconductor compound, and/or combination thereof.

In general, the bottom electrodes BE disposed in an edge portion of the cell region may have relatively low uniformity and reliability compared to the bottom electrodes BE disposed in a central portion of the cell region. This may be because uniform process condition or environment is not provided in the peripheral portion of the cell region compared to in the central portion of the cell region. The bottom electrodes BE disposed in the peripheral portion of the cell region may be used as dummy bottom electrodes to solve this problem. As the bottom electrodes are used more as the dummy electrodes, reliability of the semiconductor device increases. However, as the number of the bottom electrodes used as active bottom electrodes decreases, an integration density of the semiconductor device may be lowered.

According to example embodiments of inventive concepts, the bottom electrodes BE may be arranged in two dimensions to form the first and second rows R1 and R2. The first rows R1 may include the second bottom electrodes BE2 in the peripheral region PA (e.g., the second bottom electrodes BE2 on the landing dam 132). In a process of forming the bottom electrodes BE, the second bottom electrodes BE2 may act as dummy bottom electrodes to allow the first bottom electrodes BE1 to be more uniformly formed. Since the second bottom electrodes BE2 are disposed in the peripheral region PA but not in the cell region CA, the second bottom electrodes BE2 may not occupy an additional space in the cell region CA (all the first bottom electrodes BE1 may act as the active bottom electrodes). Thus, the integration density of the semiconductor device may not be reduced and the reliability of the semiconductor device may be enhanced.

Figure 3:
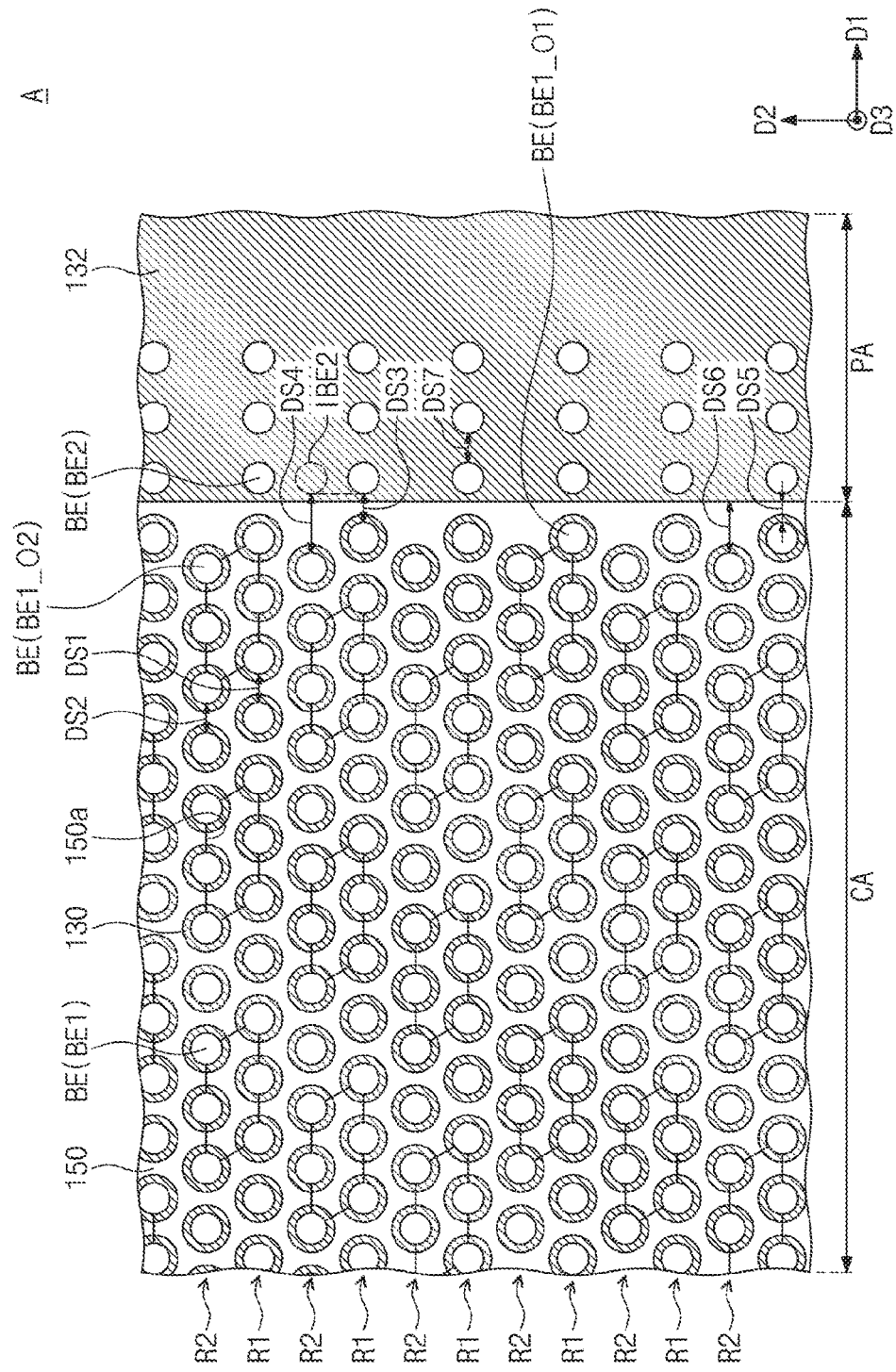
FIG. 3 is a schematic plan view illustrating a semiconductor device according to example embodiments.

FIG. 3 is a schematic plan view illustrating a semiconductor device according to example embodiments.

Referring to FIG. 3, a semiconductor device may have a substantially similar or the same structure as described with reference to FIGS. 1 and 2A to 2D except that each of the first rows R1 includes a plurality of second bottom electrodes BE2. Hereinafter, the first rows R1 will be described in detail.

Each of the first rows R1 may include the plurality of first bottom electrodes BE1 and the plurality of second bottom electrodes BE2. The first bottom electrodes BE1 may be disposed in the cell region CA and the second bottom electrodes BE2 may be disposed in the peripheral region PA. In plan view, each of the first bottom electrodes BE1 may at least partially overlap a corresponding one of the landing pads 130. In plan view, at least one of the second bottom electrodes BE1 may at least partially overlap the landing dam 132 and the others may overlap the landing dam 132. For example, the first bottom electrodes BE1 may contact the landing pads 130, respectively, and the second bottom electrodes BE2 may contact the landing dam 132.

The second bottom electrodes BE1 in each of the first rows R1 may be spaced a seventh distance DS7 apart from one another in the first direction D1. The seventh distance DS7 may be substantially equal to the first distance DS1 and the third distance DS3.

Figure 4:
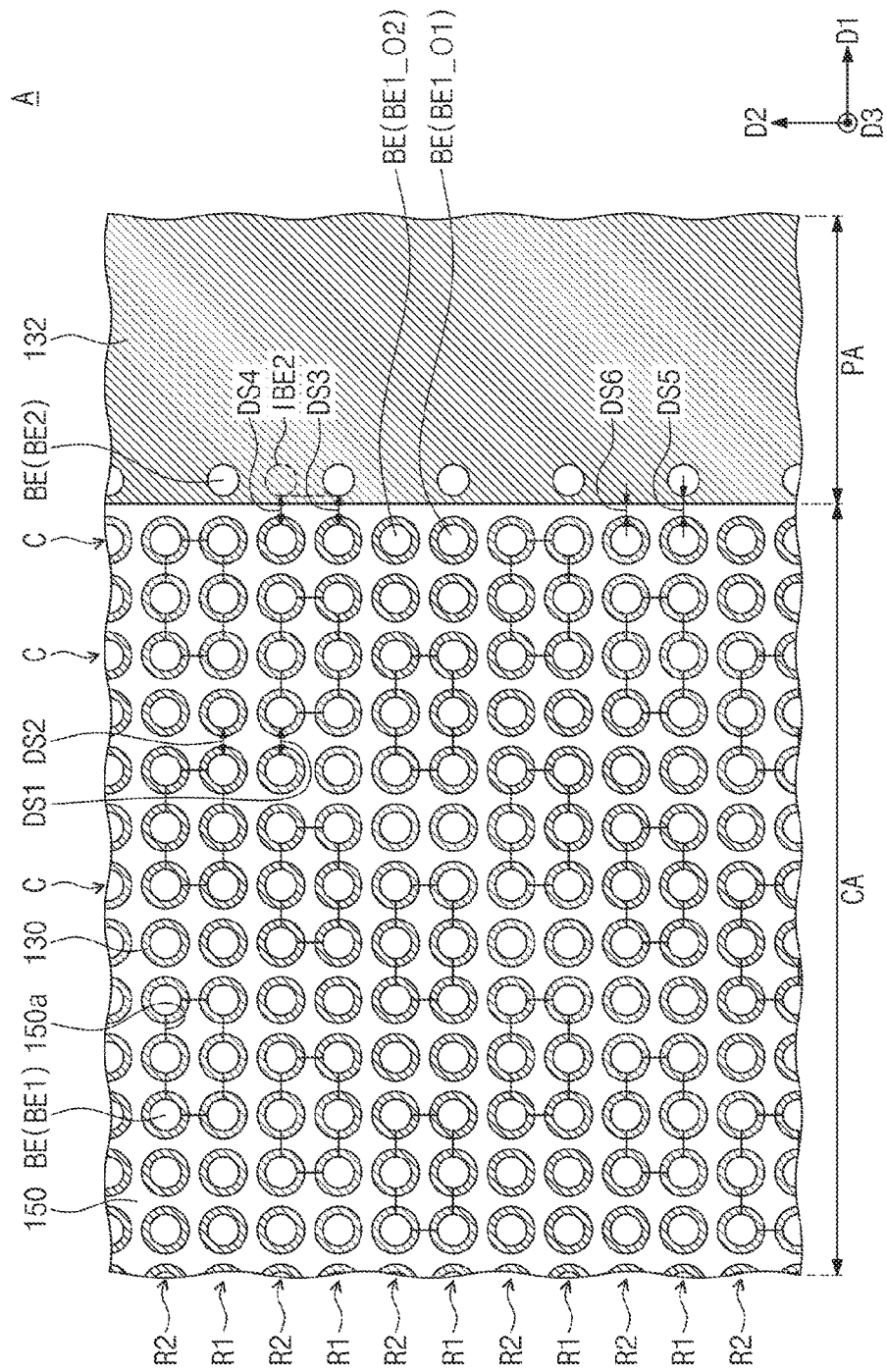
FIG. 4 is a schematic plan view illustrating a semiconductor device according to example embodiments.
Figure 5B:
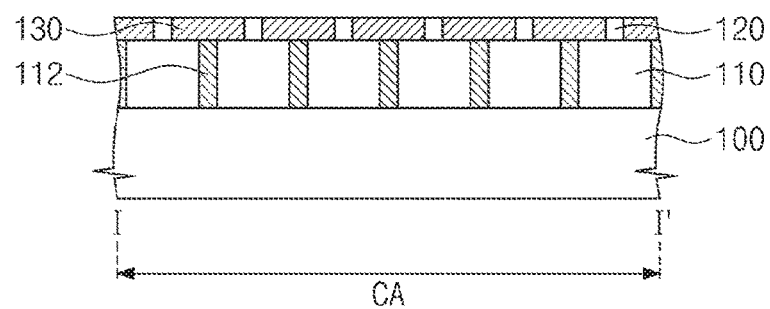
Figure 5C:
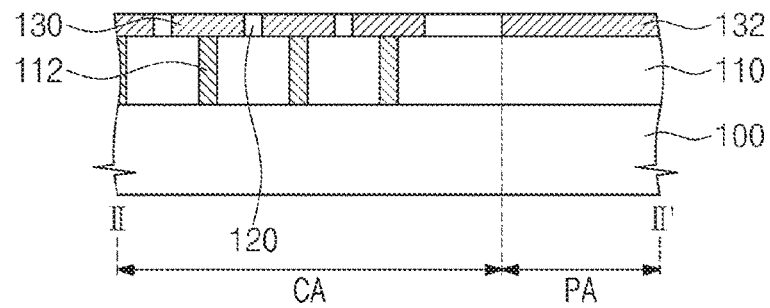
Figure 6B:
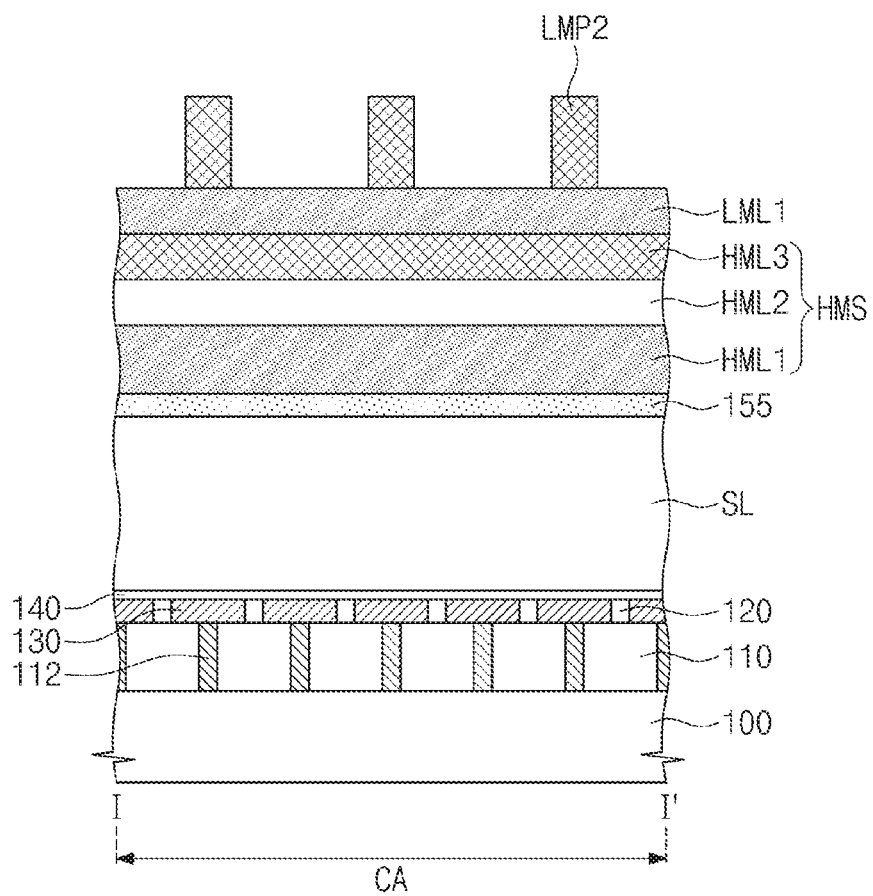
Figure 6C:
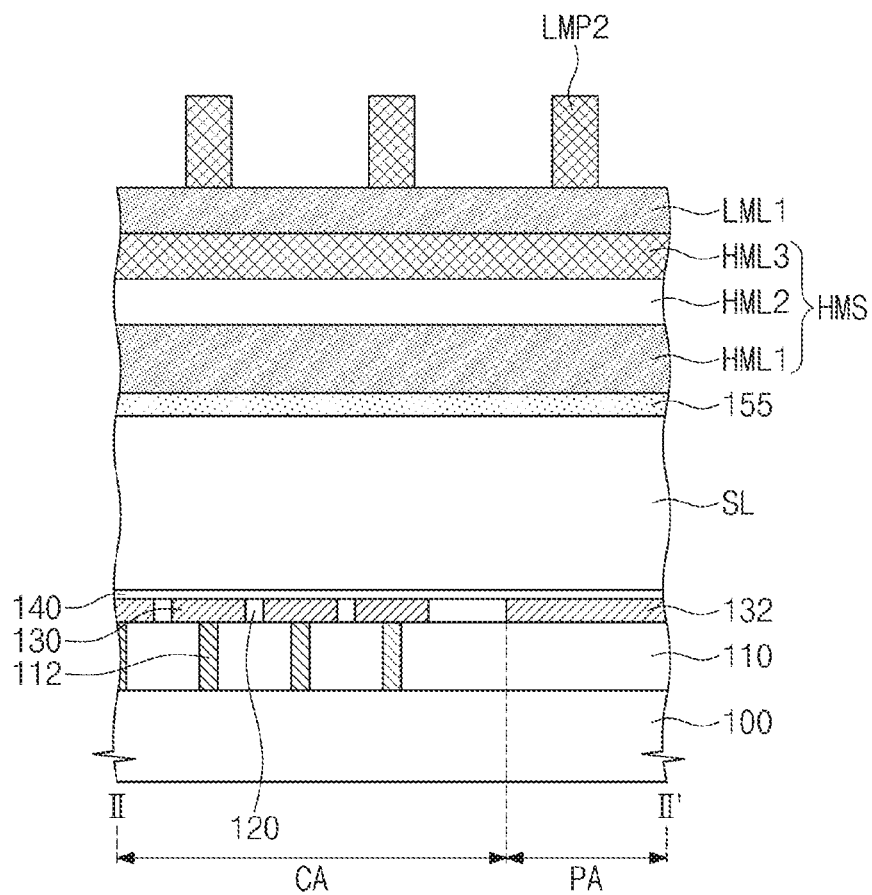
Figure 7B:
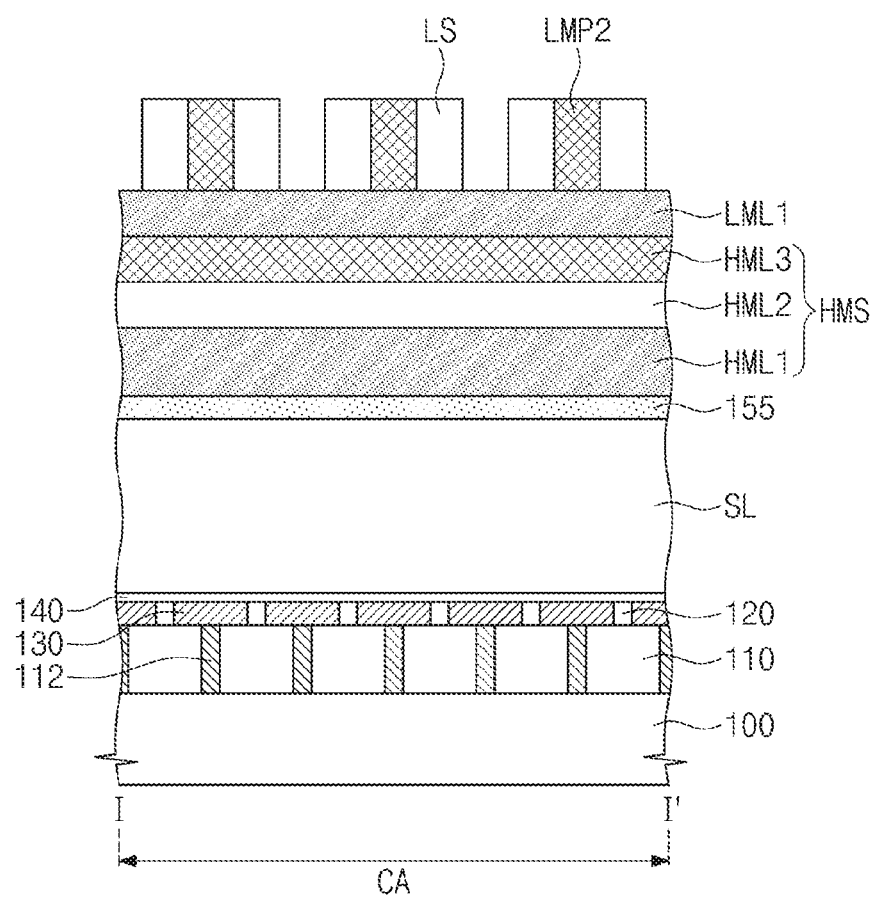
Figure 7C:
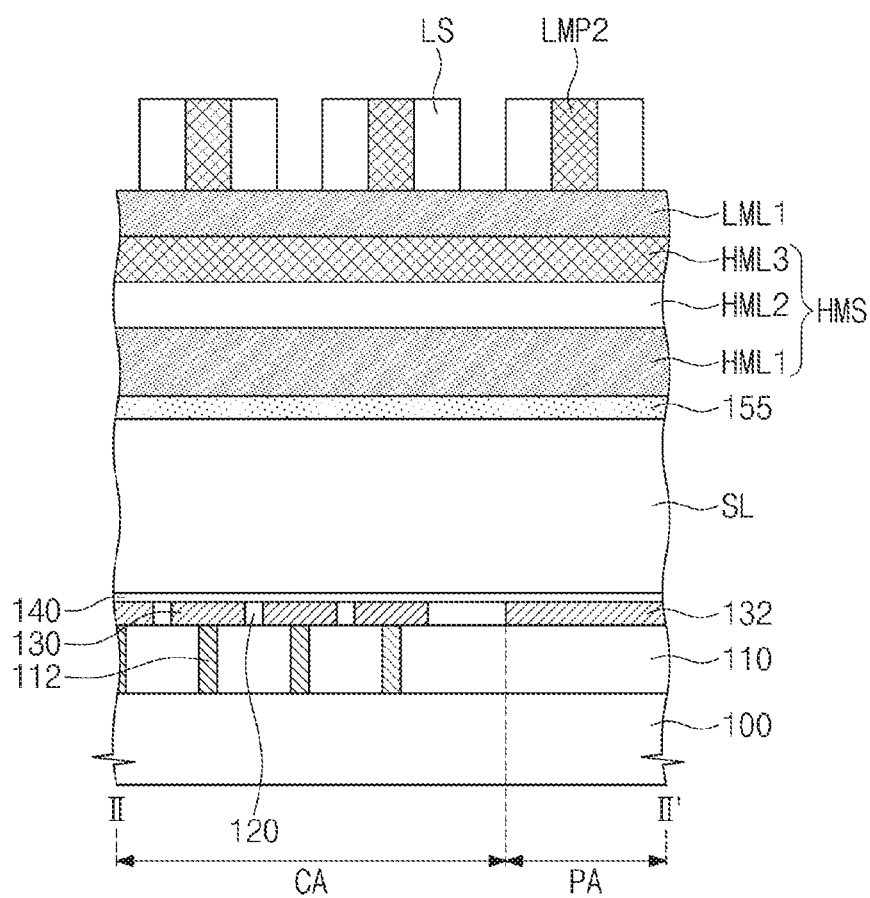
Figure 8B:
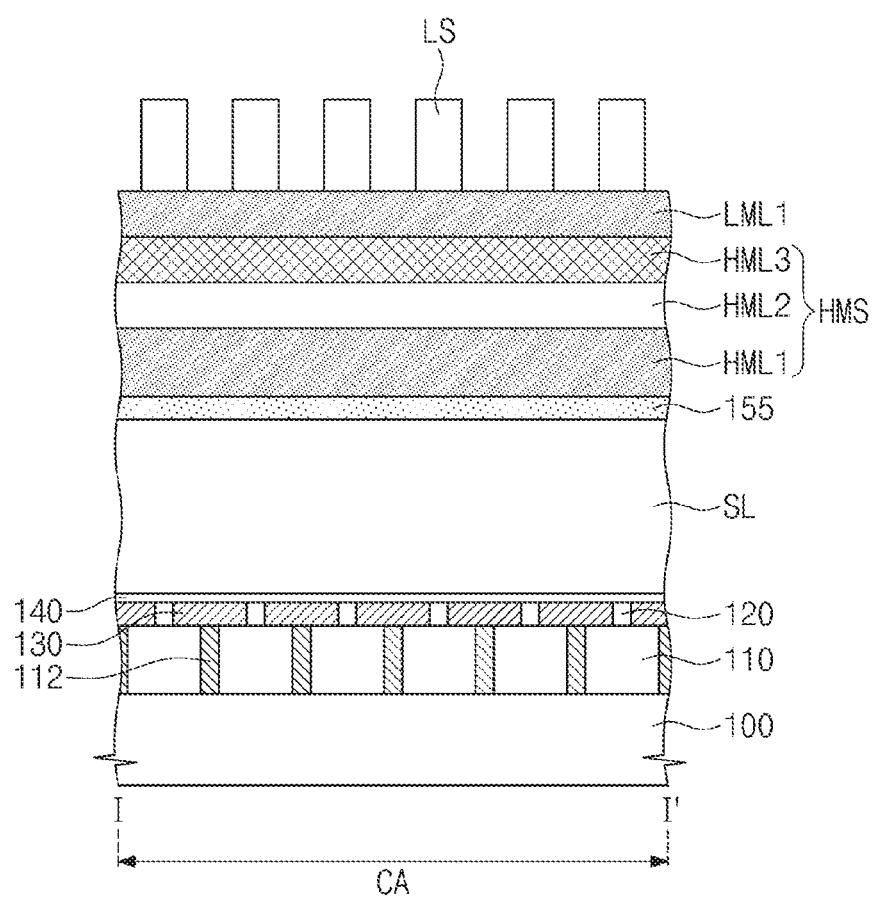
Figure 8C:
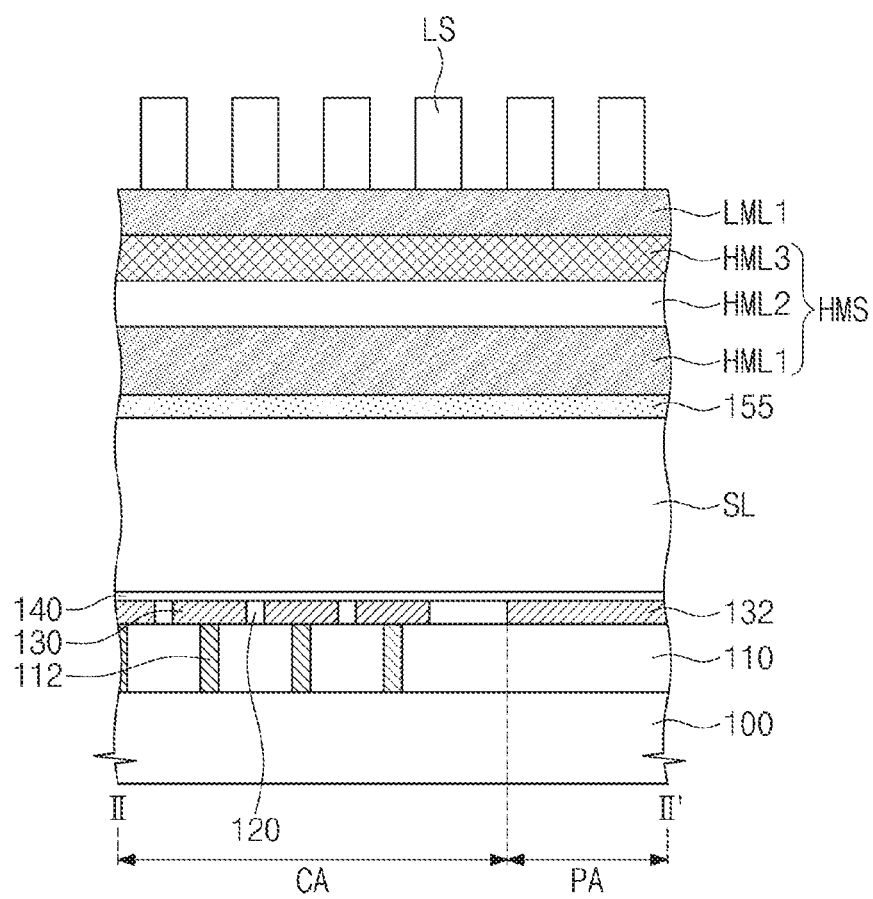
Figure 9B:
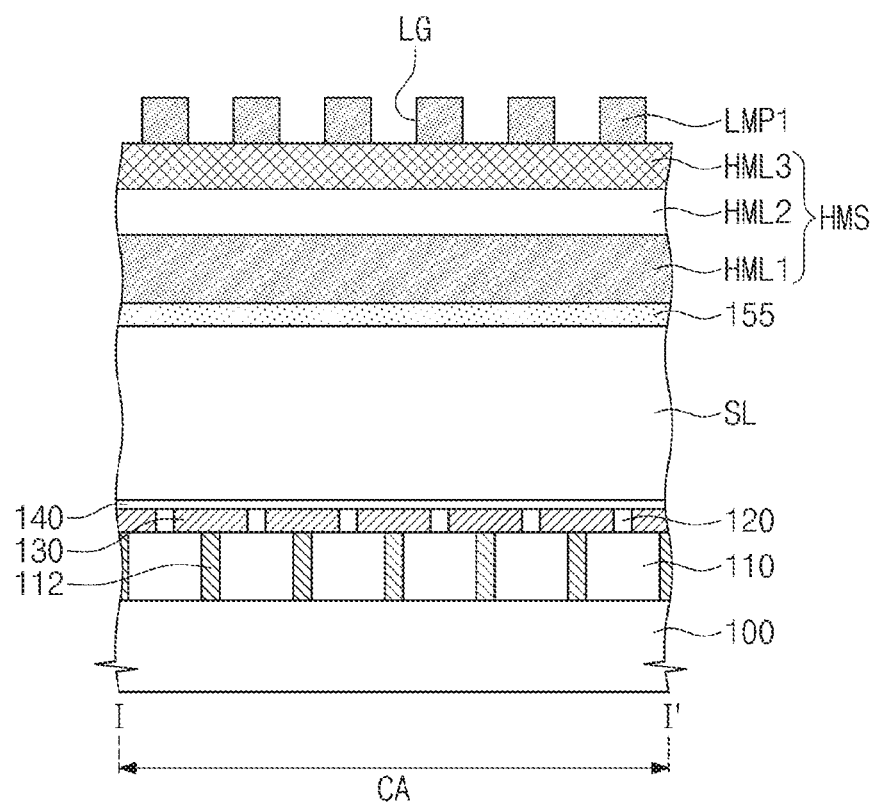
Figure 9C:
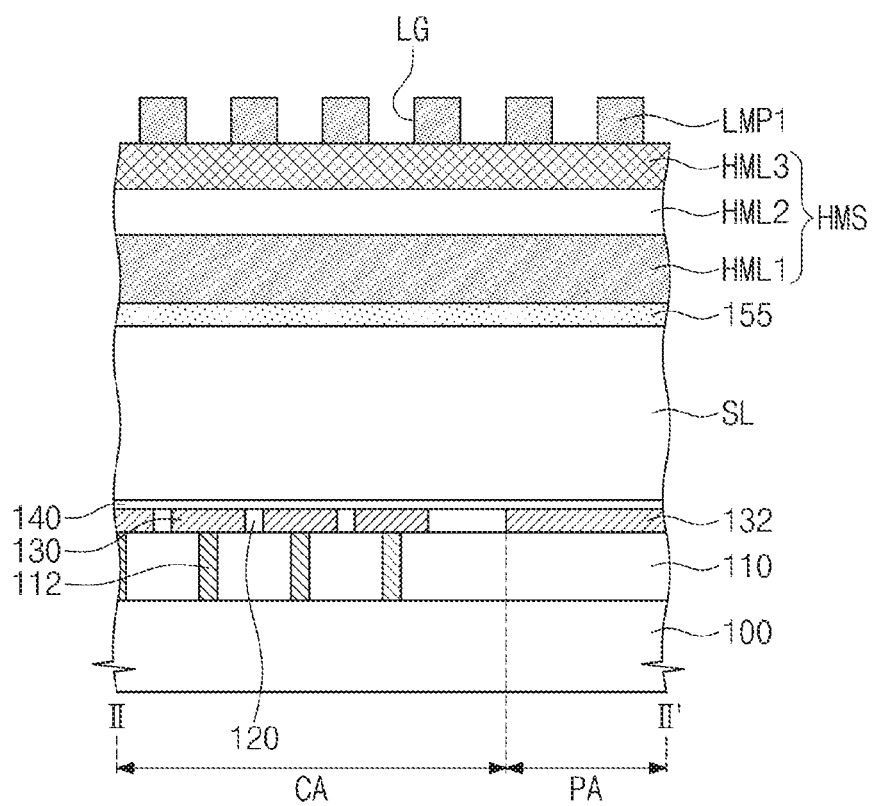
Figure 10A:
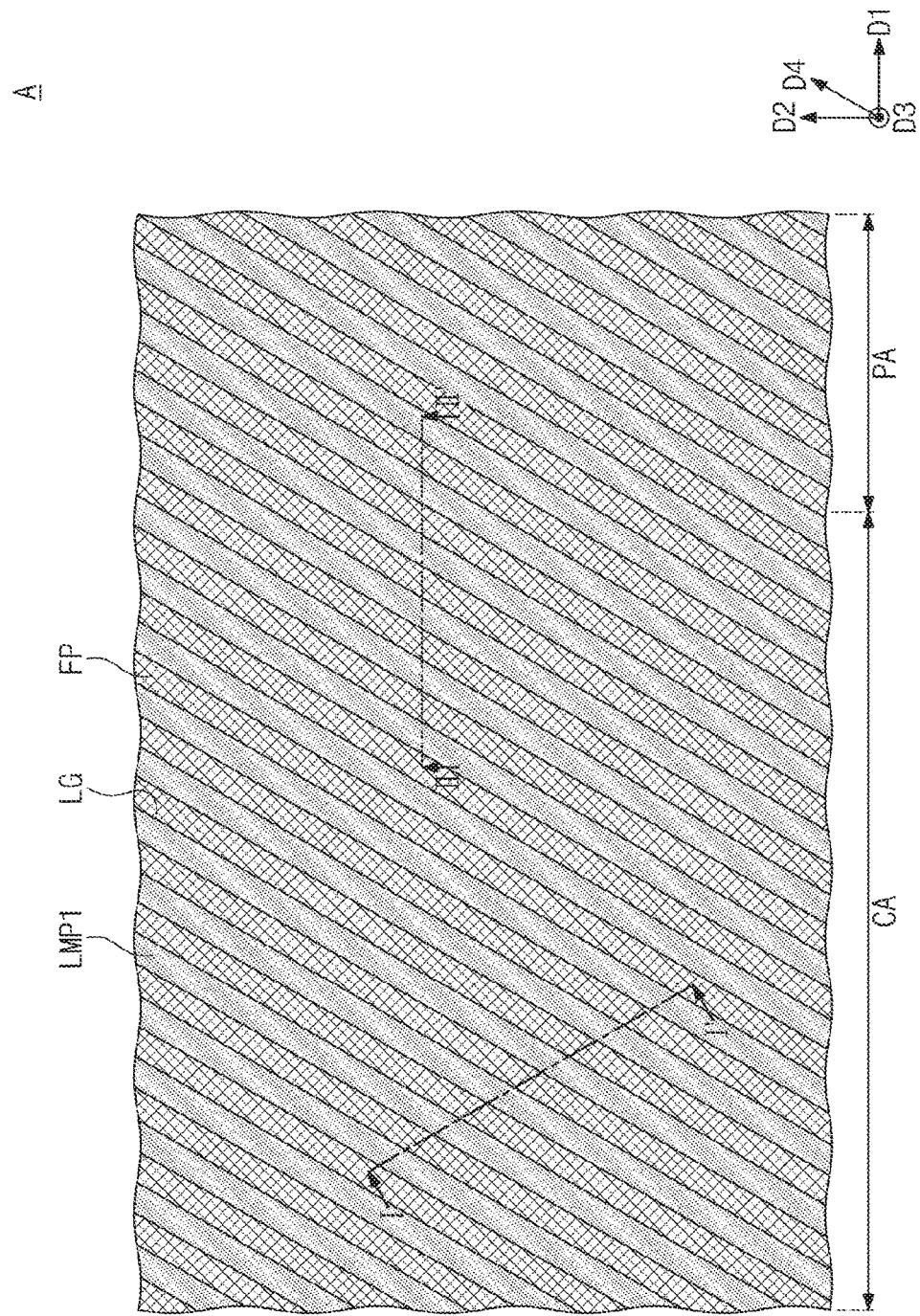
Figure 10B:
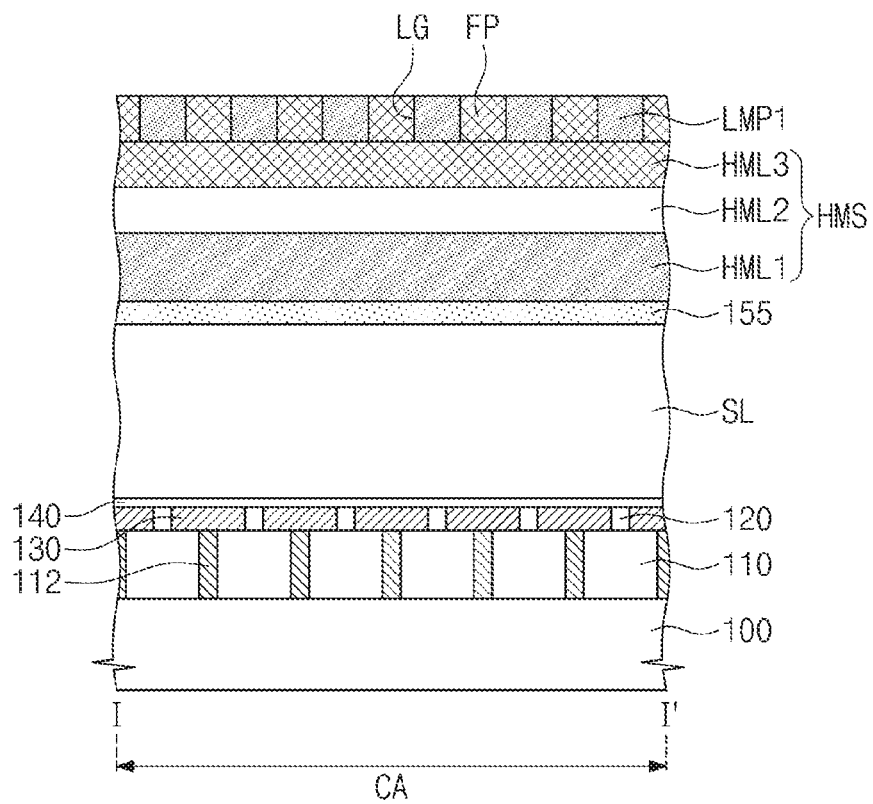
Figure 10C:
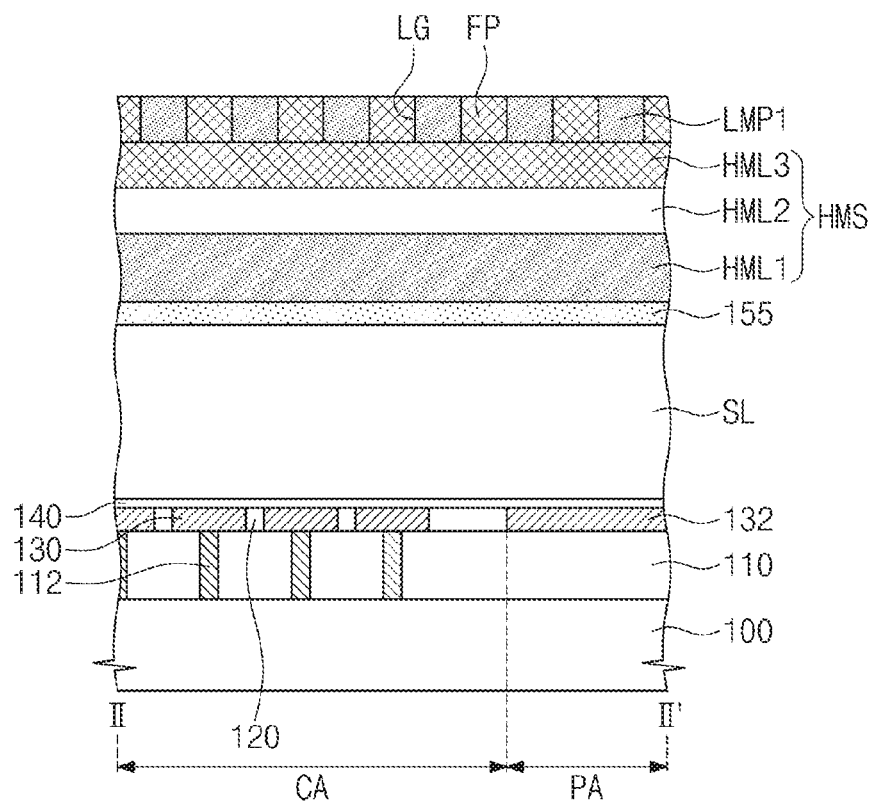
Figure 11A:
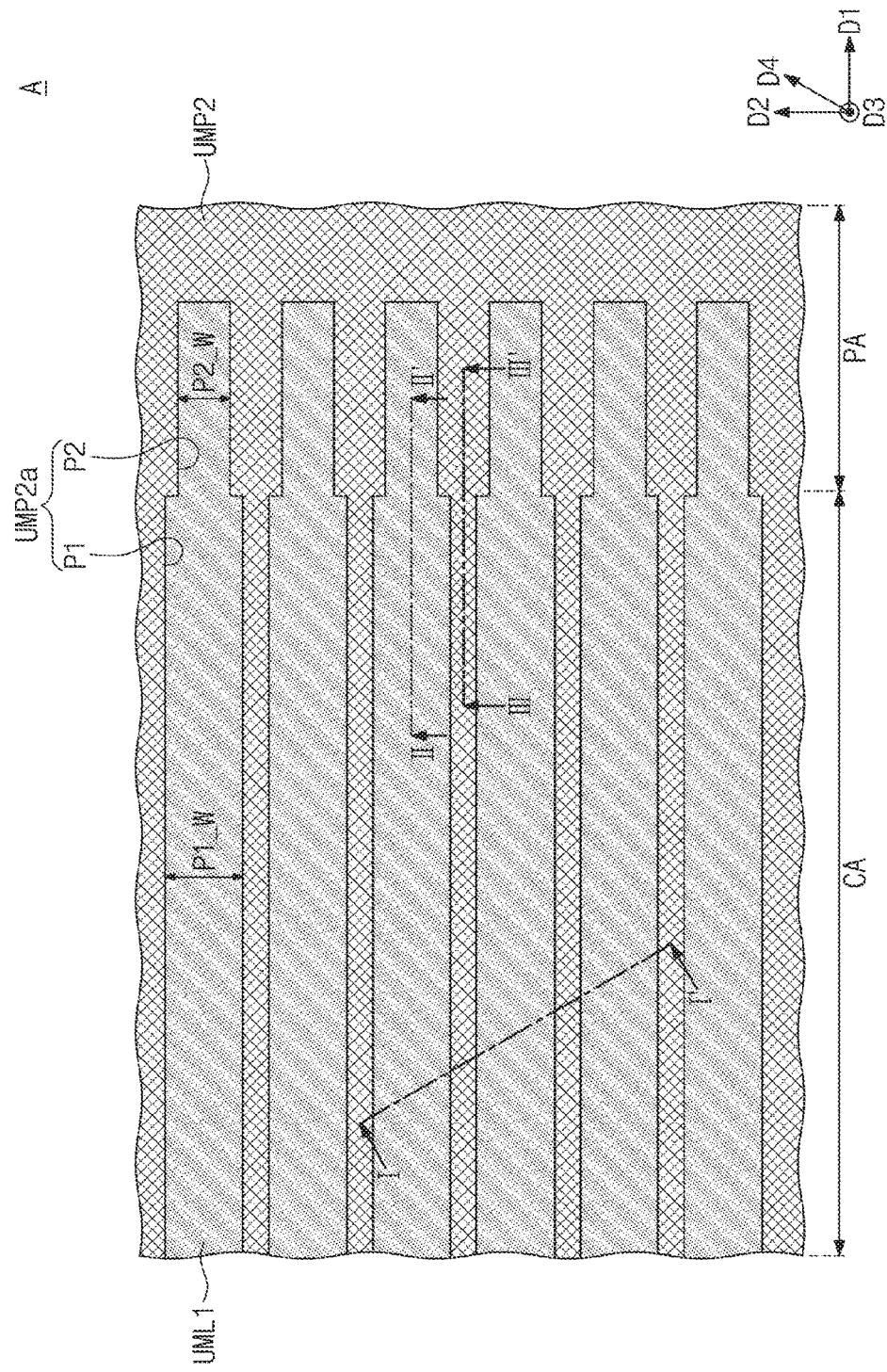
Figure 11B:
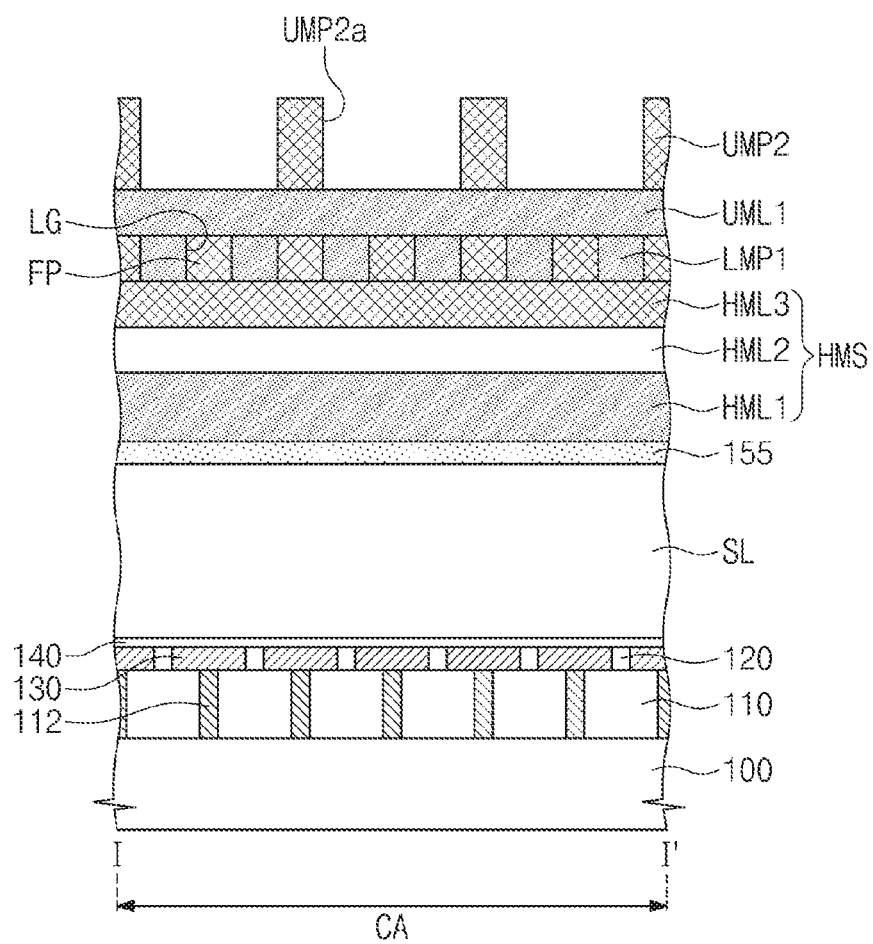
Figure 11C:
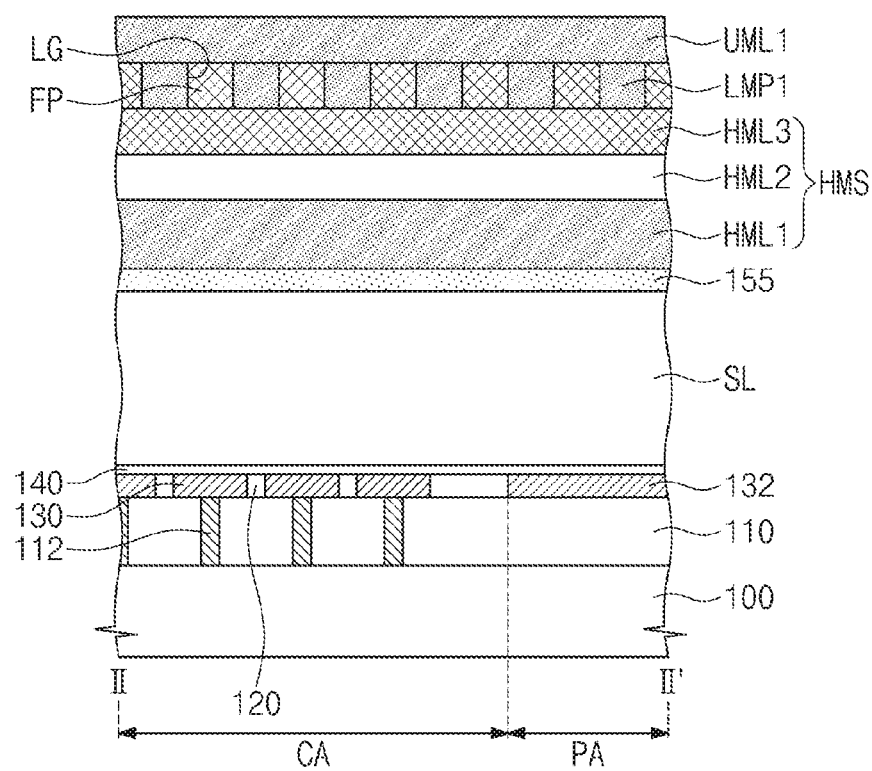
Figure 11D:
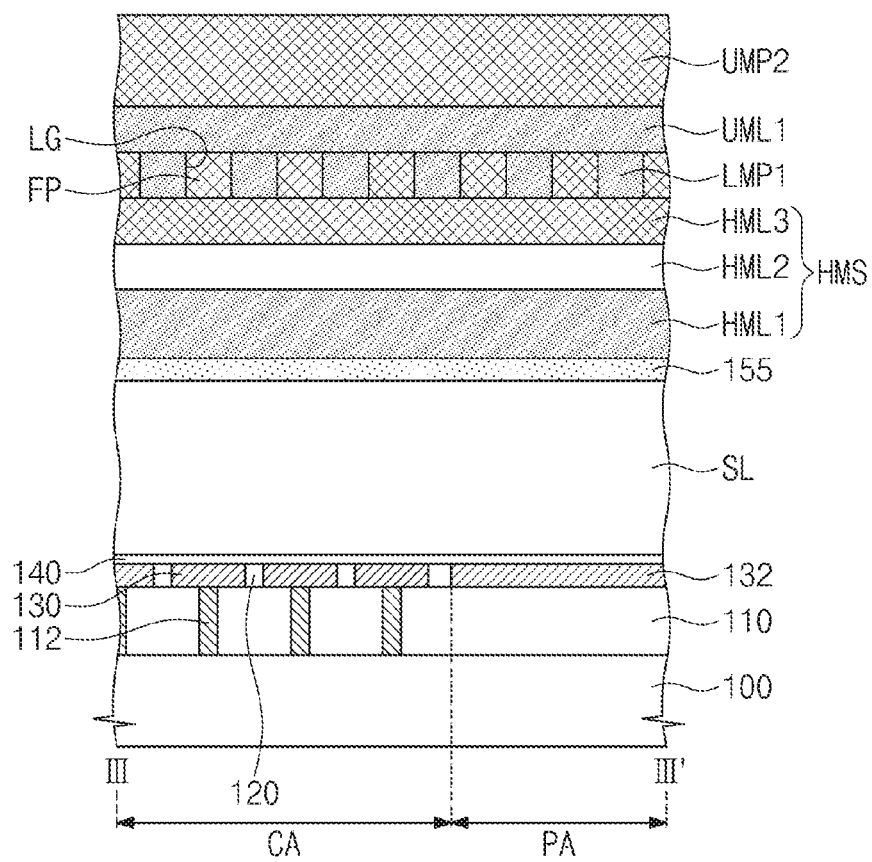
Figure 12B:
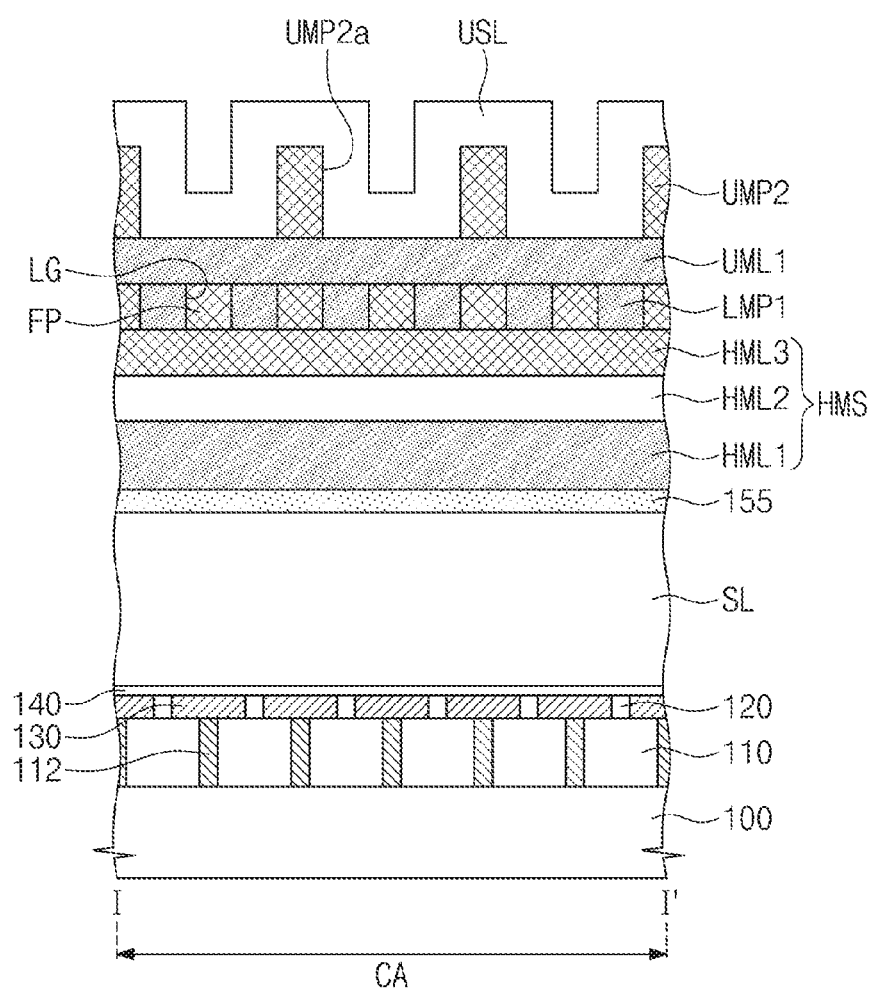
Figure 12C:
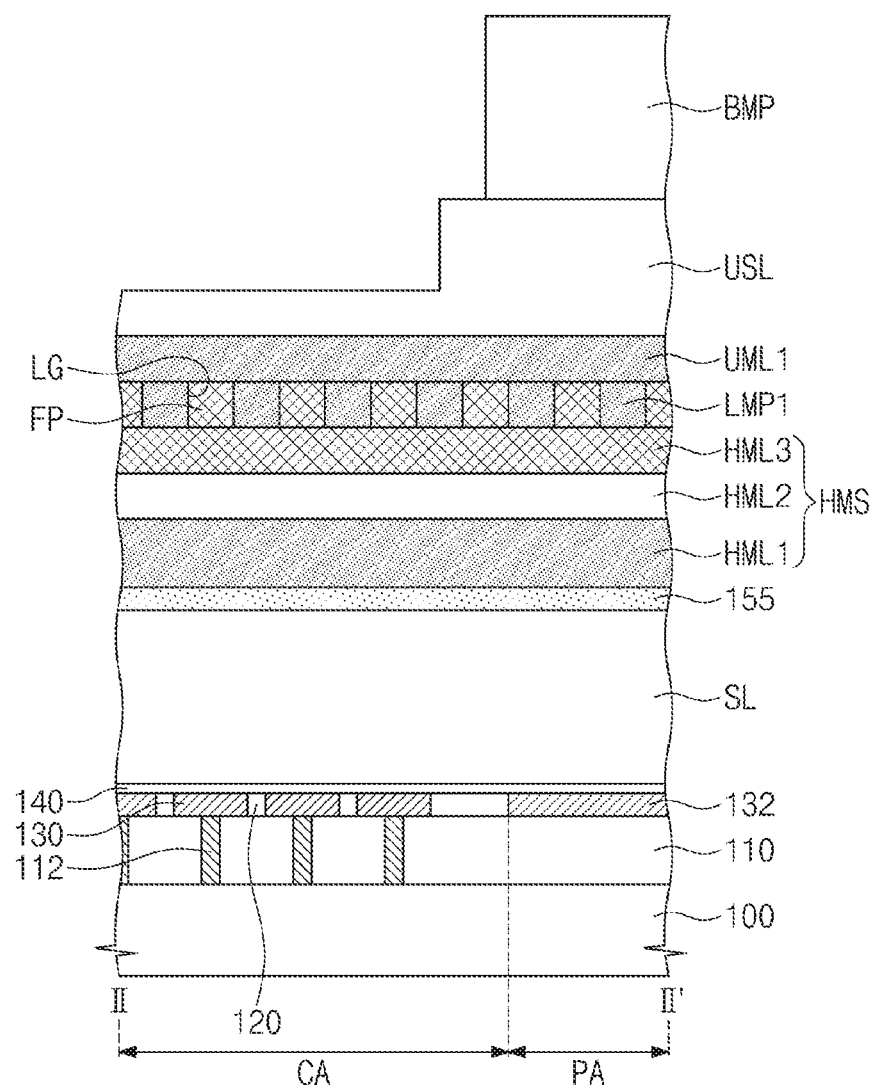
Figure 12D:
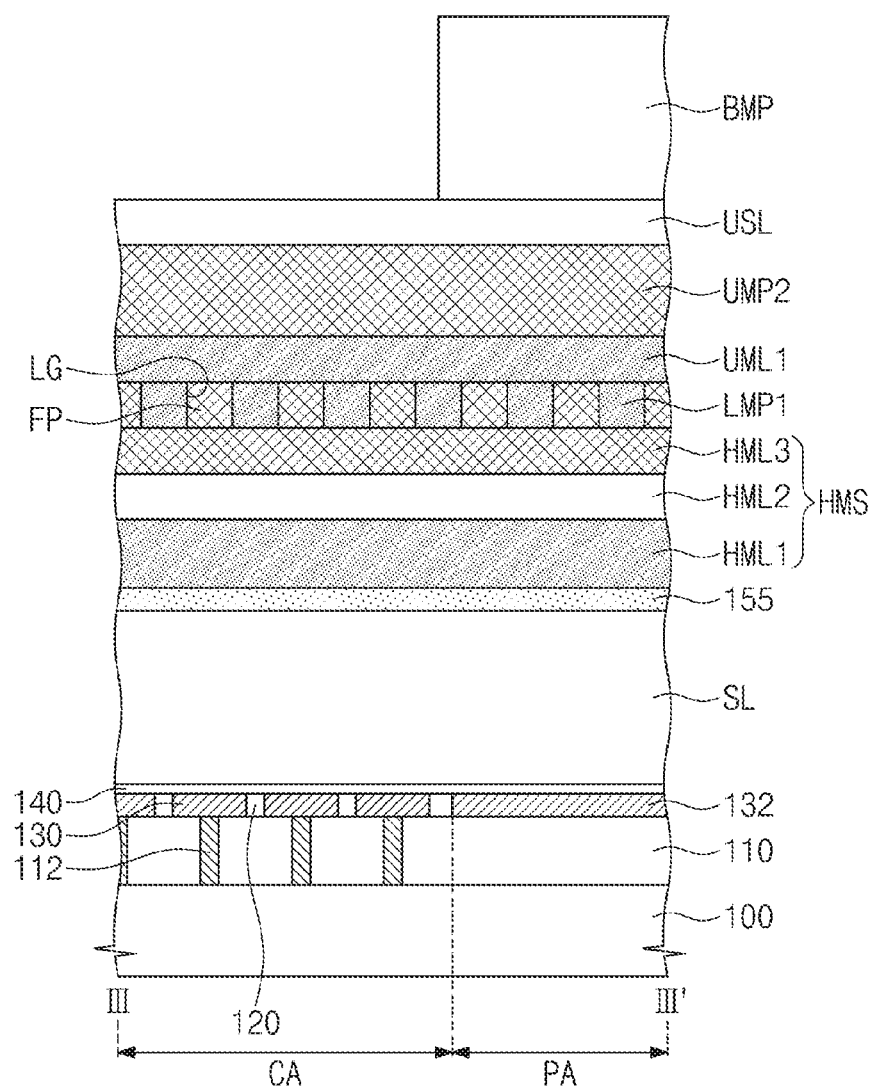
Figure 13A:
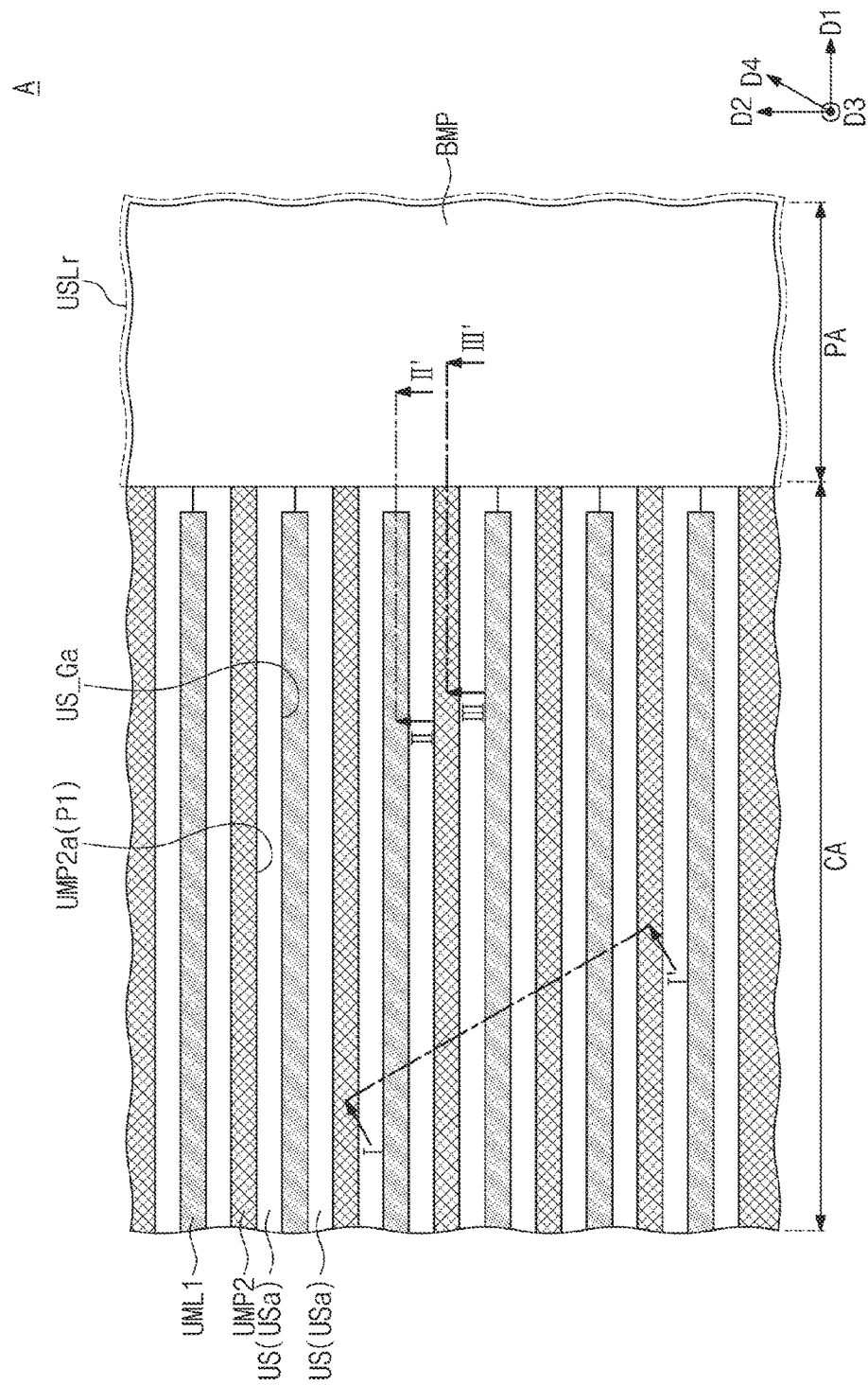
Figure 13B:
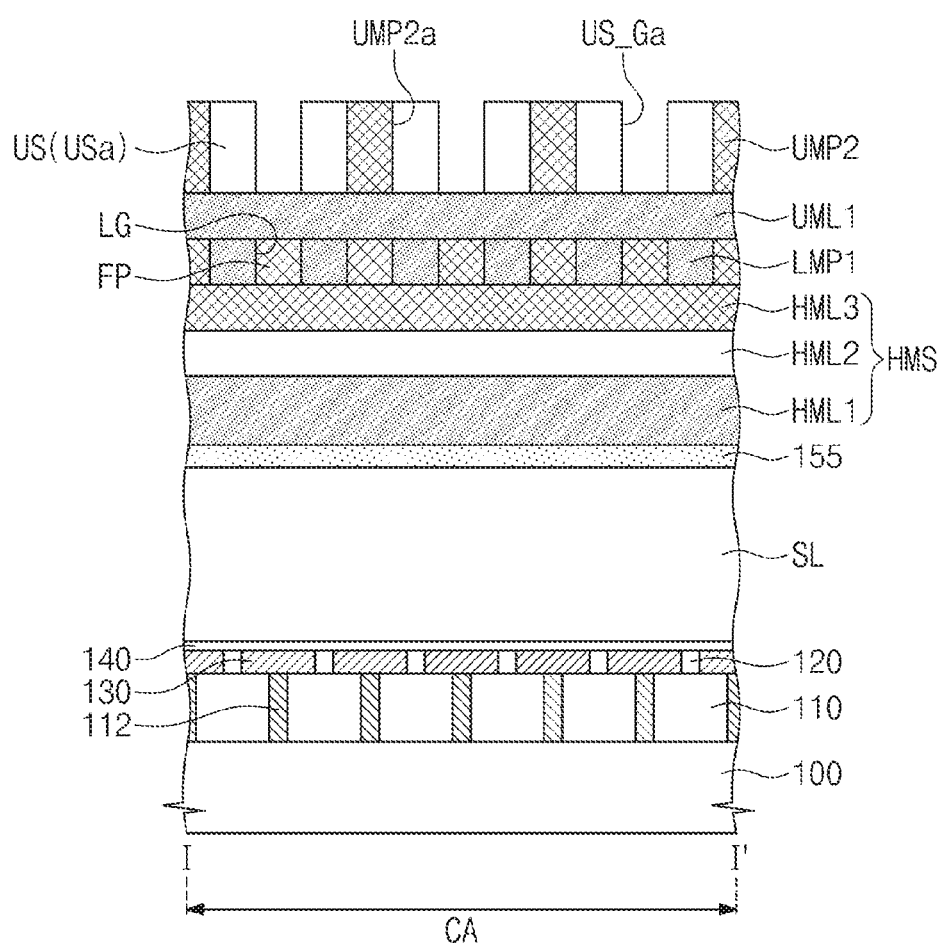
Figure 13C:
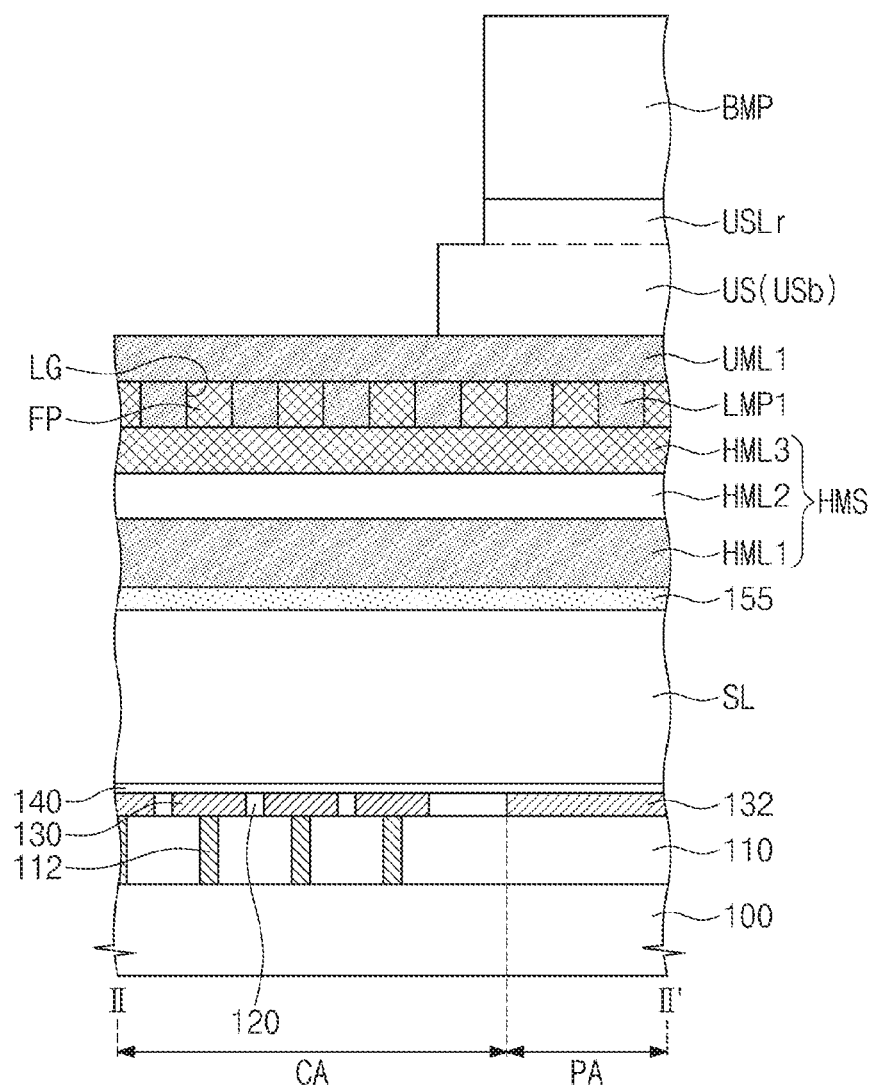
Figure 13D:
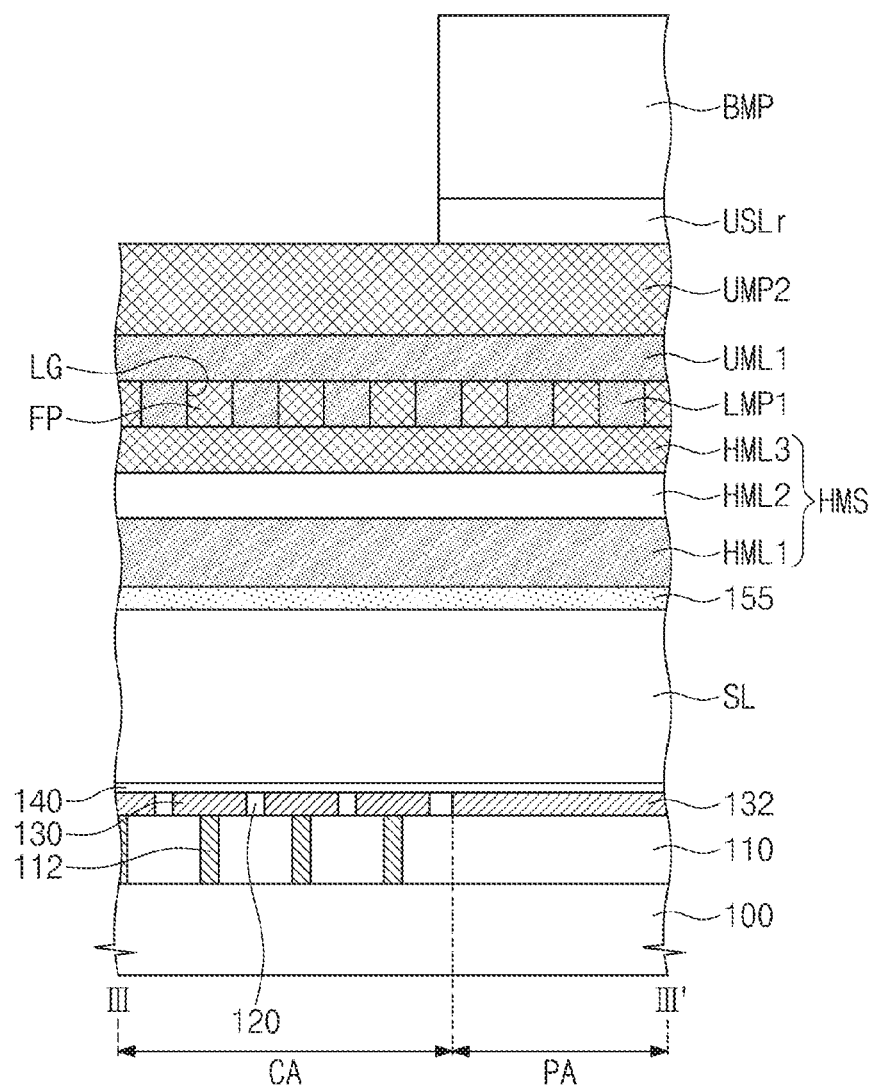
Figure 14A:
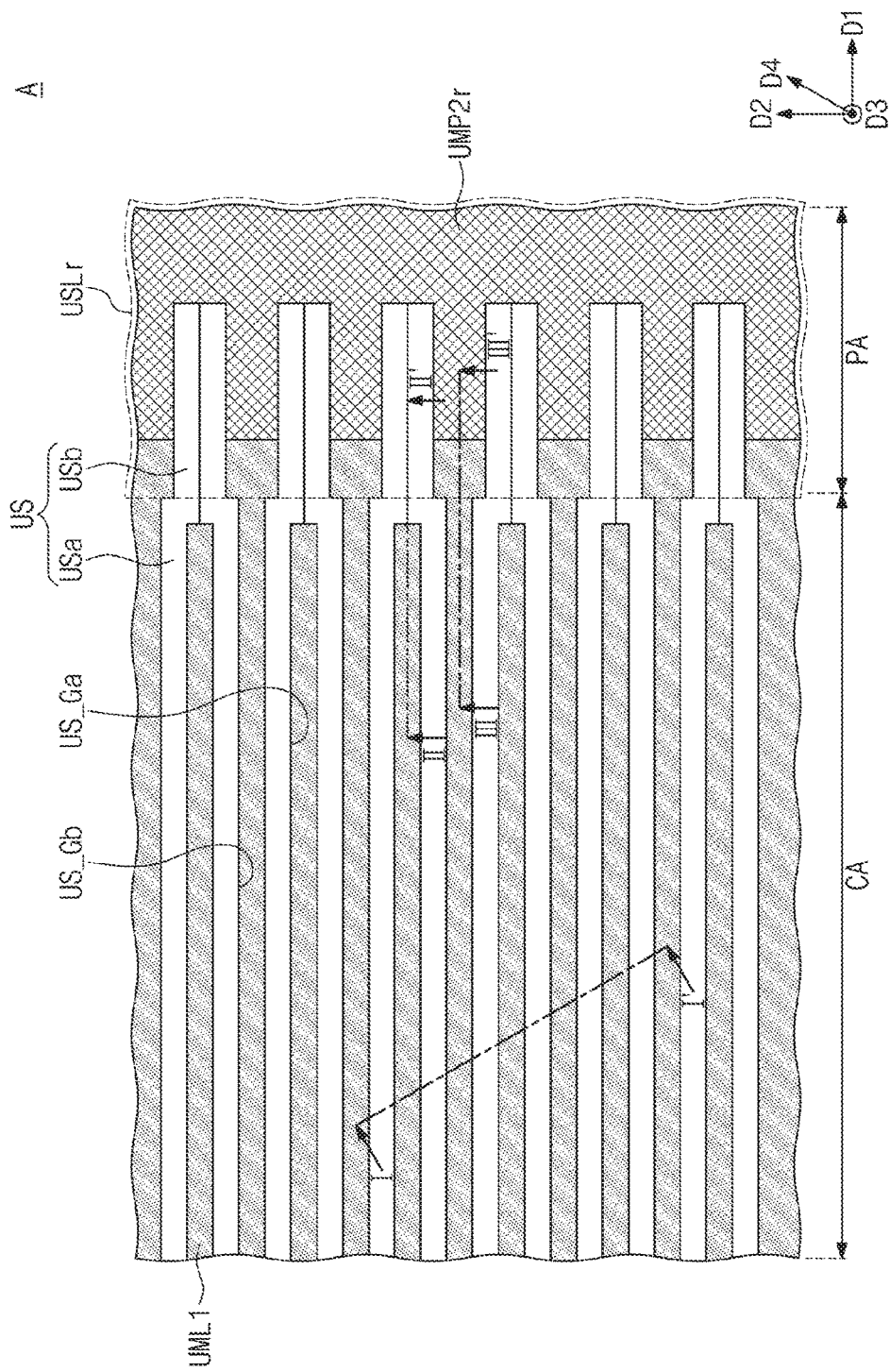
Figure 14B:
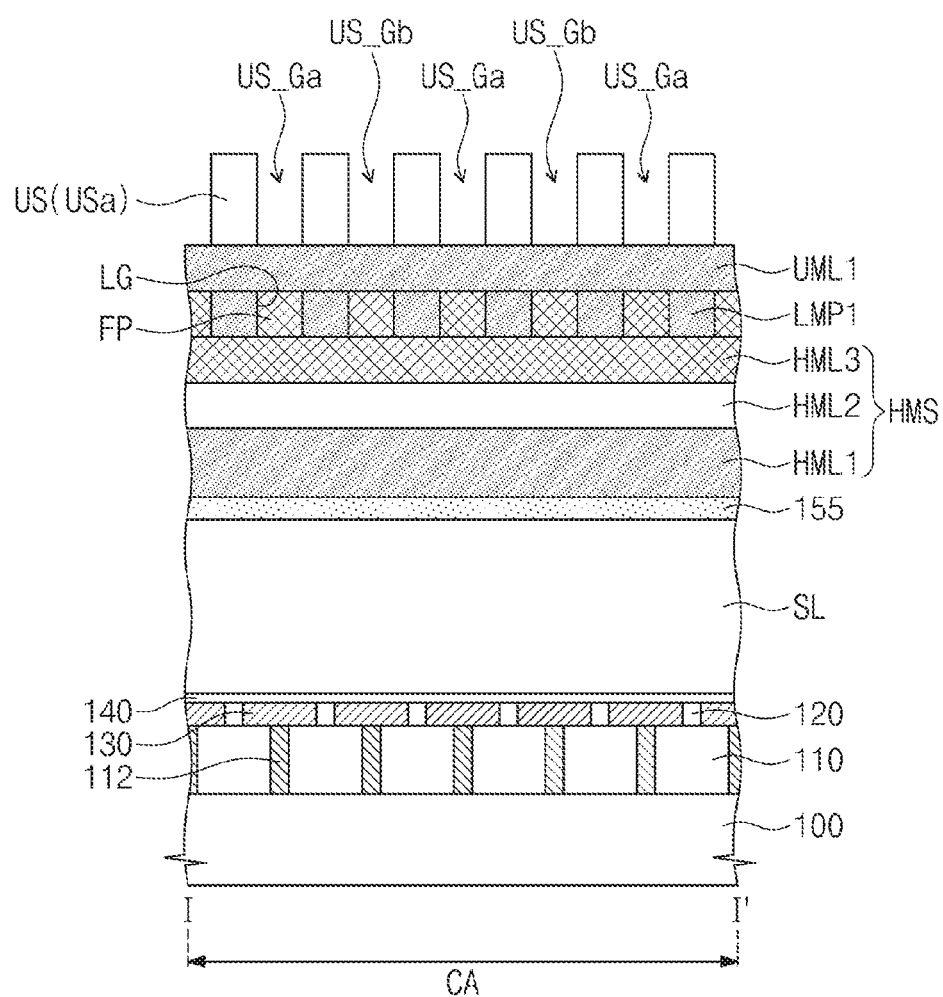
Figure 14C:
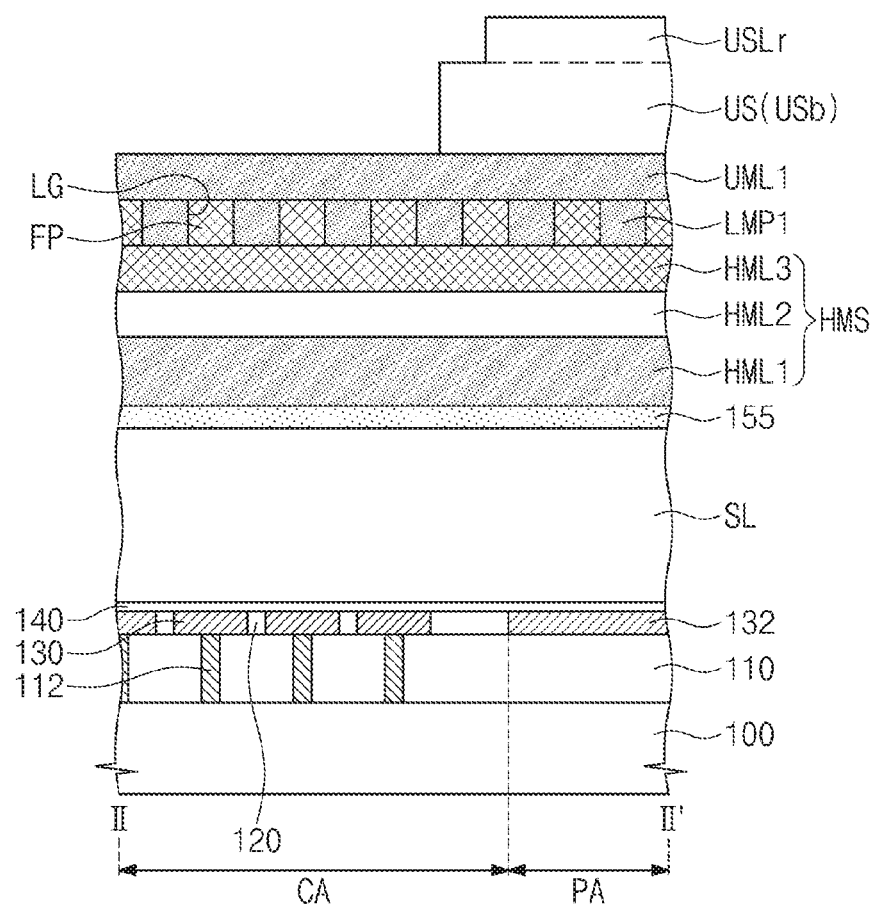
Figure 14D:
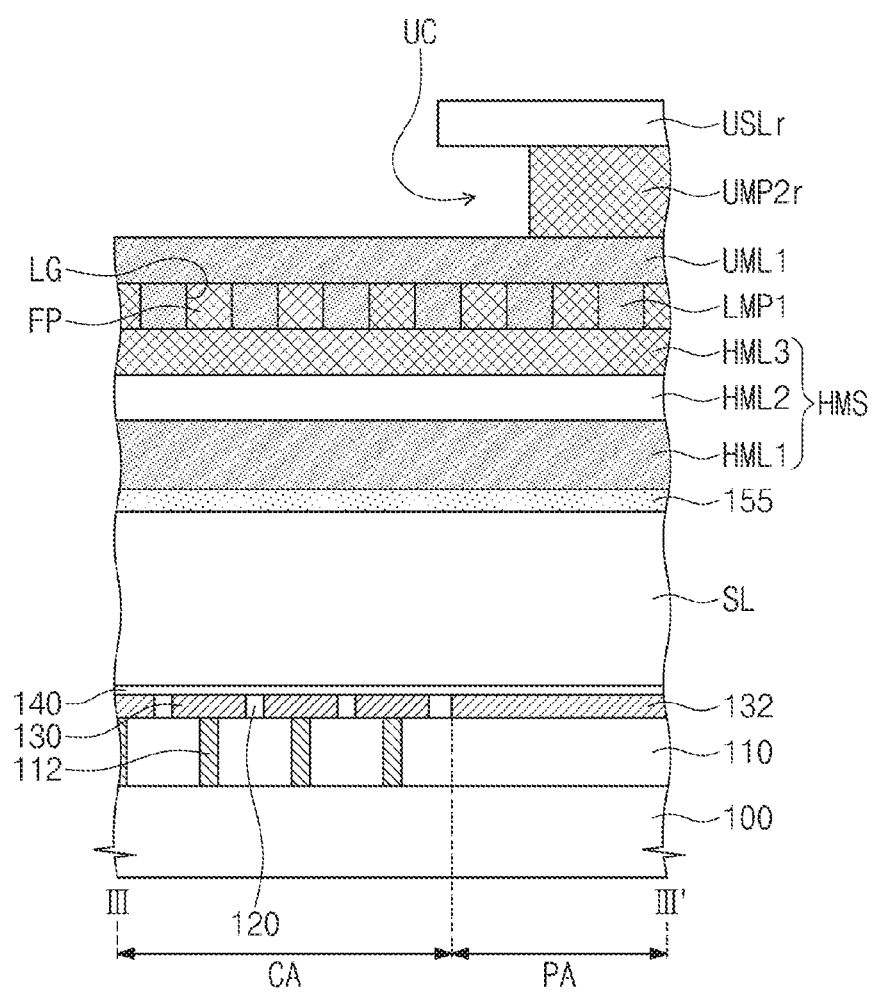
Figure 15B:
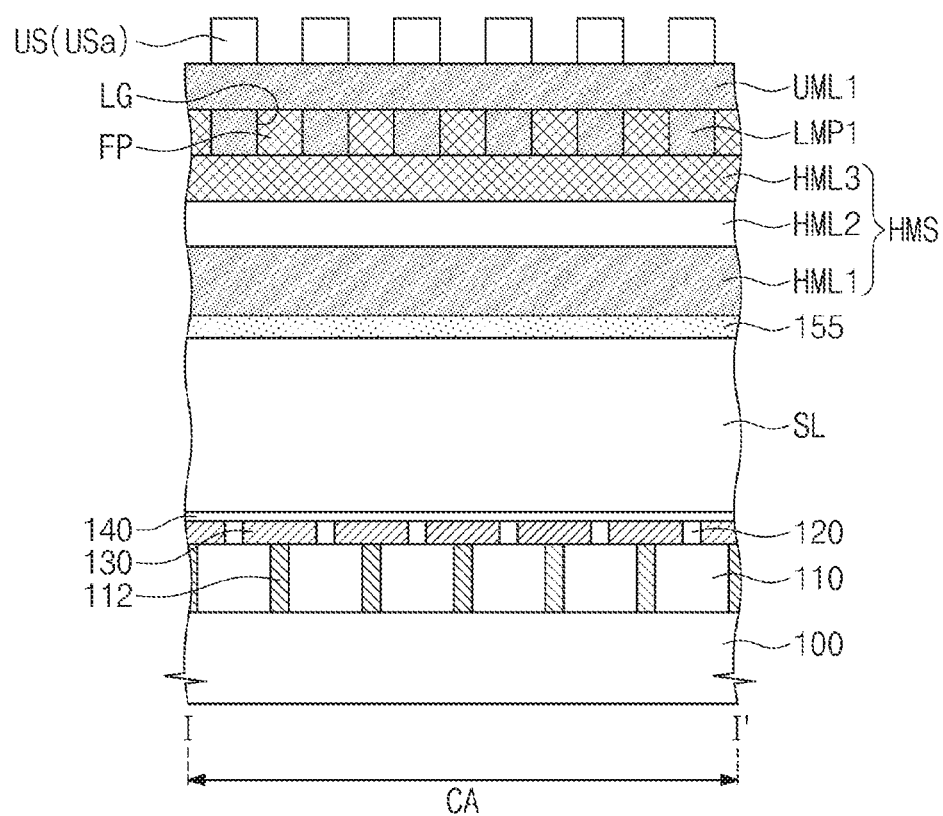
Figure 15C:
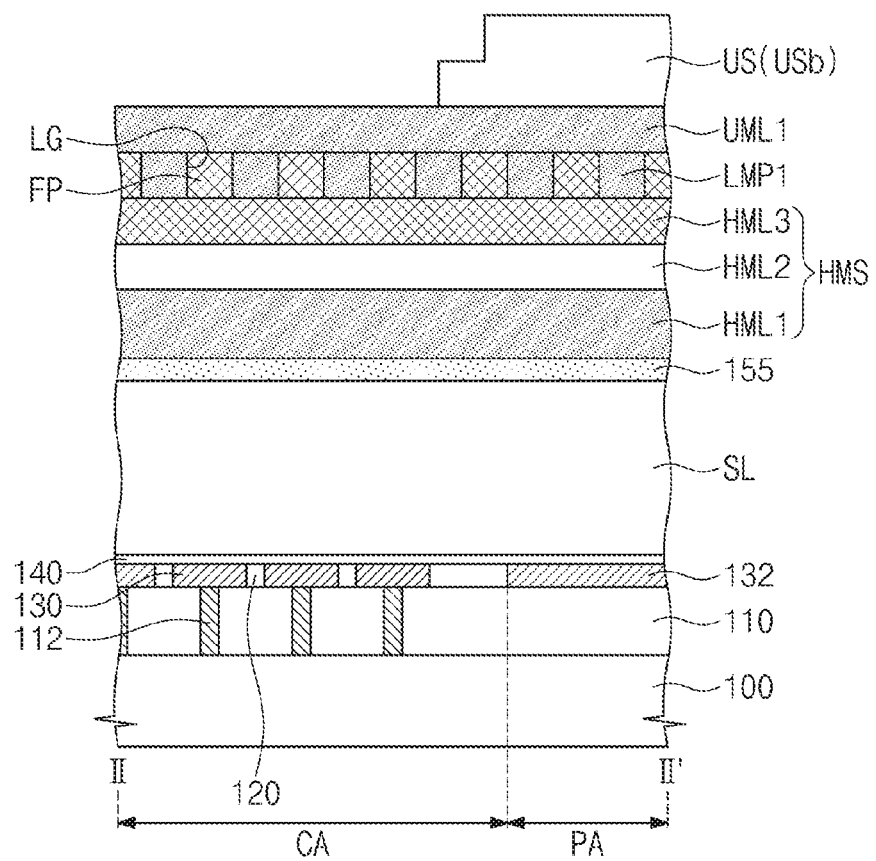
Figure 15D:
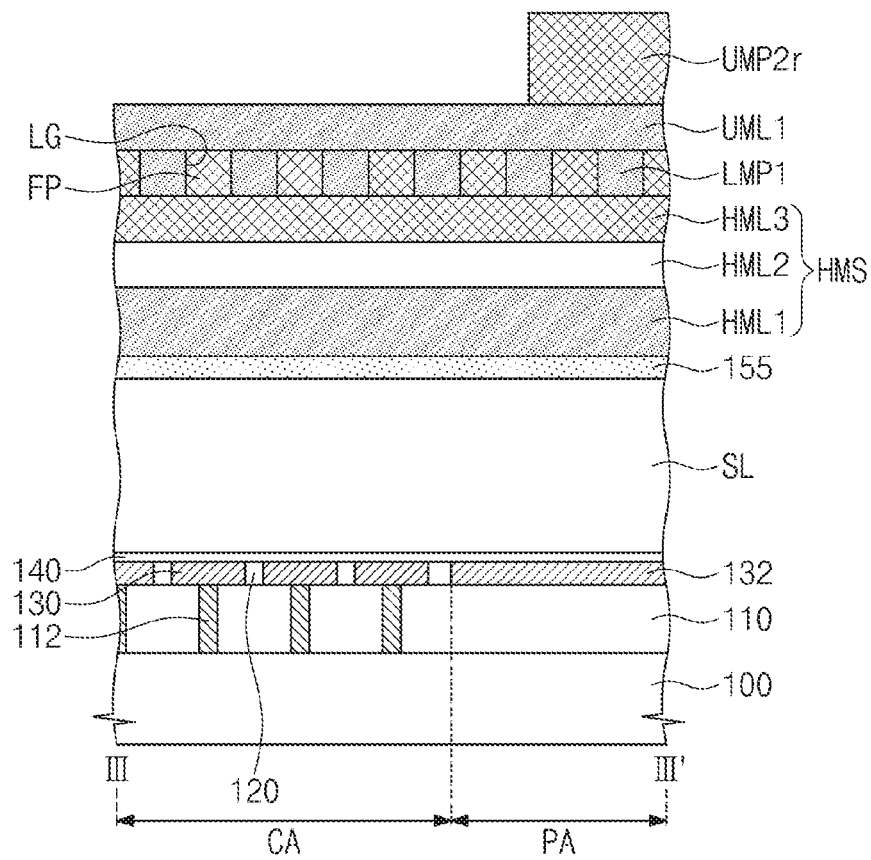
Figure 16B:
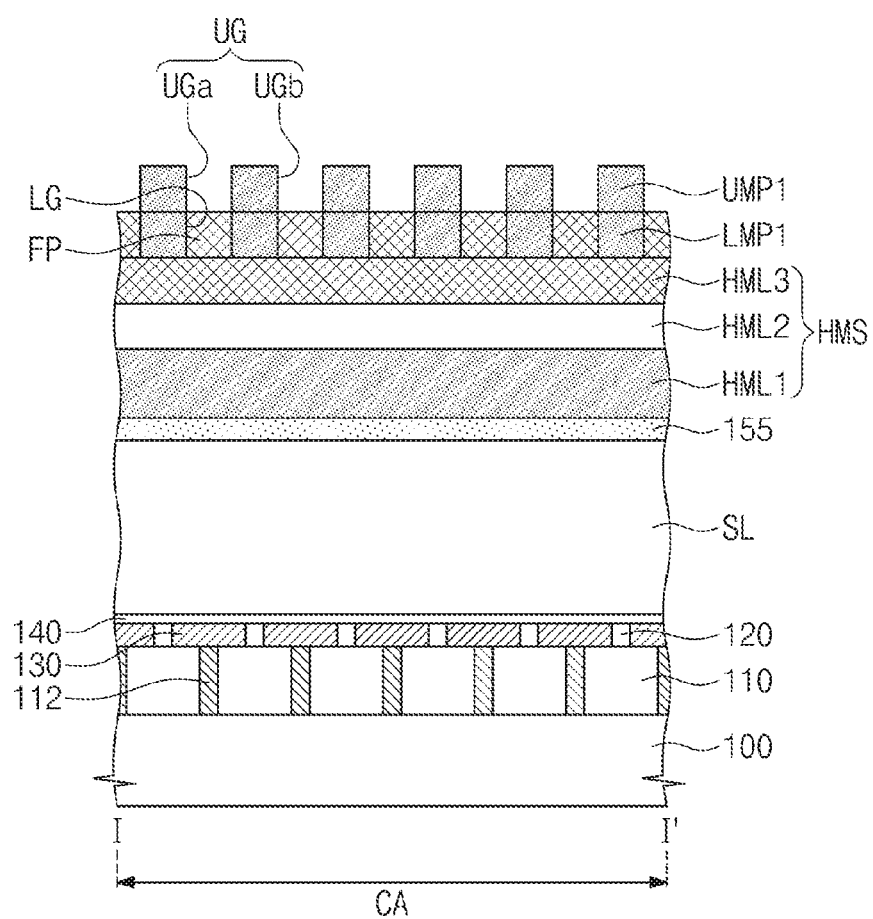
Figure 16C:
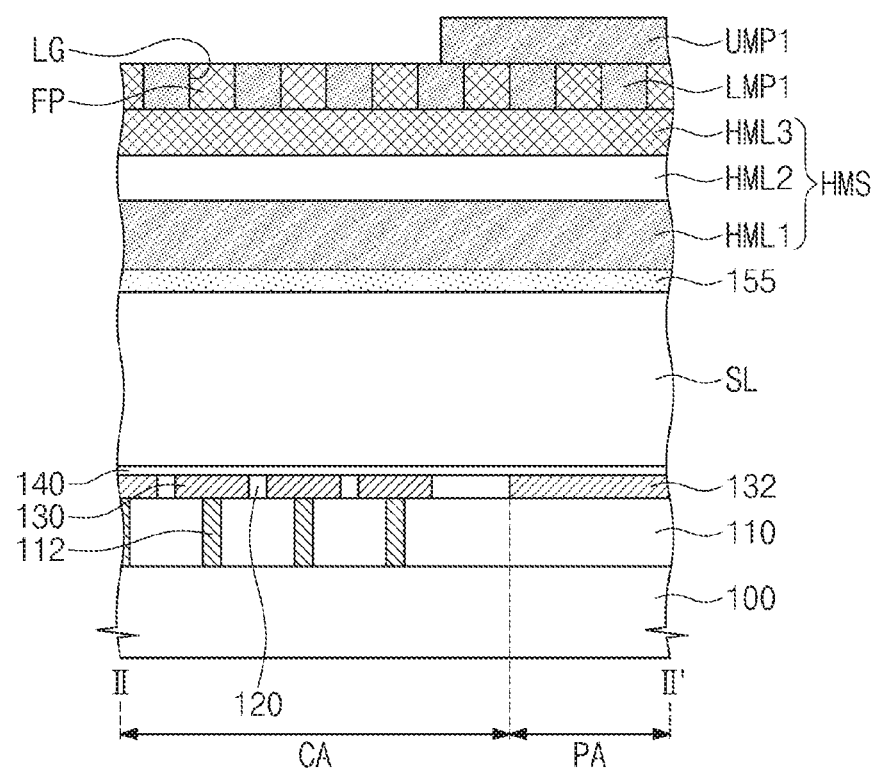
Figure 16D:
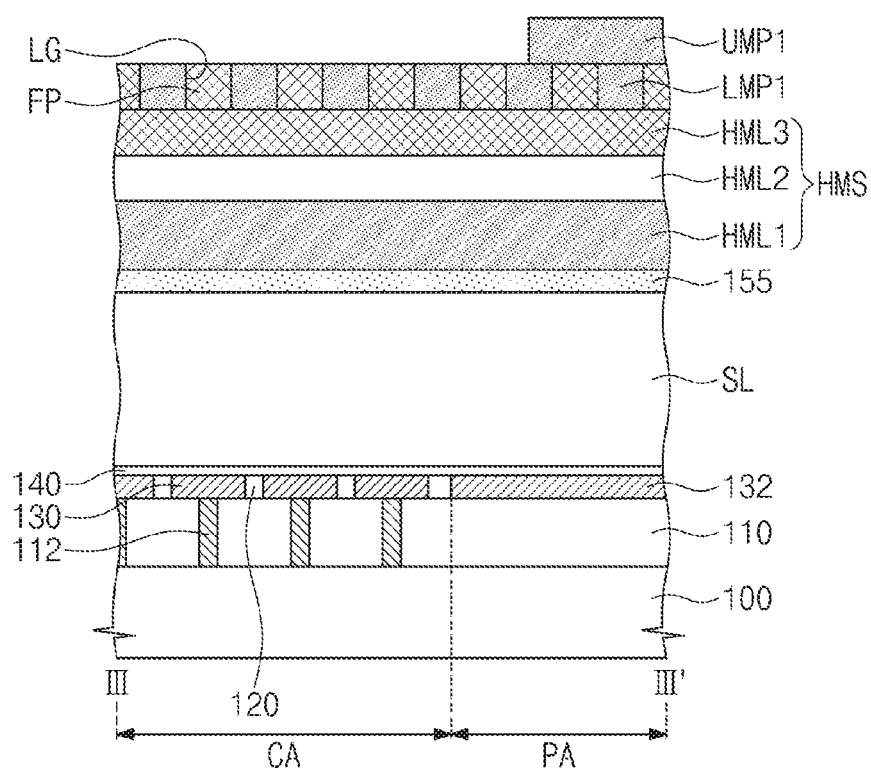
Figure 17A:
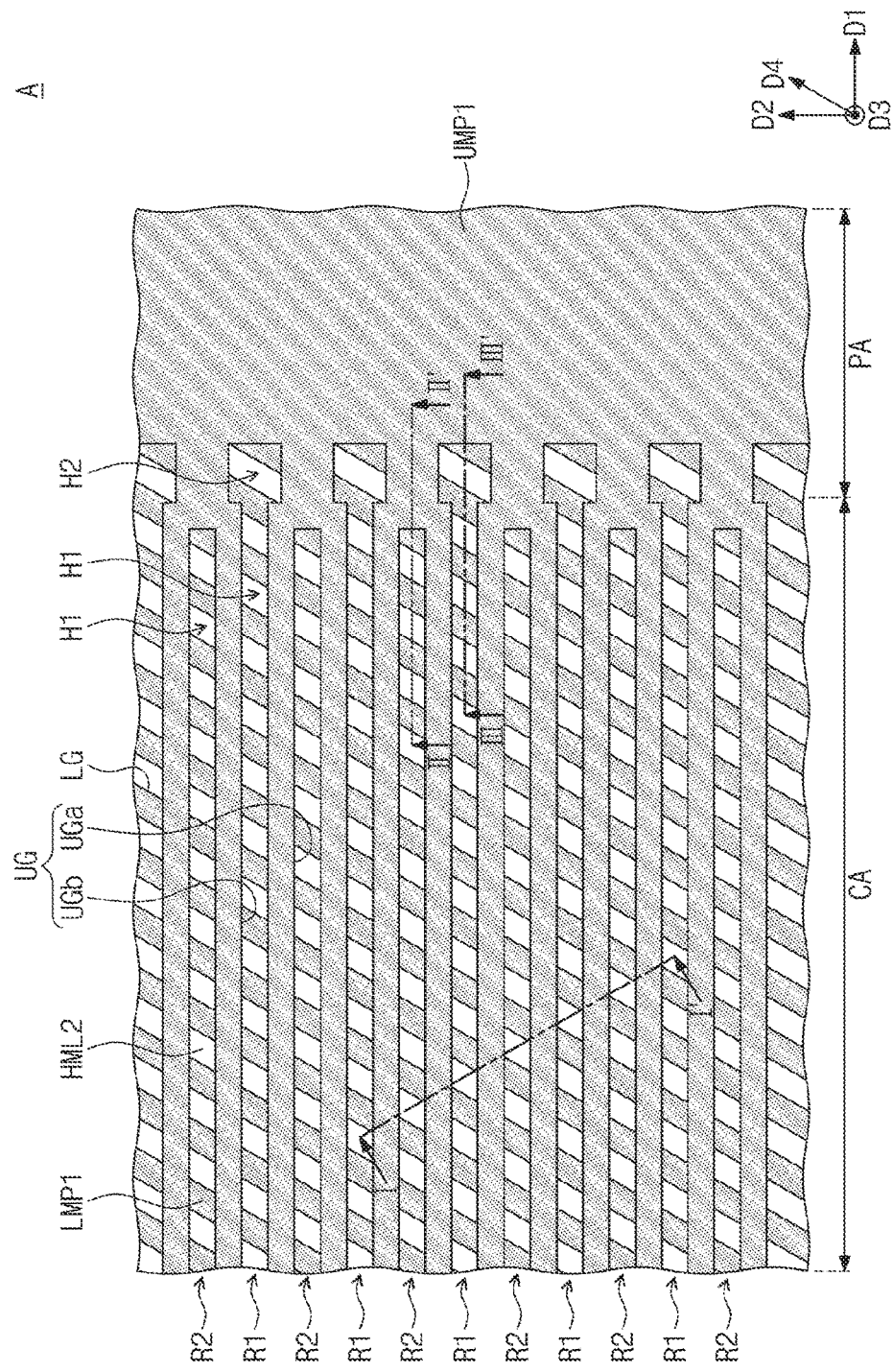
Figure 17B:
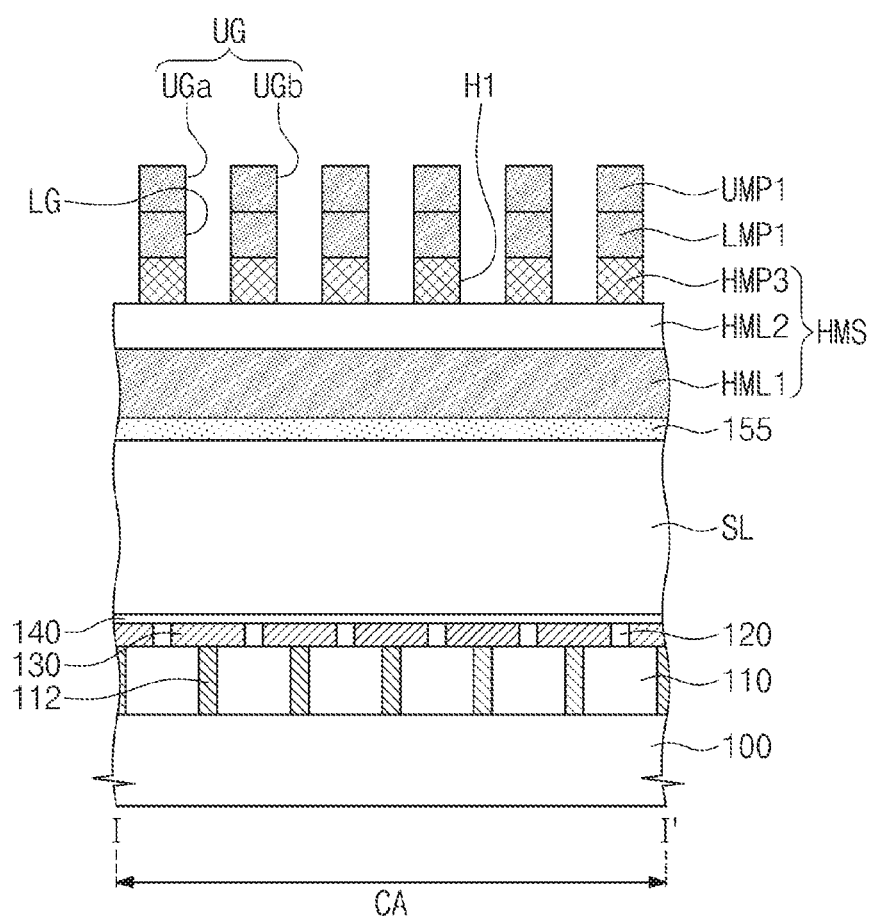
Figure 17C:
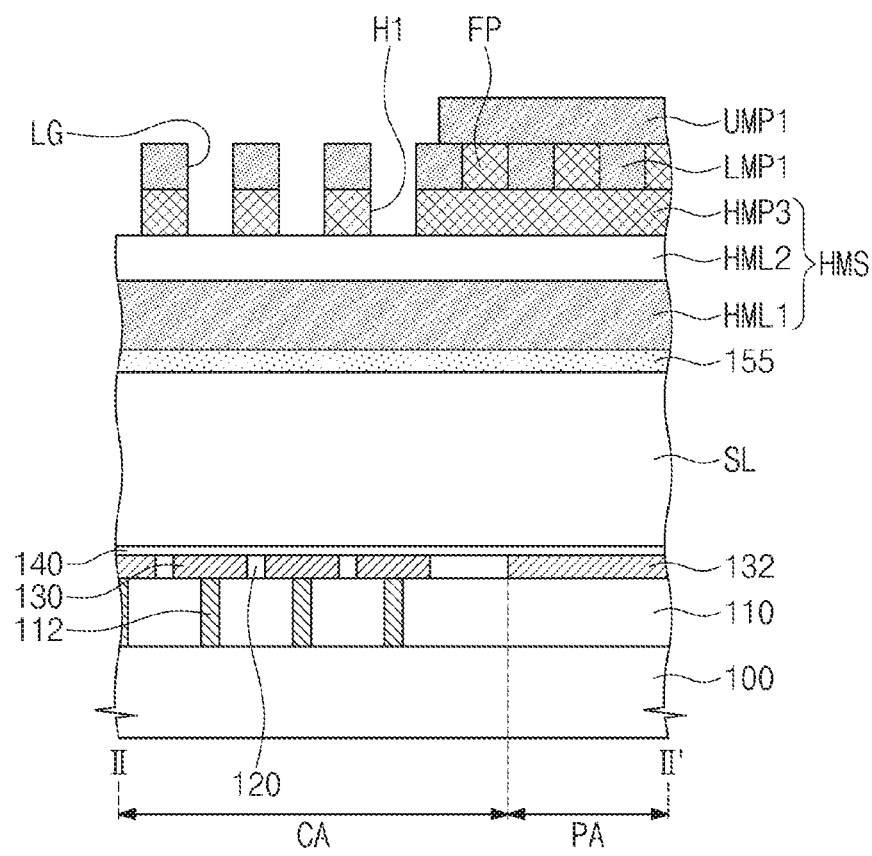
Figure 17D:
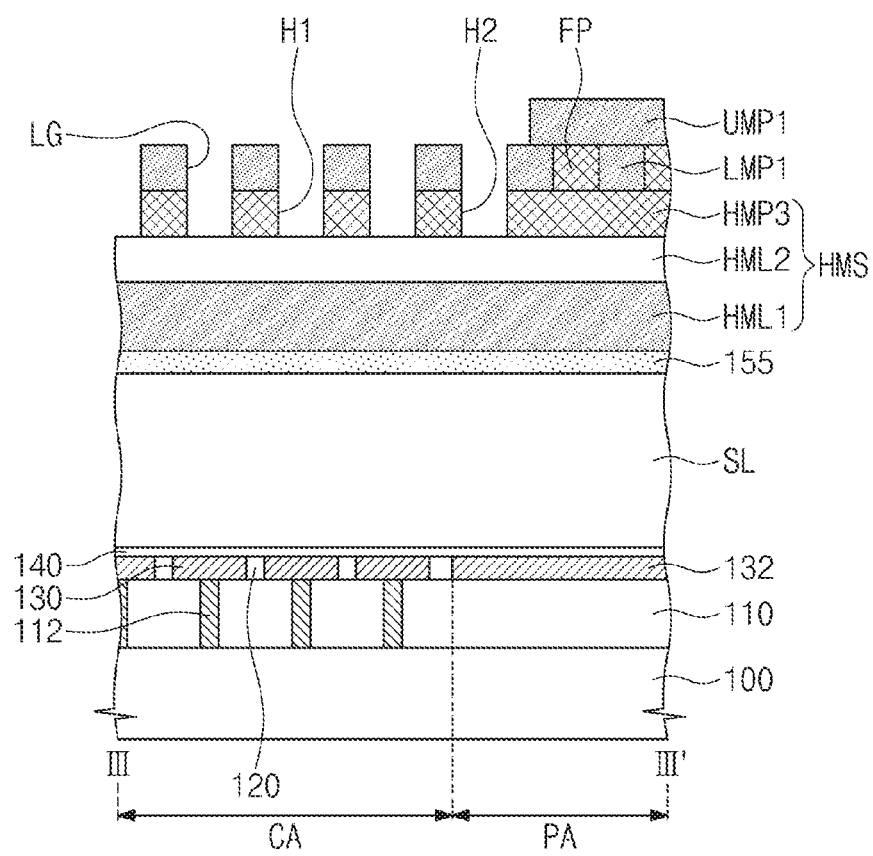
Figure 18B:
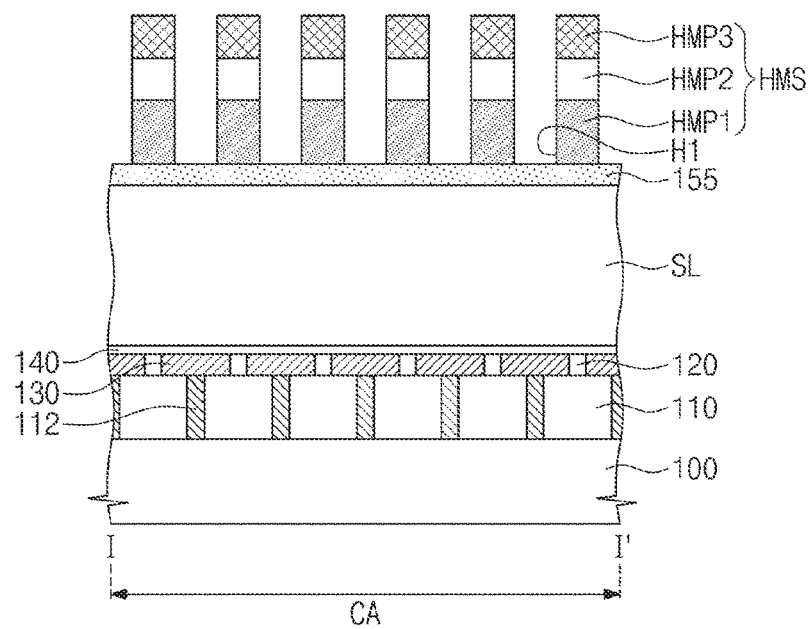
Figure 18C:
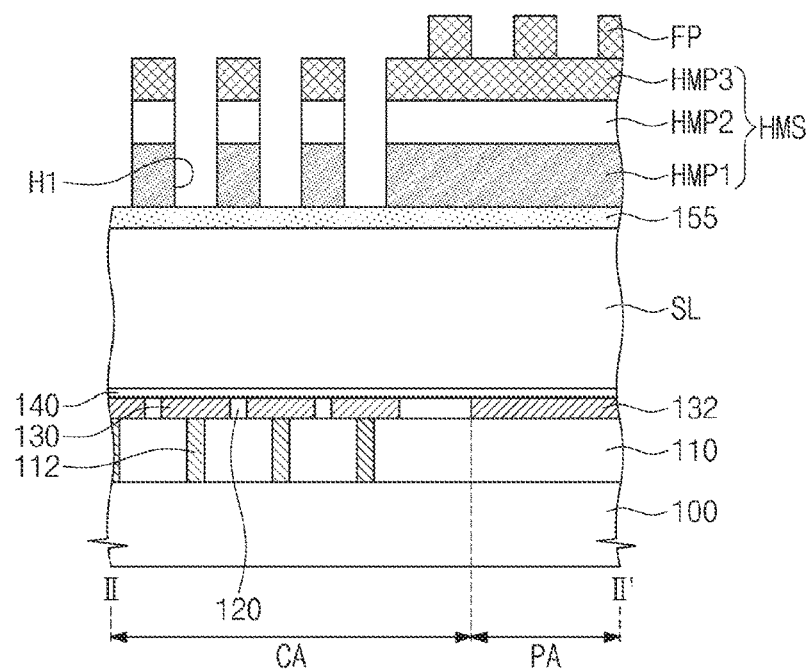
Figure 18D:
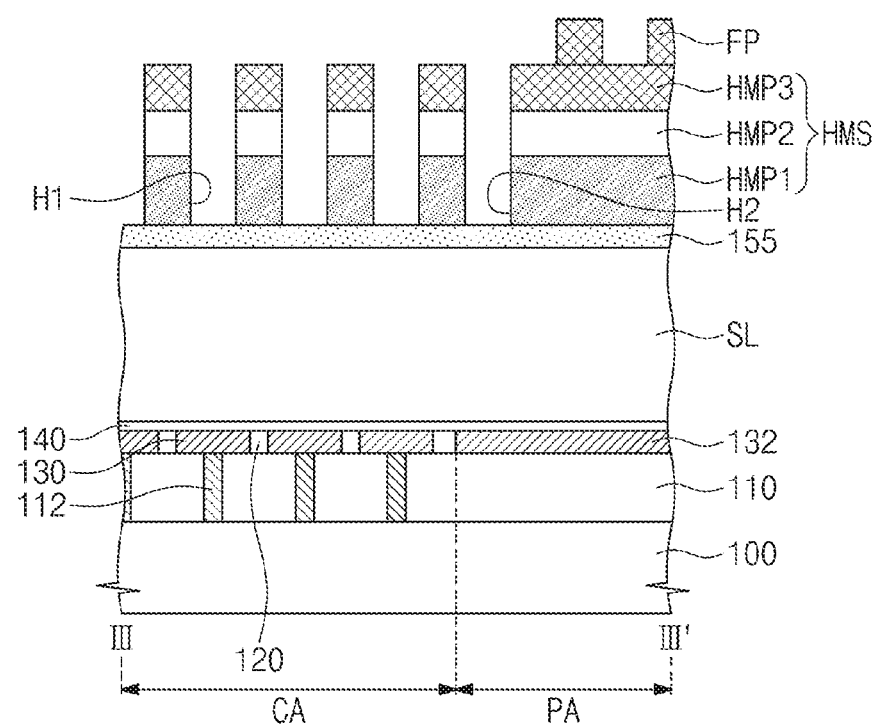
Figure 19A:
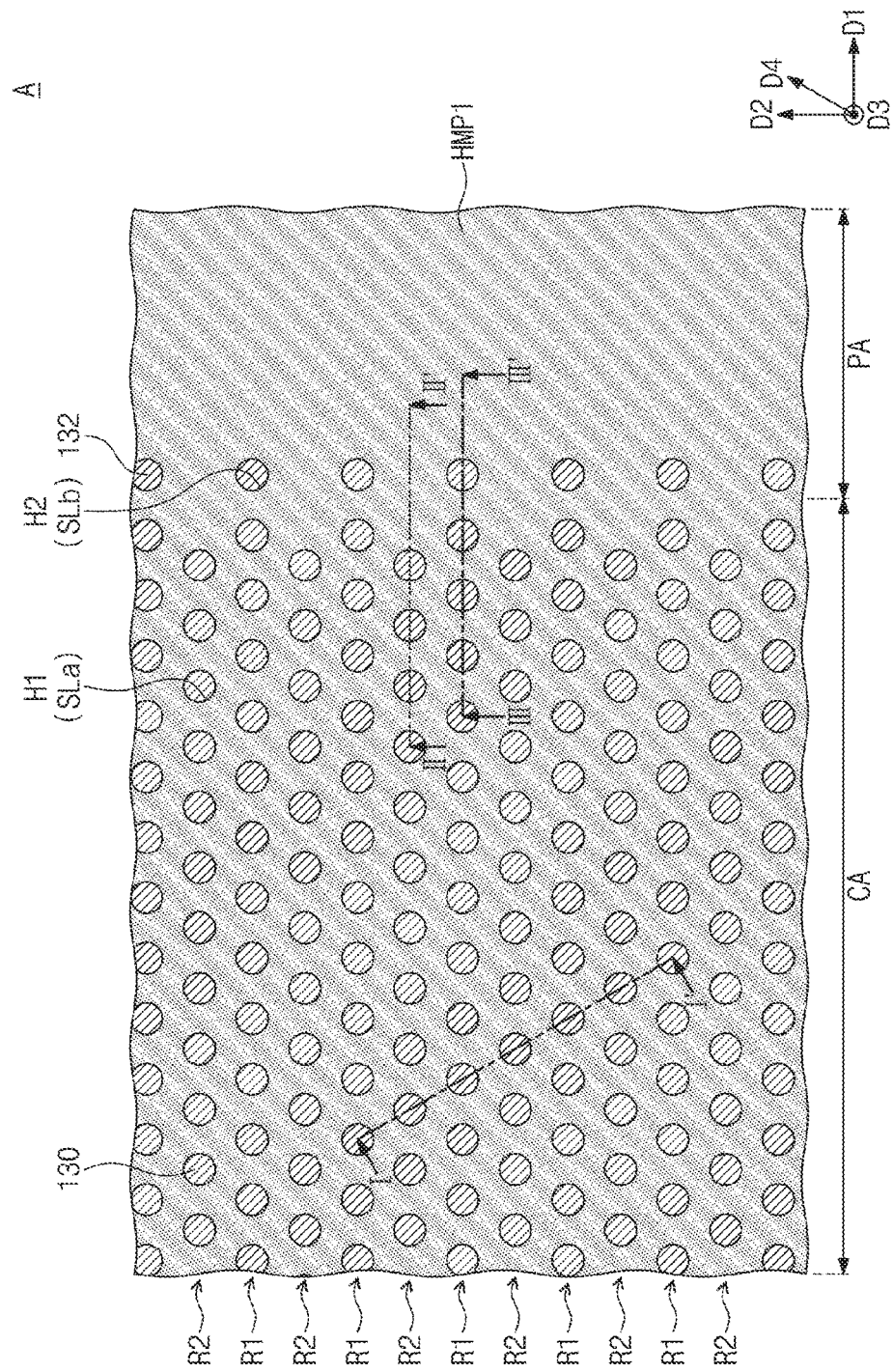
Figure 19B:
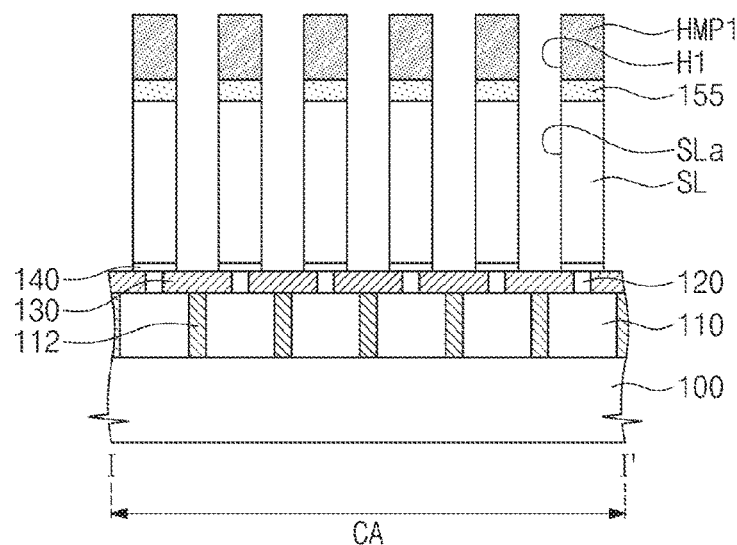
Figure 19C:
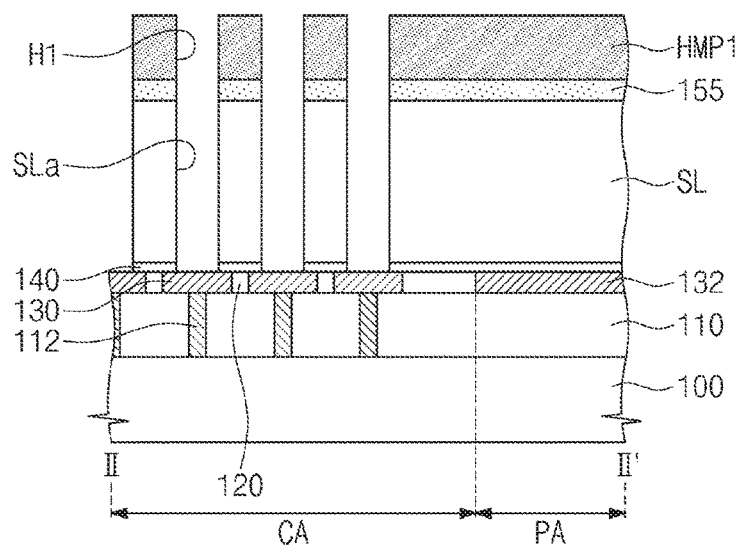
Figure 19D:
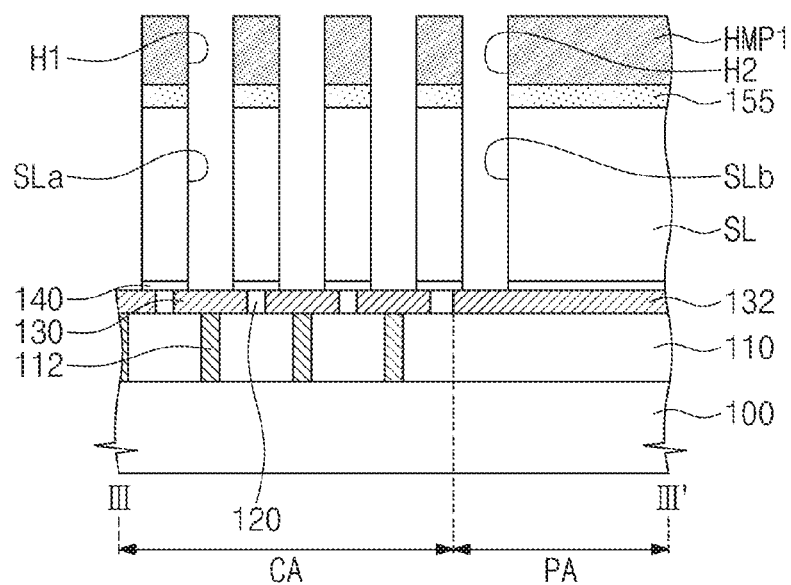
Figure 20B:
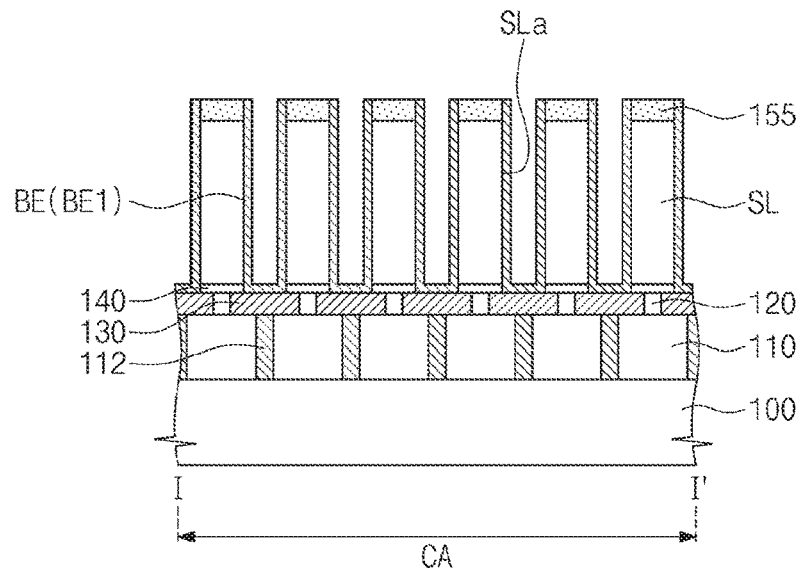
Figure 20C:
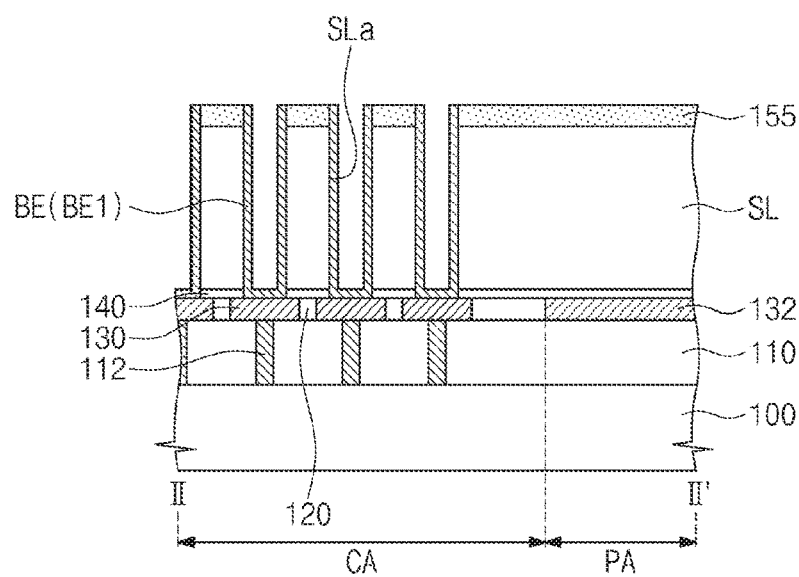
Figure 20D:
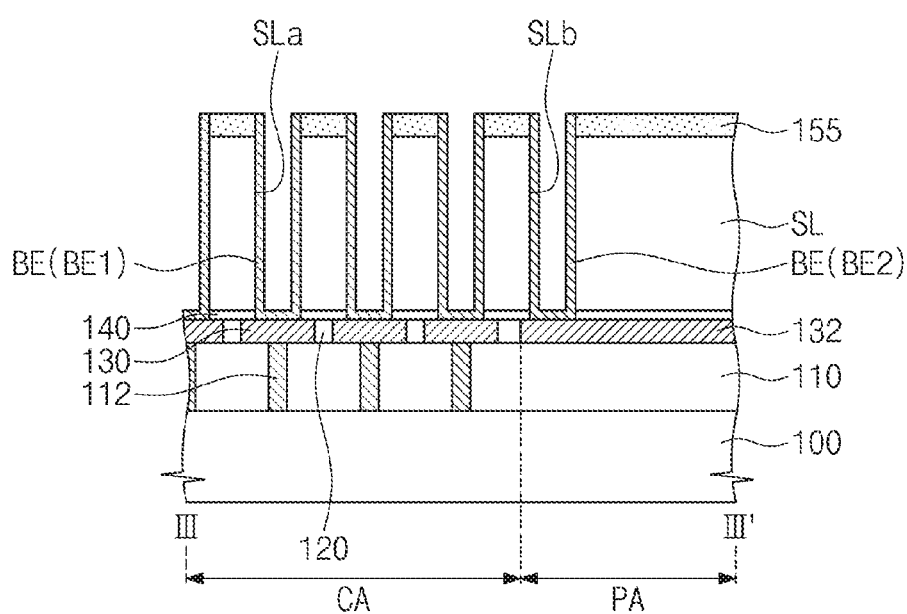
Figure 21B:
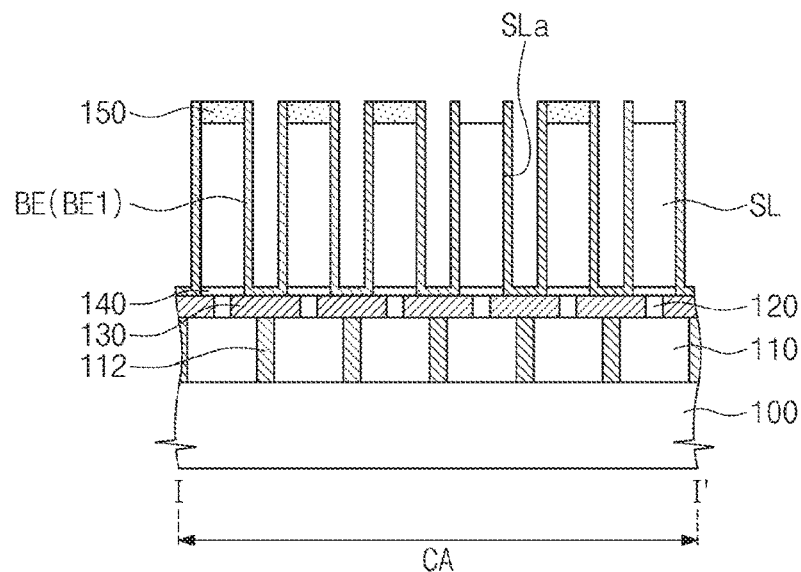
Figure 21C:
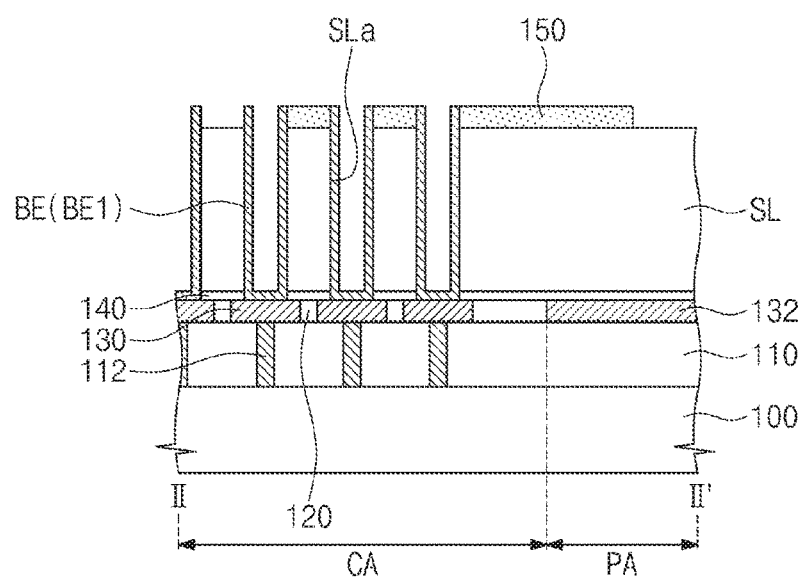
Figure 21D:
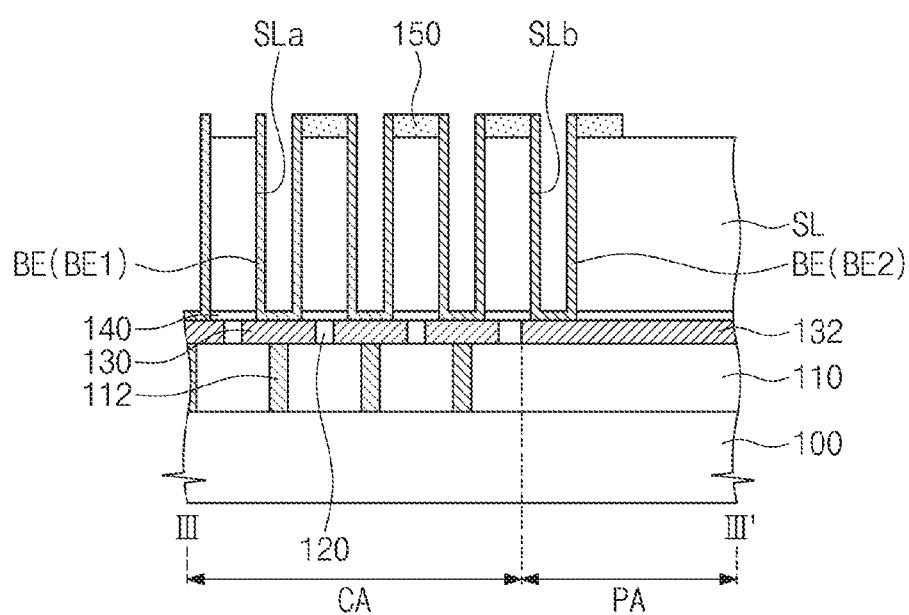

FIG. 4 is a schematic plan view illustrating a semiconductor device according to example embodiments.

Referring to FIG. 4, a semiconductor device may have a substantially similar or the same structure as described with reference to FIGS. 1 and 2A to 2D except a planar arrangement of the bottom electrodes BE.

The bottom electrodes BE may be arranged in two dimensions. Specifically, the bottom electrodes BE may form a plurality of rows R1 and R2 each extending in the first direction D1. The plurality of rows R1 and R2 may be spaced apart from each other in the second direction D2 perpendicular to the first direction D1. Additionally, the first bottom electrodes BE1 may form a plurality of columns C each extending in the second direction D2. For example, the first bottom electrodes BE1 may be arranged in a matrix array along the first and second directions D1 and D2.

The plurality of rows R1 and R2 may include the first rows R1 and the second rows R2. The first rows R1 and the second rows R2 may be alternately arranged in the second direction D2. In some embodiments, the first rows R1 may correspond to odd-numbered rows of the array of the bottom electrodes BE, and the second rows R2 may correspond to even-numbered rows of the array of the bottom electrodes BE. In other embodiments, the first rows R1 may correspond to even-numbered rows of the array of the bottom electrodes BE, and the second rows R2 may correspond to odd-numbered rows of the array of the bottom electrodes BE.

Each of the first rows R1 may include the first bottom electrodes BE1 and at least one second bottom electrode BE2. The first bottom electrodes BE1 may be disposed in the cell region CA, and the second bottom electrode BE2 may be disposed in the peripheral region PA. In plan view, each of the first bottom electrodes BE1 may partially overlap a corresponding one of the landing pads 130, and the second bottom electrode BE2 may at least partially overlap the landing dam 132. For example, each of the first bottom electrodes BE1 may contact the corresponding one of the landing pads 130, and the second bottom electrode BE2 may contact the landing dam 132. In the example embodiment of FIG. 4, each of the first rows R1 may include one second bottom electrode BE2, but inventive concepts are not limited thereto. For example, each of the first rows R1 may include a plurality of second bottom electrodes BE2 as shown in FIG. 3.

Each of the second rows R2 may include the first bottom electrodes BE1. Each of the second rows R2 may not include the second bottom electrode BE2.

The first bottom electrodes BE1 in each of the first and second rows R1 and R2 may arranged at a distance from one another in the first direction D1. For example, the first bottom electrodes BE1 in each of the first rows R1 may be arranged spaced apart from one another by a first distance DS1, and the first bottom electrodes BE1 in each of the second rows R2 may be arranged spaced apart from one another by a second distance DS2. The first distance DS1 may be substantially equal to the second distance DS2.

Each of the first rows R1 in the cell region CA may include the first bottom electrode BE1 (refer to an outermost first bottom electrode BE1_O1 of the first row R1) adjacent to the peripheral region PA (or disposed at an outermost position in each first row R1 in cell region CA). Each of the second rows R2 in the cell region CA may include the first bottom electrode BE1 (refer to an outermost first bottom electrode BE1_O2 of the second row R2) adjacent to the peripheral region PA (or disposed at an outermost position in each second row R2 in the cell region). In each of the first rows R1, a distance in the first direction D1 between the outermost first bottom electrode BE_O1 of the first row R1 and the second bottom electrode BE2 adjacent thereto may be a third distance DS3. The third distance DS3 may be substantially equal to the first distance DS1. In each of the second rows R2, a distance between the outermost first bottom electrode BE_O2 of the second row R2 and a virtual second bottom electrode iBE2 (virtually disposed at a position adjacent to the outermost first bottom electrode BE_O2 of the second row R2 in the first direction D1 between the second bottom electrodes BE2) may be a fourth distance DS4.

In the example embodiment of FIG. 4, the outermost first bottom electrodes BE_O1 of the first row R1 and the outermost first bottom electrodes BE_O2 of the second row R2 may form a column C extending in the second direction D2. The third distance DS3 may be substantially equal to the fourth distance DS4. In plan view, the shortest distance DS5 between the outermost first bottom electrodes BE_O1 of the first row R1 and the landing dam 132 may be substantially equal to the shortest distance DS6 between the outermost first bottom electrodes BE_O2 of the second row R2 and the landing dam 132.

FIGS. 5A to 21A are schematic plan views illustrating a method of manufacturing a semiconductor device according to example embodiments. FIGS. 5A to 21A are enlarged views illustrating portion A of FIG. 1. FIGS. 5B to 21B, 5C to 21C and 11D to 21D are schematic cross-sectional views illustrating a method of manufacturing a semiconductor device according to example embodiments. FIGS. 5B to 21B are cross-sectional views taken along line I-I' of FIGS. 5A to 21A, respectively. FIGS. 5C to 21C are cross-sectional views taken along line II-II' of FIGS. 5A to 21A, respectively. FIGS. 11D to 21D are cross-sectional views taken along line III-III' of FIGS. 11A to 21A, respectively.

Referring to FIGS. 1 and 5A to 5C, a semiconductor device may include the substrate 100 including the cell region CA, in which the memory cells are disposed, and the peripheral region PA adjacent to the cell region CA. For example, the peripheral region PA may surround the cell region CA.

The substrate 100 may be a semiconductor substrate. Selection devices (e.g., transistors) may be provided on the substrate 100 of the cell region CA.

The first interlayer insulating layer 110 may be formed on the substrate 100. The first interlayer insulating layer 110 may cover the substrate 100 in the cell region CA and the peripheral region PA. The first interlayer insulating layer 110 may cover the selection devices.

The contact plugs 112 may be formed in the first interlayer insulating layer 110 in the cell region CA. The contact plugs 112 may penetrate the first interlayer insulating layer 110 to be electrically connected to the selection devices, respectively.

The second interlayer insulating layer 120 may be formed on the first interlayer insulating layer 110. The second interlayer insulating layer 120 may cover the first interlayer insulating layer 110 in the cell region CA and the peripheral region PA.

The landing pads 130 and a landing dam 132 may be formed in the first interlayer insulating layer 110. The landing pads 130 may be two-dimensionally formed in the cell region CA. For example, a planar arrangement of the landing pads 130 may be similar to or the same as the planar arrangement of the first bottom electrodes BE1 in cell region CA shown in FIG. 2A. In some embodiments, a planar arrangement of the landing pads 130 may be similar to or the same as the planar arrangement of the first bottom electrodes BE1 in cell region CA shown in FIG. 4. The landing dam 132 may be formed in the peripheral region PA. In plan view, the landing dam 132 may surround the landing pads 130. The landing pads 130 and the landing pads 130 may be simultaneously formed.

Referring to FIGS. 1 and 6A to 6C, the etch stop layer 140, a sacrificial layer SL, a supporting layer 155, a hole mask structure HMS, a first lower mask layer LM1 and a second lower mask layer may be sequentially formed on the second interlayer insulating layer 120. The etch stop layer 140, the sacrificial layer SL, the supporting layer 155, the hole mask structure HMS, the first lower mask layer LM1 and the second lower mask layer may be formed by, for example, a chemical vapor deposition (CVD) process, a physical vapor deposition (PVD) process, an atomic layer deposition (ALD) process or a spin coating process.

The sacrificial layer SL may include, for example, silicon oxide. The etch stop layer 140 and the supporting layer 155 may include a material having an etch selectivity with respect to the sacrificial layer SL. For example, the etch stop layer 140 may include silicon nitride, and the supporting layer 155 may include silicon nitride and/or silicon carbonitride.

The hole mask structure HMS may include a first hole mask layer HML1, a second hole mask layer HML2 and a third hole mask layer HML3 that are sequentially stacked on the supporting layer 155. The second hole mask layer HML2 may include a material having an etch selectivity with respect to the first hole mask layer HML1. The third hole mask layer HML3 may include a material having an etch selectivity with respect to the second hole mask layer HML2. The first hole mask layer HML1 may include, for example, polysilicon. The second hole mask layer HML2 may include, for example, silicon oxide. The third hole mask layer HML3 may include, for example, a carbon-based spin on hardmask (SOH) material.

The first lower mask layer LML1 may include a material having an etch selectivity with respect to an upper portion of the hole mask structure HMS (e.g., the third hole mask layer HML3). The second lower mask layer may include a material having an etch selectivity with respect to the first lower mask layer LML1. The first lower mask layer LML1 may include, for example, polysilicon. The second lower mask layer may include, for example, a carbon-based SOH material.

The second lower mask layer may be patterned to form second lower mask patterns LMP2. The second lower mask patterns LMP2 may each have a linear shape extending in a direction. In some embodiments, ends of the second lower mask patterns LMP2 may be connected.

In some embodiments, referring to FIG. 6A, each of the second lower mask patterns LMP2 may extend in a fourth direction D4 crossing the first and second directions D1 and D2. The semiconductor device shown in FIG. 2A or in FIG. 3 may be fabricated using the second lower mask patterns LMP2 shown in FIG. 6A.

In other embodiments, unlike shown in FIG. 6A, each of the second lower mask patterns LMP2 may extend in the second direction D2. The semiconductor device shown in FIG. 4 may be fabricated using such second lower mask patterns LMP2.

Referring to FIGS. 1 and 7A to 7C, lower spacers LS may be formed on sidewalls of the second lower mask patterns LMP2, respectively. For example, the lower spacers LS may be formed by forming a lower spacer layer to conformally extend on a surface of the first lower mask layer LML1 and surfaces of the second lower mask patterns LMP2 and anisotropically etching the lower spacer layer. The lower spacers LS may include a material having an etch selectivity with respect to first lower mask layer LML1 and the second lower mask patterns LMP2. For example, lower spacers LS may include silicon oxide.

Referring to FIGS. 1 and 8A to 8C, the second lower mask patterns LMP2 may be selectively removed. Thus, the first lower mask layer LML1 may be exposed between the lower spacers LS.

Referring to FIGS. 1 and 9A to 9C, first lower mask patterns LMP1 may be formed. The first lower mask patterns LMP1 may be formed by patterning the first lower mask layer LML1 using the lower spacers LS as an etch mask. Gaps between the first lower mask patterns LMP1 may refer to lower gaps LG. Each of the lower gaps LG may have a linear shape extending in a direction (e.g., the fourth direction D4) parallel to the extension direction of the second lower mask patterns LMP2.

Referring to FIGS. 1 and 10A to 10C, buried patterns FP may be formed to fill the lower gaps LG. For example, the buried patterns FP may be formed by forming a buried layer to fill the lower gaps LG and removing an upper portion of the buried layer until exposing upper surfaces of the first lower mask patterns LMP1. The buried patterns FP may include a material having an etch selectivity with respect to the first lower mask patterns LMP1. For example, the buried patterns FP may include a carbon-based SOH material.

Referring to FIGS. 1 and 11A to 11D, a first upper mask layer UML1 may be formed to cover the first lower mask patterns LMP1 and the buried patterns FP. The first upper mask layer UML1 may include a material having an etch selectivity with respect to the buried patterns FP. For example, the first upper mask layer UML1 may include polysilicon. The first upper mask layer UML1 may be formed by, for example, a CVD process, a PVD process or an ALD process.

A second upper mask pattern UMP2 may be formed on the first upper mask layer UML1. The second upper mask pattern UMP2 may include a material having an etch selectivity with respect to the first upper mask layer UML1. For example, the second upper mask pattern UMP2 may include a carbon-based SOH material.

The second upper mask pattern UMP2 may include mask openings UMP2*a* each extending in the first direction D1. The mask openings UMP2*a* may be spaced apart from one another in the second direction D2. Each of the mask openings UMP2*a* may have a first region P1 and a second region P2 connected to each other. The first region P1 of each mask opening UMP2*a* may have first inner sidewalls in the second direction D2. The second region P2 of each mask opening UMP2*a* may have second inner sidewalls in the second direction D2. A first width P1_W of the first region P1 in the second direction D2 (e.g., a distance between the first inner sidewalls of the first region P1) may be greater than a second width P2_W of the second region P2 in the second direction D2 (e.g., a distance between the second inner sidewalls of the second region P2). The first region P1 may be located in the cell region CA, and the second region P2 may be located in the peripheral region PA.

The second upper mask pattern UMP2 may be formed by forming a second upper mask layer and patterning the second upper mask layer.

Referring to FIGS. 1 and 12A to 12D, an upper spacer layer USL may be formed to conformally cover the first upper mask layer UML1 and the second upper mask pattern UMP2. The upper spacer layer USL may include a material having an etch selectivity with respect to the first upper mask layer UML1 and the second upper mask pattern UMP2. For example, the upper spacer layer USL may include silicon oxide. The upper spacer layer USL may be formed by, for example, a CVD process, a PVD process or an ALD process.

The upper spacer layer USL may be conformally formed on inner surfaces of the mask openings UMP2*a* of the second upper mask pattern UMP2. A width of a space, that is delimited by the upper spacer layer USL on the first inner sidewalls of the first region P1 of each mask opening UMP2*a*, may be greater than a width of a space that is delimited by the upper spacer layer USL on the second inner sidewalls of the second region P2 of each mask opening UMP2*a*. In some embodiments, portions of the upper spacer layer USL on the second inner sidewalls of the second region P2 may contact each other.

A block mask pattern BMP may be formed on the upper spacer layer USL in the peripheral region PA. The block mask pattern BMP may expose a portion of the upper spacer layer USL covering the first regions P1 of the mask openings UMP2a. The block mask pattern BMP may include photoresist.

Referring to FIGS. 1 and 13A to 13D, upper spacers US may be formed on the inner sidewalls of the mask openings UMP2a of the second upper mask pattern UMP2. The upper spacers US may be formed by anisotropically etching the upper spacer layer USL using the block mask pattern BMP as an etch mask. Therefore, an upper surface of the second upper mask pattern UMP2 in the cell region CA and an upper surface of the first upper mask layer UML1 in the second regions P2 of the mask openings UMP2a may be exposed by the upper spacers US.

The upper spacers US may each include a first portion USa in the first region P1 of each mask opening UMP2a and a second portion USb in the second region P2 of each mask opening UMP2a. The first and second portions USa and USb of each spacer US may be connected to each other.

A pair of upper spacers US may be formed in each mask opening UMP2a. A distance between the first portions USa of the pair of upper spacers US may be greater than a distance between the second portions USb thereof. In some embodiments, the second portions USb of the pair of upper spacers US may contact each other.

A gap between the pair of upper spacers US formed in each mask opening UMP2a may refer to a first upper spacer gap US_Ga. The first upper spacer gap US_Ga may expose the upper surface of the first upper mask layer UML1 in the cell region CA. The first upper spacer gap US_Ga may have a linear shape extending in a first direction D1. A plurality of first upper spacer gaps US_Ga may be arranged in the second direction D2.

A portion USLr of the upper spacer layer USL may remain below the block mask pattern BMP. The remaining upper spacer layer USLr may connect the second portions USb of the upper spacers US in the peripheral region PA.

Referring to FIGS. 1 and 14A to 14D, the second upper mask pattern UMP2 may be partially removed. The second upper mask pattern UMP2 may be partially removed by an isotropic etch process or an ashing process, for example. A portion UMP2r of the second upper mask pattern UMP2 may remain in the peripheral region PA.

Specifically, the second upper mask pattern UMP2 in the cell region CA may be removed. Regions from which the second upper mask pattern UMP2 is removed may be referred to as second upper spacer gaps US_Gb. The second upper spacer gaps US_Gb may each have a linear shape extending in the first direction D1.

Furthermore, a portion, adjacent to the cell region CA, of the second upper mask pattern UMP2 in the peripheral region PA may be removed. Thus, under-cut regions UC may be formed below the remaining upper spacer layer USLr in the peripheral region PA. Therefore, the second upper spacer gaps US_Gb may include the upper spacer gaps UC, respectively.

The second upper spacer gaps US_Gb and the first upper spacer gaps US_Ga may be alternately arranged in the second direction D2. The second upper spacer gaps US_Gb may expose the upper surface of the first upper mask layer UML1.

The block mask pattern BMP may also be removed by the process of partially removing the second upper mask pattern UMP2.

Referring to FIGS. 1 and 15A to 15D, the remaining upper spacer layer USLr may be removed, thereby exposing the remaining second upper mask pattern UMP2r. The remaining upper spacer layer USLr may be removed by, for example, an anisotropic etch process. A thickness of the upper spacers US may also be reduced due to the process of removing the remaining upper spacer layer USLr.

Referring to FIGS. 1 and 16A to 16D, a first upper mask pattern UMP1 may be formed. The first upper mask pattern UMP1 may be formed by pattering the first upper mask layer UML1 using the upper spacers US and the remaining second upper mask pattern UMP2r as an etch mask.

The upper mask pattern UMP1 may include upper gaps UG. The upper gaps UG may include first upper gaps UGa and second upper gaps UGb that are alternately arranged in the second direction D2. The first upper gaps UGa may be regions formed corresponding to the first upper spacer gaps UG_Ga. The second upper gaps UGb may be regions formed corresponding to the second upper spacer gaps UG_Gb.

The first upper gaps UGa may each have a linear shape extending in the first direction D1. The first upper gaps UGa may be formed in the cell region CA and may not extend to the peripheral region PA. This may be because, in the pair of upper spacers US formed in each mask opening UMP2a, the distance between the second portions USb thereof is less than the distance between the first portions USa thereof. For example, since the distance between the second portions USb of the pair of upper spacers US formed in each mask opening UMP2a is very narrow (or the second portions USb contacts each other), the first upper mask layer UML1 may not be patterned such that the first upper gaps UGa may not be formed in the peripheral region PA.

The second upper gaps UGb may each have a linear shape extending in the first direction D1. The second upper gaps UGb may be formed in the cell region CA and may extend into the peripheral region PA. This may be because, when the second upper mask pattern USP2 is partially removed, a portion, adjacent to the cell region CA, of the second upper mask pattern USP2 in the peripheral region PA is removed (or the under-cut regions are formed).

The upper surfaces of the first lower mask patterns LMP1 and upper surfaces of the buried patterns FP may be exposed by the upper gaps UG. The upper spacers US and the remaining second upper mask pattern UMP2 may be removed when or after forming the first upper mask pattern UMP1.

Referring to FIGS. 1 and 17A to 17D, a third hole mask pattern HMP3 may be formed. The third hole mask pattern HMP3 may be formed by patterning the third hole mask layer HML3 using the first lower mask pattern LMP1 and the first upper mask pattern UMP1 as an etch mask.

The third hole mask pattern HMP3 may include holes H1 and H2. In plan view, the holes H1 and H2 may be formed at cross points of the upper gaps UG and the lower gaps LG.

The holes H1 and H2 may be two-dimensionally arranged. The holes H1 and H2 may form a plurality of rows R1 and R2 extending in the first direction D1. The plurality of rows R1 and R2 may be spaced apart from each other in the second direction D2.

The plurality of rows R1 and R2 may include first rows R1 and second rows R2. The first rows R1 and the second rows R2 may be alternately arranged in the second direction D2. The first rows R1 may include the holes H1 and H2 formed corresponding to the second upper gaps UGb. The second rows R2 may include the holes H1 formed corresponding to the first upper gaps UGa.

The holes H1 and H2 may include first holes H1 in the cell region CA and second holes H2 in the peripheral region PA. Each of the rows R1 may include the first holes H1 and at least one second holes H2. This may be because the second upper gaps UGb extend into the peripheral region PA. Each of the second rows R2 may include the first holes H1 and may not include the second hole H2. This may be because the first upper gaps UGa do not extend to the peripheral region PA.

A planar arrangement of the first holes H1 may be the same as the planar arrangement of the first bottom electrodes BE1 described with reference to FIG. 2A. A planar arrangement of the second holes H2 may be the same as the planar arrangement of the second bottom electrodes BE2 described with reference to FIG. 2A. In some embodiments, a planar arrangement of the first holes H1 and the second holes H2 may be the same as the planar arrangement of the second bottom electrodes BE2 described with reference to FIG. 3 or FIG. 4.

FIGS. 1 and 18A to 18D, a second hole mask pattern HMP2 and a first hole mask HMP1 may be sequentially formed. The second hole mask pattern HMP2 may be formed by patterning the second hole mask layer HML2 using the third hole mask pattern HMP3 as an etch mask. The first hole mask pattern HMP1 may be formed by patterning the first hole mask layer HML1 using the second hole mask pattern HMP2 as an etch mask. In some embodiments, the third hole mask pattern HMP3 may be removed when patterning the first hole mask layer HML1.

During the above patterning process, the first holes H1 and second holes H2 of the third hole mask pattern HMP3 may be sequentially transferred to the second hole mask pattern HMP2 and the first hole mask pattern HMP1. Thus, each of the first and second hole mask patterns HMP1 and HMP2 may include the first holes H1 and the second holes H2.

Referring to FIGS. 1 and 19A to 19D, first electrode holes SLa and second electrode holes SLb may be formed to sequentially penetrate the supporting layer 155, the sacrificial layer SL and the etch stop layer 140. The first electrode holes Sla and the second electrode holes SLb may be formed by sequentially etching the supporting layer 155, the sacrificial layer SL and the etch stop layer 140 using the first hole mask pattern HMP1 as an etch mask.

The first electrode holes SLa may correspond to the first holes H1, and the second electrode holes SLb may correspond to the second holes H2. Upper surfaces of the landing pads 130 may be exposed by the first electrode holes Sla, respectively. The landing dam 132 may be exposed by the second electrode holes SLb.

In the process of forming the first and second electrode holes SLa and SLb, outermost first electrode holes SLa (adjacent to peripheral region PA) may be more uniformly formed due to the second electrode holes SLb. As the second electrode holes SLb are located in the peripheral region PA but not in the cell region CA, the second electrode holes SLb may not occupy an additional space in the cell region CA. Thus, integration density of the semiconductor device may not be reduced and reliability of the semiconductor device may be enhanced.

Referring to FIGS. 1 and 20A to 20D, bottom electrodes BE may be formed in the first and second electrode holes SLa and SLb. The bottom electrodes BE in the first electrode holes SLa may correspond to the first bottom electrodes BE1 described with reference to FIGS. 1 and 2A to 2D. The bottom electrodes BE in the second electrode holes SLb may correspond to the second bottom electrodes BE2 described with reference to FIGS. 1 and 2A to 2D. In some embodiments, the bottom electrodes BE in the first and second electrode holes SLa and SLb may correspond to the first and second bottom electrodes BE1 and BE2, respectively, described with reference to FIG. 3 or FIG. 4. The first bottom electrodes BE1 may be in contact with the landing pads 130. The second bottom electrodes BE2 may be in contact with the landing dam 132.

Referring to FIGS. 1 and 21A to 21D, the supporting layer 155 may be patterned to form a supporting pattern 150. The supporting pattern 150 may include openings 150a. The openings 150a may each have a bar shape, a rectangular shape or a linear shape. The sacrificial layer SL may be exposed by the openings 150a.

Referring again to FIGS. 1 and 2A to 2D, the sacrificial layer SL may be removed. The sacrificial layer SL may be removed by a wet etch process having an etch selectivity to the etch stop layer 140, the bottom electrodes BE and the supporting pattern 150.

The dielectric layer DL may be formed to conformally extend along exposed surfaces of the bottom electrodes BE. The dielectric layer DL may extend on an upper surface of the etch stop layer 140 and a surface of the supporting pattern 150. The top electrode TE may be formed to cover the dielectric layer DL.

The bottom electrodes BE, the dielectric layer DL and the top electrode TE may constitute the capacitors CAP.

While some inventive concepts have been shown and described with reference to example embodiments thereof, it will be understood by those of ordinary skill in the art that various changes in form and details may be made thereto without departing from the spirit and scope of inventive concepts as set forth by the following claims.

What is claimed is:

1. A semiconductor device comprising:
a substrate including a cell region and peripheral region; and
bottom electrodes on the substrate,
the bottom electrodes arranged in a first row and a second row that each extend in a first direction,
the first row and the second row being adjacent to each other in a second direction perpendicular to the first direction,
the bottom electrodes in the first row including an outermost bottom electrode and a next outermost bottom electrode that are separated by a first distance in the first direction,
the bottom electrodes in the second row including an outermost bottom electrode and a next outermost bottom electrode that are separated by a second distance in the first direction,
the outermost bottom electrode in the first row being on the peripheral region of the substrate, and
the outermost bottom electrode in the second row being on the cell region of the substrate.

2. The semiconductor device according to claim 1, wherein the bottom electrodes in the first row and the bottom electrodes in the second row are arranged in a zigzag form in the first direction.

3. The semiconductor device according to claim 1, wherein
the bottom electrodes in the first row are arranged at a third distance from one another in the first direction,
the bottom electrodes in the second row are arranged at the second distance from one another in the first direction, and
the second distance is substantially equal to the third distance.

4. The semiconductor device according to claim 3, wherein the first distance is substantially equal to the third distance, and the first distance is substantially equal to the second distance.

5. The semiconductor device according to claim 1, further comprising:
an interlayer insulating layer between the substrate and the bottom electrodes;
landing pads in the interlayer insulating layer; and
a landing dam in the interlayer insulating layer, wherein the landing dam surrounds the landing pads in plan view.

6. The semiconductor device according to claim 5, wherein, in plan view, the outermost bottom electrode in the first row overlaps the landing dam.

7. The semiconductor device according to claim 6, wherein the outermost bottom electrode in the first row contacts the landing dam.

8. The semiconductor device according to claim 5, wherein, in plan view, the next outermost bottom electrode in the first row and the outermost bottom electrode in the second row overlap the landing pads, respectively.

9. The semiconductor device according to claim 5, wherein, in plan view, a shortest distance between the next outermost bottom electrode in the first row and the landing dam is less than a shortest distance between the outermost bottom electrode in the second row and the landing dam.

10. The semiconductor device according to claim 1, further comprising:
a top electrode covering the bottom electrodes; and
a dielectric layer between the top electrode and the bottom electrodes.

11. A semiconductor device comprising:
a substrate;
an interlayer insulating layer on the substrate;
landing pads in the interlayer insulating layer;
a landing dam in the interlayer insulating layer, the landing dam surrounding the landing pads in plan view; and
bottom electrodes on the interlayer insulating layer,
the bottom electrodes arranged in a first direction and distances of adjacent bottom electrodes in the first direction are substantially equal,
the bottom electrodes including first bottom electrodes and a second bottom electrode, wherein the first bottom electrodes overlapping the landing pads, respectively, and the second bottom electrode overlapping the landing dam, in plan view.

12. The semiconductor device according to claim 11, wherein
the first bottom electrodes contact the landing pads, respectively, and
the second bottom electrode contacts the landing dam.

13. The semiconductor device according to claim 11, wherein the second bottom electrode is located at an outermost position in the first direction among the bottom electrodes.

14. The semiconductor device according to claim 11, wherein
the first bottom electrodes are arranged at a first distance from one another in the first direction,
the second bottom electrode are spaced apart from an immediately adjacent first bottom electrode by a second distance in the first direction, and
the first distance is substantially equal to the second distance.

15. The semiconductor device according to claim 11, further comprising
a top electrode covering the bottom electrodes; and
a dielectric layer between the top electrode and the bottom electrodes.

16. The semiconductor device according to claim 11, further comprising:
an etch stop layer on the landing pads, the interlayer insulating layer, and the landing dam, wherein
the etch stop layer includes a plurality of first electrode holes and a plurality of second electrode holes,
a bottom region of the first bottom electrodes extends into the plurality of first electrode holes, and
a bottom portion of the second bottom electrodes extends into the plurality of second electrode holes.

17. A semiconductor device comprising:
a substrate;
an interlayer insulating layer on the substrate;
landing pads in the interlayer insulating layer;
a landing dam in the interlayer insulating layer, the landing dam surrounding the landing pads in plan view; and
bottom electrodes on the interlayer insulating layer,
the bottom electrodes arranged in two dimensions, and
the bottom electrodes including first bottom electrodes contacting the landing pads, respectively, and second bottom electrodes contacting the landing dam, wherein
the bottom electrodes are arranged in first rows and second rows that extend in a first direction,
the bottom electrodes are alternately arranged in a second direction that crosses the first direction,
the bottom electrodes in each of the first rows include the first bottom electrodes and at least one of the second bottom electrodes, and
the bottom electrodes in each of the second rows include the first bottom electrodes but do not include the second bottom electrodes.

18. The semiconductor device according to claim 17, wherein the second bottom electrodes overlap the landing dam in plan view.

19. The semiconductor device according to claim 17, wherein
the second direction is perpendicular to the first direction.

20. The semiconductor device according to claim 17, wherein the bottom electrodes are arranged in a matrix in the first direction and the second direction.

* * * * *